US008737124B2

(12) United States Patent
Tsukada et al.

(10) Patent No.: US 8,737,124 B2
(45) Date of Patent: May 27, 2014

(54) SEMICONDUCTOR DEVICE

(76) Inventors: Shuichi Tsukada, Tokyo (JP); Yasuhiro Uchiyama, Tokyo (JP)

( * ) Notice: Subject to any disclaimer, the term of this patent is extended or adjusted under 35 U.S.C. 154(b) by 79 days.

(21) Appl. No.: 13/457,262

(22) Filed: Apr. 26, 2012

(65) Prior Publication Data

US 2012/0275215 A1    Nov. 1, 2012

(30) Foreign Application Priority Data

Apr. 28, 2011    (JP) ................................ 2011-101779

(51) Int. Cl.
| G11C 11/24 | (2006.01) |
| H01L 27/06 | (2006.01) |
| H01L 27/102 | (2006.01) |
| G11C 11/39 | (2006.01) |
| H01L 49/02 | (2006.01) |
| H01L 29/78 | (2006.01) |

(52) U.S. Cl.
CPC ............ *G11C 11/39* (2013.01); *H01L 27/1023* (2013.01); *H01L 27/1027* (2013.01); *H01L 28/91* (2013.01); *H01L 29/7841* (2013.01)
USPC .... 365/177; 365/175; 365/149; 257/E27.048; 257/E27.075

(58) Field of Classification Search
CPC .... G11C 11/39; H01L 27/1027; H01L 28/91; H01L 27/1023; H01L 29/7841; H01L 27/10802; H01L 27/075
USPC .......... 365/149, 175; 257/68, 69, 70, 71, 296, 257/E27.075, E27.084
See application file for complete search history.

(56) References Cited

U.S. PATENT DOCUMENTS

| 7,209,384 B1 * | 4/2007 | Kim ............................. 365/175 |
| 8,400,811 B2 * | 3/2013 | Carman et al. .................. 365/72 |
| 2007/0211535 A1 * | 9/2007 | Kim ......................... 365/185.21 |

FOREIGN PATENT DOCUMENTS

| JP | 2007-066364 A | 3/2007 |
| JP | 2009-176331 A | 8/2009 |

* cited by examiner

*Primary Examiner* — Ly D Pham
(74) *Attorney, Agent, or Firm* — McGinn IP Law Group, PLLC

(57) ABSTRACT

There is provided a semiconductor device including a word line, a bit line, a power supply node, a memory element, and a capacitor. The memory element includes at least first and second regions that form a PN junction between the bit line and the power supply node, and a third region that forms a PN junction with the second region. The capacitor includes a first electrode provided independently from the second region of the memory element and electrically connected to the second region of the memory element, and a second electrode connected to the word line.

16 Claims, 40 Drawing Sheets

66: MEMORY CELL (THYRISTOR MEMORY)

66A: MEMORY CELL (FBC MEMORY)

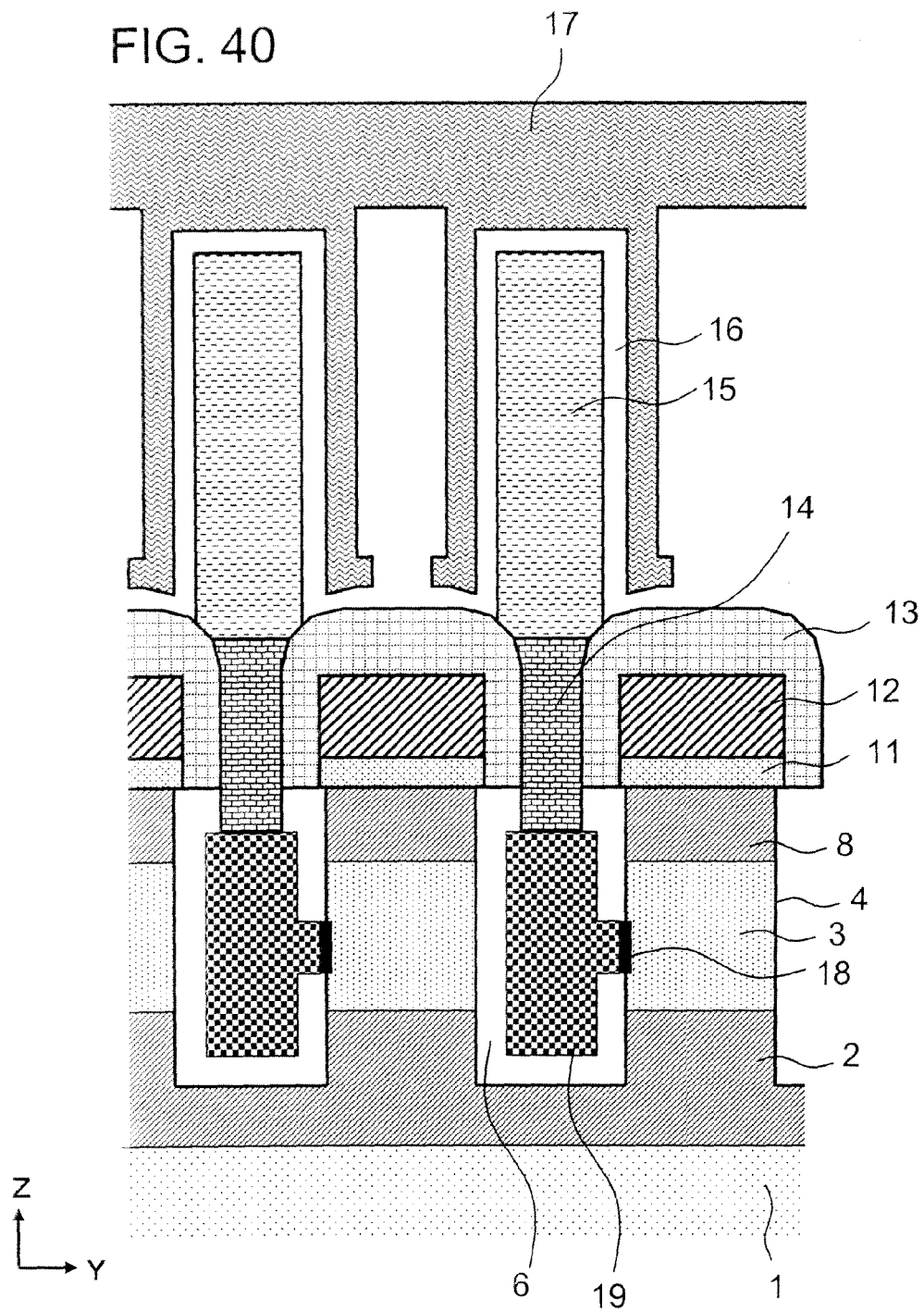

SEMICONDUCTOR DEVICE

REFERENCE TO RELATED APPLICATION

This application is based upon and claims the benefit of the priority of Japanese patent application No. 2011-101779, filed on Apr. 28, 2011, the disclosure of which is incorporated herein in its entirety by reference thereto.

TECHNICAL FIELD

The present invention relates to a semiconductor device, and particularly to a thyristor memory and FBC (Floating Body Cell) memory that store a charge in a floating body, which is a semiconductor region in a floating state.

BACKGROUND

Currently, DRAM is the most common large-capacity semiconductor memory device and is widely used in computer systems. However, the DRAM is said to reach its miniaturization limit in a few years. Therefore, research and development of various large-capacity semiconductor memory devices has been conducted for the purpose of replacing the DRAM. Specifically, the following prior arts have been published on a thyristor and a floating body memory that stores a charge in a floating body of a bipolar transistor.

Patent Document 1 discloses a thyristor memory using a thyristor as a memory element. In Patent Document 1, a memory cell area is reduced by providing one access transistor and a plurality of thyristors connected in parallel with the access transistor. Further, in addition to the access transistor, a gate electrode that controls the turn-on/off of each of the plurality of thyristors is provided, and a word line is connected to each gate electrode. In other words, each thyristor is formed on a semiconductor substrate so as to function as a MOS transistor as well (refer to FIGS. 10, 12, and 14 of Patent Document 1).

Patent Document 2 discloses an FBC memory that uses a region immediately below a gate of a MOS transistor as a floating body. Patent Document 2 describes how an autonomous refresh is performed by the function of a bipolar transistor simultaneously driving a singular or a plurality of bit lines and a plurality of word lines in a data retention mode without using a sense amplifier.
[Patent Document 1]
Japanese Patent Kokai Publication No. JP-P2007-66364A
[Patent Document 2]
Japanese Patent Kokai Publication No. JP-P2009-176331A

SUMMARY

The entire disclosures of Patent Documents 1 and 2 are incorporated herein by reference thereto. The following analysis is en by the present invention. In both Patent Documents 1 and 2, information is stored by storing a charge in a gate capacitor between the gate of the MOS transistor and a body node FB. These technologies include the following problems due to use of MOS transistors.

MOS transistors have GIDL (Gate Induced Drain Leakage) current, and a large negative voltage especially needs to be applied to the gate controlling the floating body, increasing the GIDL current. Due to this leakage current, the refresh characteristics of a data retention period deteriorates. Generally speaking, the GILD current is thought to be the maximum factor among ones causing a cell leakage current.

Further, since it is necessary to determine ion implantation conditions so that characteristics such as a Vt value of the MOS transistor are appropriate, the leakage current of each PN junction cannot be adjusted to a profile that minimizes the junction leakage thereof. The leakage current of the PN junction is one of the factors deteriorating the refresh characteristics.

Further, in the case where a MOS transistor is used in a memory cell, although pillars with a thyristor and bipolar transistor formed on a semiconductor substrate can be formed vertically in a wall-like region and gates (word lines) can be provided on the sidewall thereof in order to suppress an increase in the area of the memory cell, the processing of the word line is difficult and miniaturization is difficult to achieve.

According to a first aspect of the present invention, there provided a semiconductor device comprising a word line; a bit line; a power supply node; a memory element that comprises at least first and second regions that form a PN junction between the bit line and the power supply node, and a third region that forms a PN junction with the second region; and a capacitor that comprises a first electrode provided independently from the second region of the memory element and electrically connected to the second region of the memory element, and a second electrode connected to the word line.

According to the present invention, since a memory cell does not require a MOS transistor, cell leakage current can be reduced and miniaturization is possible. Further, since there is provided a capacitor provided independently from an active region of a memory element and electrically connected, a capacitor with required and sufficient capacitance can be provided without influencing the characteristics of the memory element.

BRIEF DESCRIPTION OF THE DRAWINGS

FIG. 40 is a B-B cross section of a memory cell region according to a tenth exemplary embodiment.

PREFERRED MODES

Figure 1:
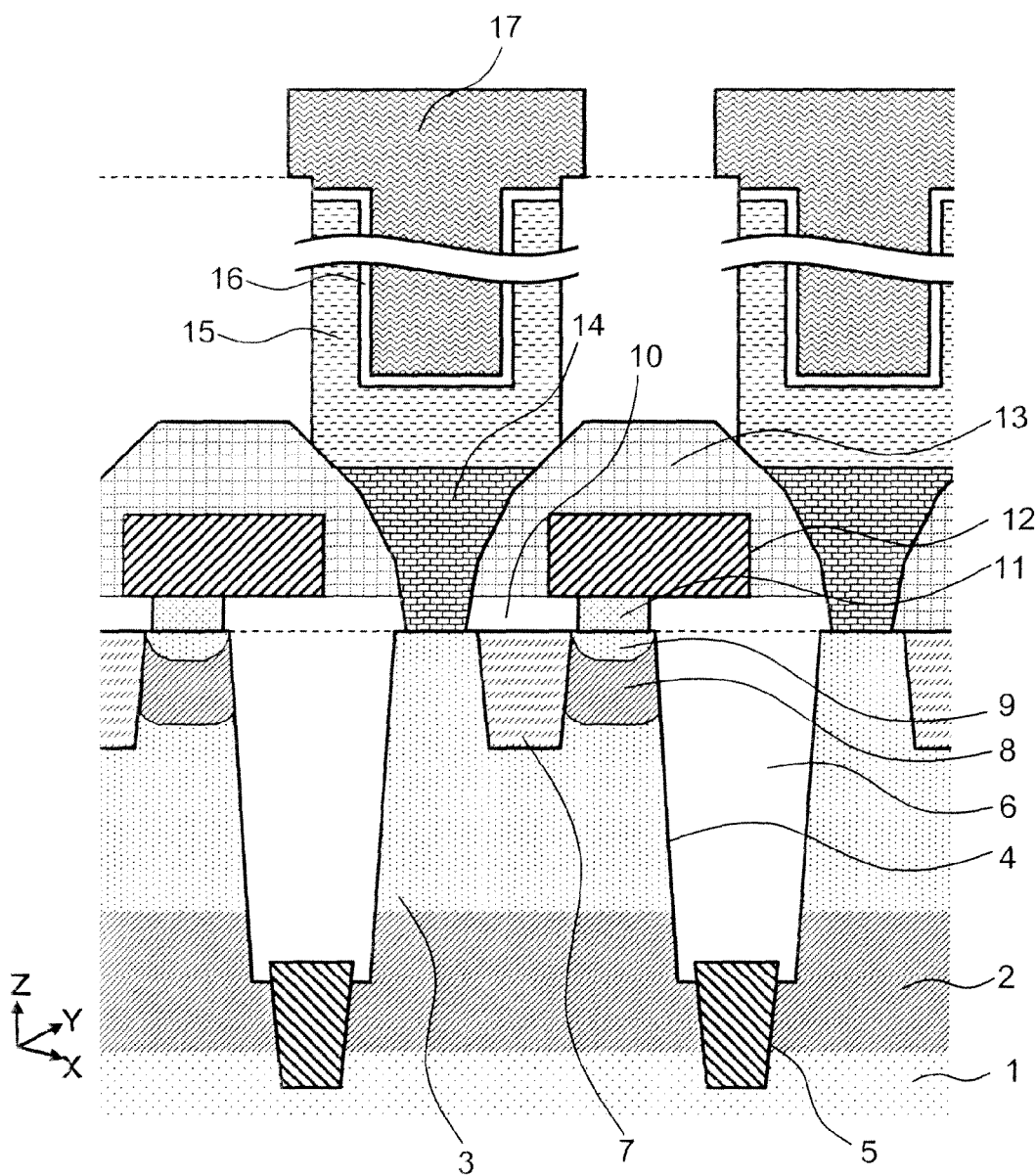
FIG. 1 is an A-A cross section of a memory cell region in a semiconductor device according to a first exemplary embodiment of the present invention.

Before each exemplary embodiment is explained in detail, a summary of exemplary embodiments of the present invention will be given. Further, drawings referred to in the summary description and drawing reference symbols noted in the explanation are examples provided solely to aid in the understanding and are not intended to limit the present invention to the aspects shown in the drawings.

As illustrated in FIGS. 1, 10, 26, and 40, a semiconductor device of an exemplary embodiment of the present invention includes a word line (17); a bit line (12); a power node (2); a memory element that includes at least first and second regions (2 and 3) forming PN junctions with the bit line and the power node and a third region (8) forming a PN junction with the second region (3); and a capacitor that includes a first electrode (15) provided independently from the second region of the memory element and electrically connected to the second region of the memory element and a second electrode (17) connected to the word line.

Figure 10:
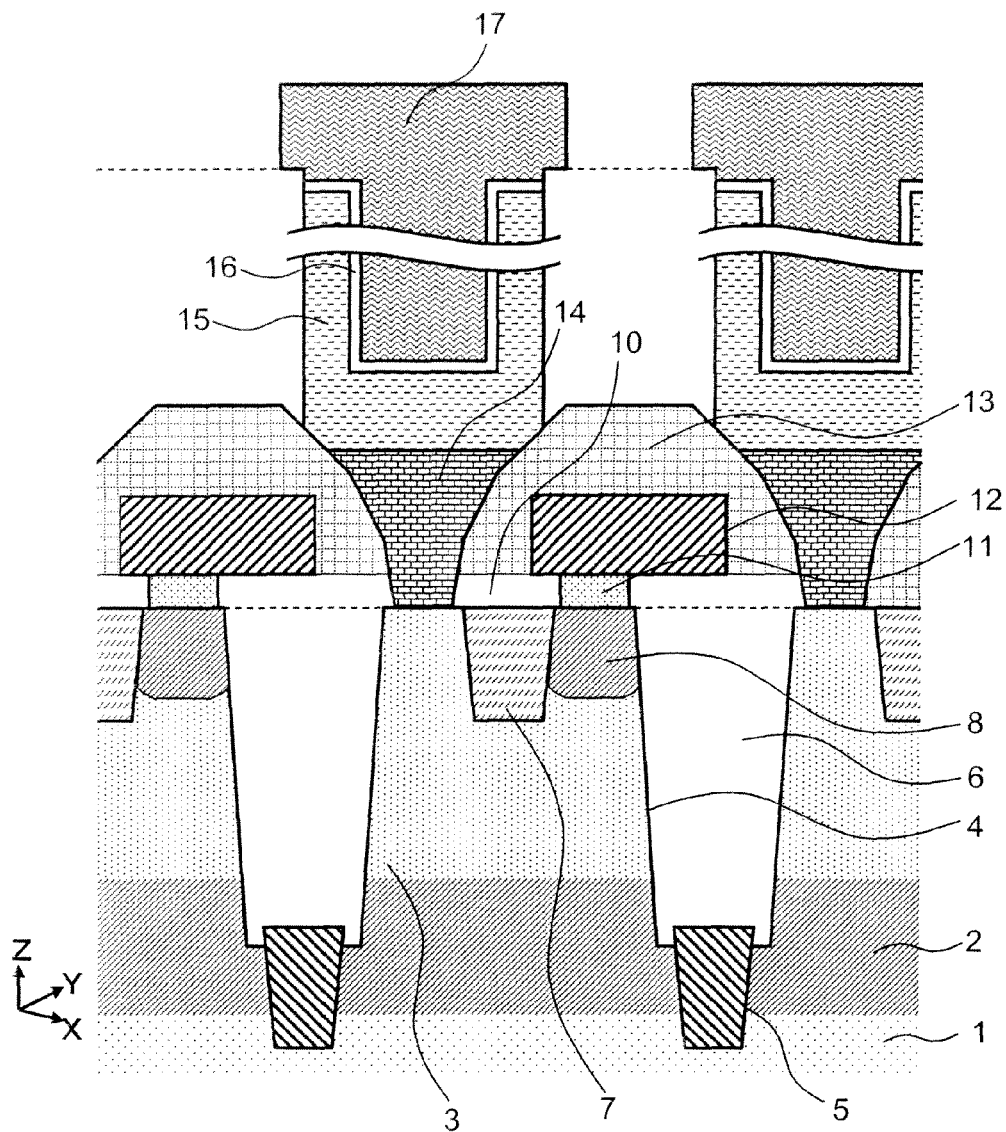
FIG. 10 is an A-A cross section of a memory cell region according to the second exemplary embodiment.
Figure 26:
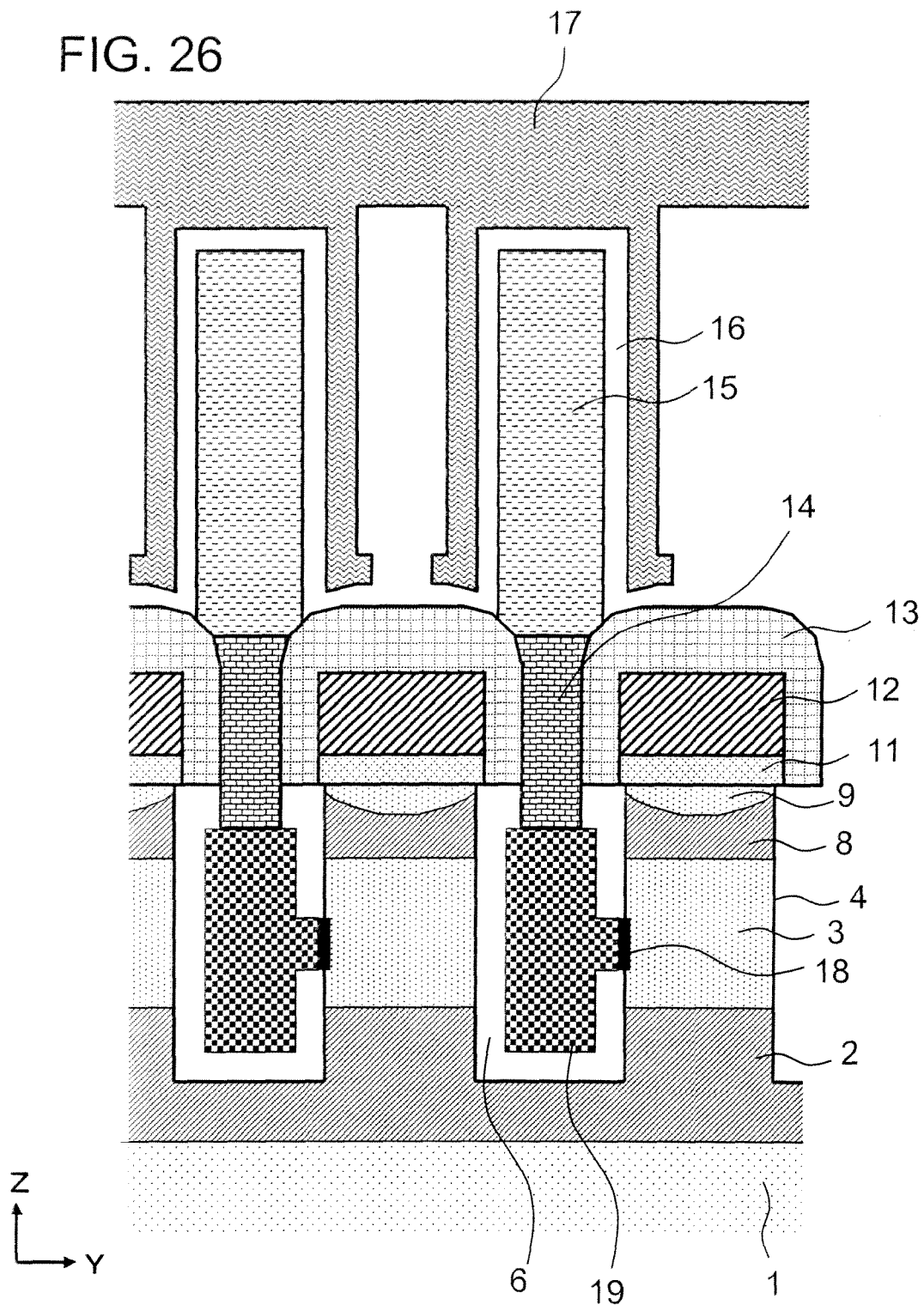
FIG. 26 is a B-B cross section of the memory cell region according to the eighth exemplary embodiment.

As illustrated in FIGS. 1 and 26, the memory element may be a thyristor that further includes a fourth region (9) forming a PN junction with the third region and isolated from the second region, and the bit line may be electrically connected to the fourth region. Further, the memory element may be a bipolar transistor, and the bit line may be electrically connected to the third region as illustrated in FIGS. 10 and 40.

Concrete exemplary embodiments are described with reference to the drawings below.

First Exemplary Embodiment

Figure 2:
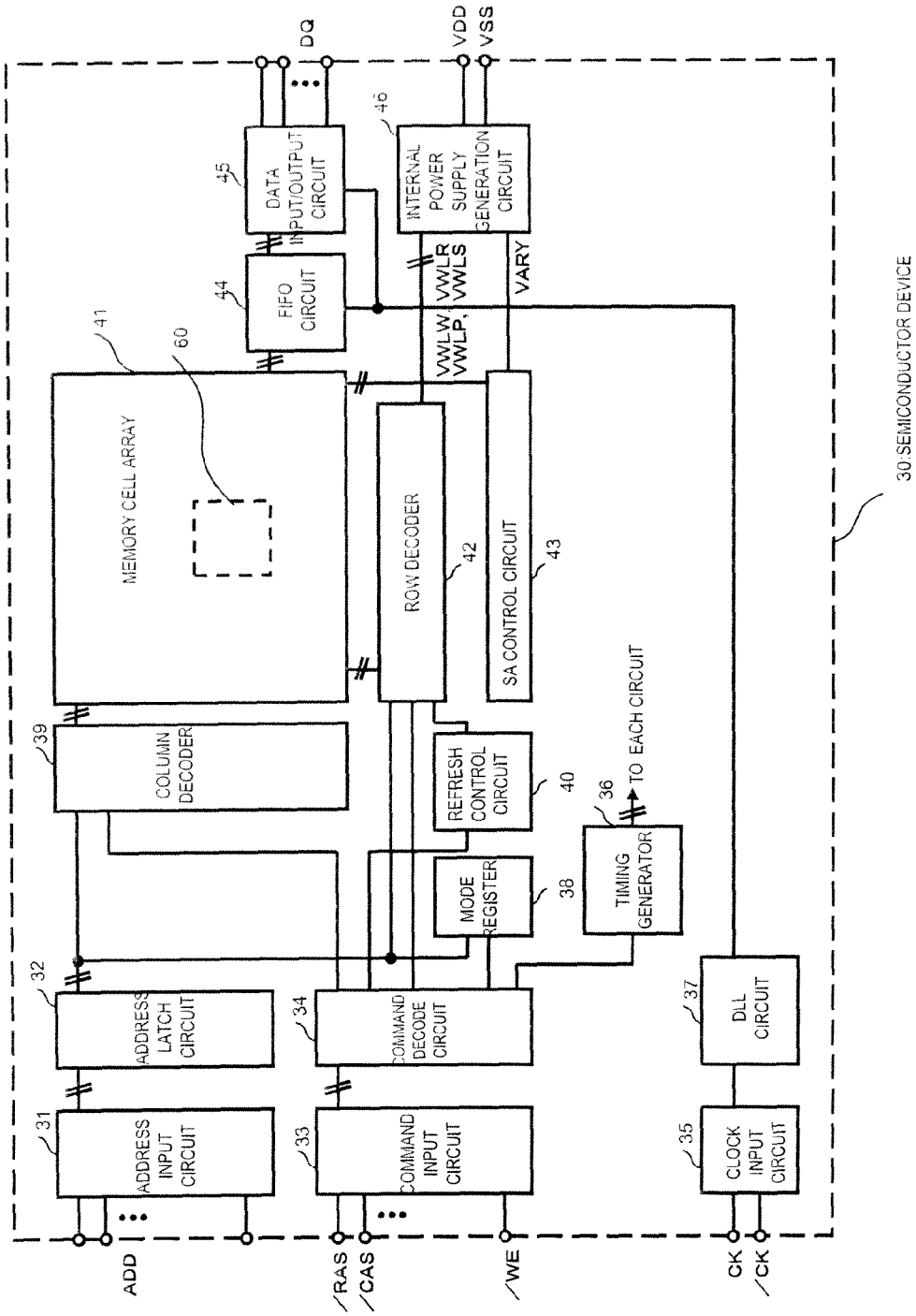
FIG. 2 is a block diagram of the entire semiconductor device according to the first exemplary embodiment.

FIG. 2 is a block diagram of an entire semiconductor device according to a first exemplary embodiment. The semiconductor device 30 of the first exemplary embodiment includes a memory cell array 41 inside and is able to read/write data from/to the memory cell array 41 via a data input/output terminal DQ based on a command signal (/RAS, /CAS, /WE, etc.) externally supplied in synchronization with a clock and an address signal ADD.

An address input circuit 31 receives an address from an address input terminal ADD. An address latch circuit 32 latches the address signal received by the address input circuit 31 in synchronization with the clock. A command input circuit 33 receives the externally supplied command signals such as /RAS, /CAS, and /WE. Note that "/" added to a signal name indicates an active-low signal. A command decode circuit 34 decodes the command signal received by the command input circuit 33 and controls the operation of each part in the semiconductor device 30. A timing generator 36 generates an operation timing signal of each circuit in the semiconductor device 30 based on decoding results of the command decode circuit 34. A clock input circuit 35 receives clock signals CK and /CK from outside. A DLL circuit 37 generates a clock signal synchronized to the externally supplied clock signal so as to perform data input/output at high speed in synchronization with an external source. A mode register 38 is a register externally settable by a command, and the internal operation thereof is controlled by a value set in the mode register 38.

A column decoder 39 decodes a column address in the address signal and selects a bit line of the accessed memory cell from a plurality of bit lines (not shown in FIG. 2) of the memory cell array 41. A refresh control circuit 40 specifies a refreshed row address. The memory cell array 41 is wired in the direction of an intersection of the plurality of bit lines (not shown in FIG. 2) selected by the column decoder 39 and a plurality of word lines (not shown in FIG. 2) selected by the row decoder 42, and a plurality of memory cells (not shown in FIG. 2) corresponding to these intersections are arranged in a matrix. The internal configuration of the memory cell array 41 will be described in detail later. The row decoder 42 decodes the row address and selects a word line of the memory cell array 41. An SA control circuit 43 controls the operation of a sense amplifier (not shown in FIG. 2) included inside the memory cell array.

When a read command is executed, a FIFO circuit 44 converts multiple hits of data read from the memory cell array 41 in parallel into serial data and outputs the data to the data input/output circuit 45. Further, when a write command is executed, the FIFO circuit 44 converts data received serially from the DQ terminal via the data input/output circuit 45 into parallel data and outputs the data to the memory cell array 41 as write data. The data input/output circuit 45 performs input/output of data between the FIFO circuit 44 and the DQ terminal, which is an external data input/output terminal. Further, the DLL circuit 37 supplies a clock to the FIFO circuit 44 and the data input/output circuit 45 and controls them so as to be able to perform input/output of data at high speed in synchronization with an external device. An internal power supply generation circuit 46 generates power necessary for internal operations using power supplied by external power supply terminals VDD and VSS. Main types of power generated by the internal power supply generation circuit 46 will be described. VARY is supplied to the SA control circuit 43 and drives the bit lines to a high level. A word line write voltage VWLW, a word line react voltage VWLR, a word line precharge voltage VWLP, and a word line standby voltage VWLS are supplied to the row decoder 42 and become power driving the word lines.

Figure 3:
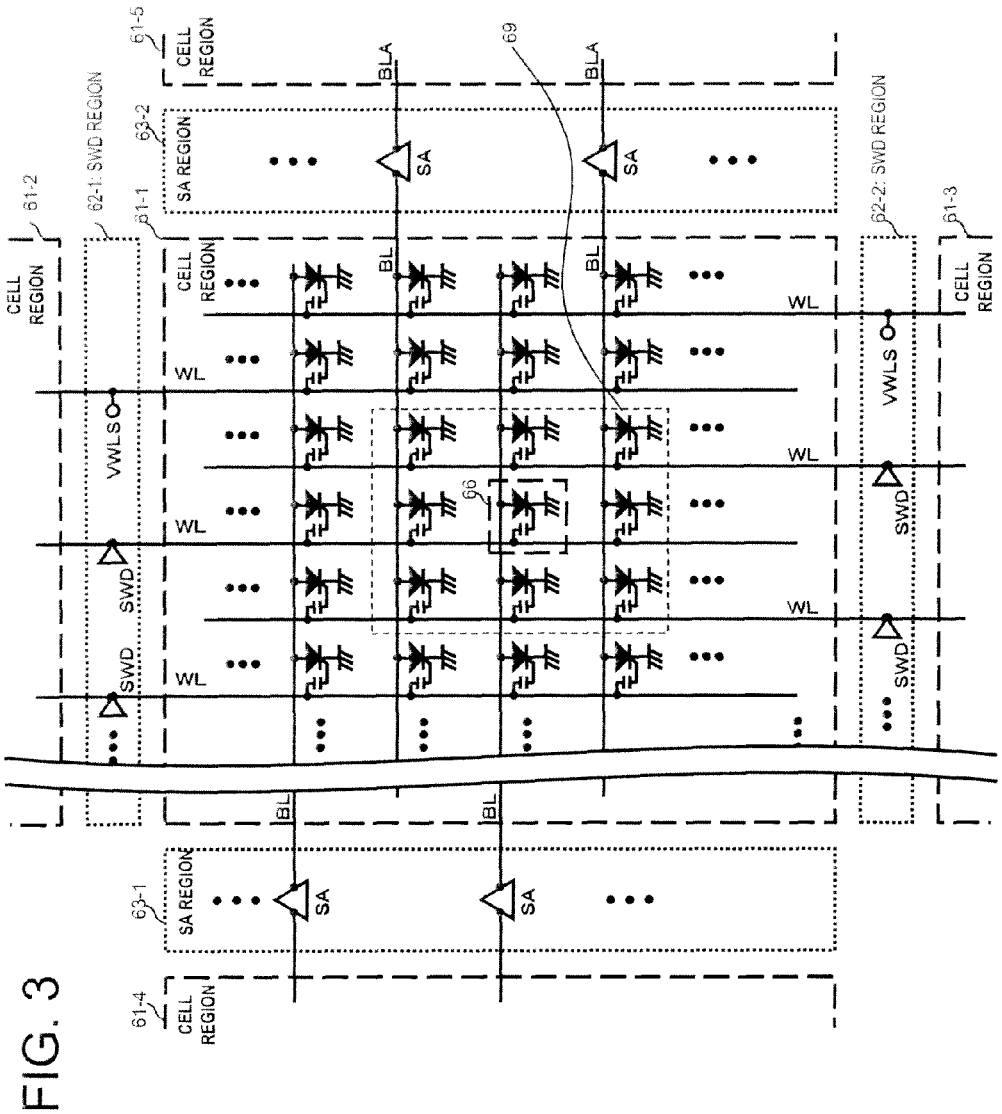
FIG. 3 is a circuit layout around the memory cell region according to the first exemplary embodiment.

FIG. 3 is a circuit layout around the memory cell region according to the first exemplary embodiment. FIG. 3 is a drawing showing the circuit layout inside a region 60 indicated by a broken line in the memory cell array 41 in FIG. 2. Inside the memory cell array 41 shoe in FIG. 2, a number of cell regions 61 shown in FIG. 3 are arranged in a matrix, and FIG. 3 shows a single cell region 61-1 out of the cell regions arranged in a matrix and the circuit layout therearound. Above and below the cell region 61-1, SWD regions 62-1 and 62-2, where sub-word drivers SWD are disposed, are provided. (Sub-)word lines WL are alternately wired from the sub-word drivers SWD provided in the SWD regions 62-1 and 62-2 to the cell region 61-1. Further, the word lines WL driven by the sub-word drivers SWD provided in the SWD region 62-1 are also wired to another cell region 61-2 neighboring the cell region 61-1 with the SWD region 62-1 interposed therebetween. Similarly, the word lines WL driven by the sub-word drivers SWD in the SWD region 62-2 are wired to a cell region 61-3 as well.

SA regions 63-1 and 63-2, where sense amplifiers SA are disposed, are provided on the left and right of the cell region 61-1. The bit lines BL are alternately wired to the cell region 61-1 from the sense amplifiers SA provided in the SA regions 63 and 63-2. Further, another set of hit lines are wired from the sense amplifiers SA provided in the SA region 63-1 to another cell region 61-4 neighboring the cell region 61-1 with the SA region 63-1 interposed therebetween. Similarly, another set of bit lines BL are wired from the sense amplifiers SA provided in the SA region 63-2 to another cell region 61-5 as well. A plurality of memory cells 66 corresponding to intersections of the bit lines BL and the word lines WL are arranged in a matrix inside the cell region 61-1.

Figure 4:
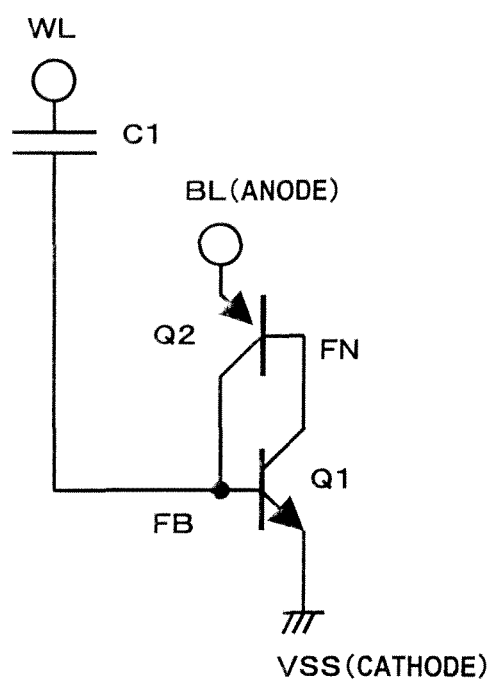
FIG. 4 is a circuit diagram of a memory cell (thyristor memory) according to the first exemplary embodiment.

FIG. 4 shows the internal circuit of a single memory cell 66 shown in FIG. 3. In FIG. 4, a thyristor having an anode connected to the bit line BL and a cathode connected to a power node VSS is provided between the bit line BL and the power node VSS. The thyristor includes an NPN transistor having an emitter connected to the cathode, a base to a floating body FB, and a collector to a region FN, and a PNP transistor having an emitter connected to the anode, a base to the region FN, and a collector to the floating body FB. Further, a capacitor C1 is provided between the floating body FB and the word line WL. In other words, the memory cell 66 in FIG. 3 includes one thyristor and one capacitor C1, but does not include any MOS transistor.

Figure 5:
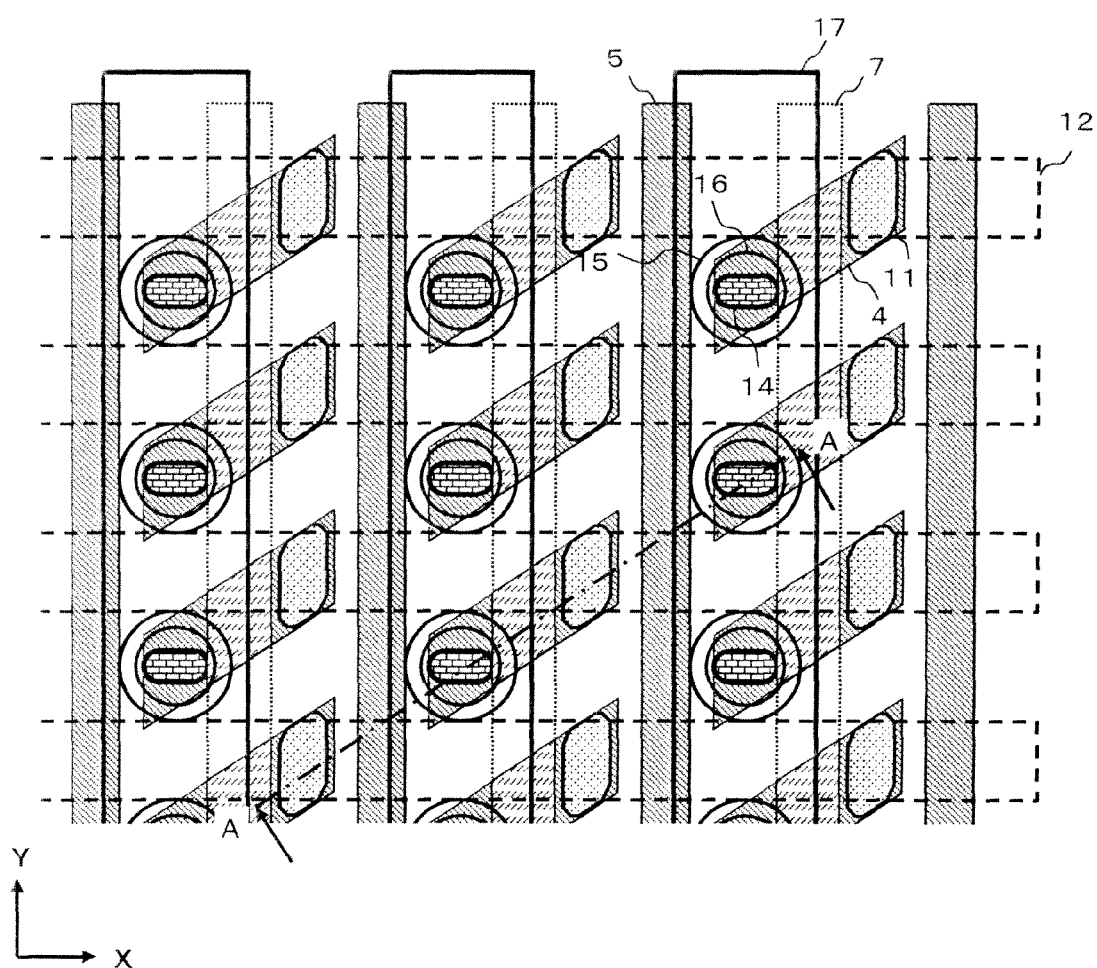
FIG. 5 is a plan of the memory cell region in the first exemplary embodiment.

FIG. 5 is a plan of a memory cell region according to the first exemplary embodiment. FIG. 5 shows a plan of a region indicated by a broken line 69 in FIG. 3. Further, FIG. 1 shows a cross section of A-A in FIG. 5 viewed from the direction of the arrow. In FIG. 1, an N-type cathode 2 and a diffusion layer 4 of a P-body 3 are provided, laminated in this order, on a main surface of a P-type semiconductor substrate 1. An STI (Shallow Trench Isolation) 6 is wedged in from a surface of the diffusion layer 4 and reaches the N-type cathode 2. Each memory cell is partitioned by this STI 6. Further, an embedded metal 5 in contact with the P-type semiconductor substrate 1 and the N-type cathode 2 is provided at the bottom of each STI 6. The N-type cathode 2 is electrically connected via the embedded metal 5 and is a common power node for all the memory cells. A recess 7 is wedged in from the surface of the diffusion layer 4 at the center of a surface of the P-body 3 of each memory cell partitioned by the STI. On a surface of one side of the P-body 3 divided into two by the recess 7 for each memory cell, an N-type diffusion layer 8 and a P-type anode 9, which is a P-type diffusion layer, are laminated in this order.

An interlayer film 10 is provided on the surface of the diffusion layer 4 including the P-type anode 9, covering the entire surface. In the interlayer film 10 on the surface of the P-type anode 9, a bit line contact 11 is provided and the P-type anode 9 is connected to a bit line 12 provided on the top of the interlayer film 10 via the bit line contact 11. An upper surface and sides of the bit line 12 are covered by a sidewall 13, a nitride film. Further, a capacitor contact 14 is provided on a surface of the other side of the P-body 3 separated from the N-type diffusion layer 8 and the P-type anode 9 by the recess 7, penetrating the interlayer film 10, and is connected to a lower electrode 15 of a capacitor provided above the bit line 12. Further, a word line 17 is provided above the lower electrode 15 with a capacitor film 16 interposed therebetween as the uppermost wiring layer of the memory cell structure.

In the memory cell, the P-type anode 9 of the thyristor comprised of the P-type anode 9, the N-type diffusion layer 8, the P-body 3, and the N-type cathode 2 is connected to the bit line 12 via the bit line contact 11, and the N-type cathode 2 of the thyristor becomes a power node. Further, the N-type cathode 2 and the embedded metal 5 are connected to the external power supply terminal VSS, not shown in the drawing. Further, the P-body 3 of the thyristor is connected to the word line 17 via the capacitor contact 14 and via the capacitor comprised of the (lower) electrode 15, the capacitor film 16, and the word line 17. Further, the recess 7 is provided, and the P-type anode 9 and the N-type diffusion layer 8 are formed in a region separated by the recess 7 from the P-body 3 connected to the capacitor contact 14.

As shown in FIGS. 1 and 5, the memory cell does not use any MOS transistor including parasitic transistor. Therefore, the problems caused by using a MOS transistor in the memory cell, such as the GIDL current, do not occur. Further, while the capacitor is electrically connected to the thyristor, which is a memory element, via the capacitor contact 14, the capacitor and the thyristor, a memory element, are provided independently of each other. Therefore, optimizing the impurity concentration of each semiconductor region of the memory element does not influence the characteristics of the capacitor.

Further, necessary and sufficient capacitance of the capacitor can be provided without influencing the characteristics of the memory element.

Further, when the parasitic capacitance of a MOS transistor is the cell capacitance, the cell capacitance between the body node FB (a back bias of an NMOS transistor) and a gate is approximately from 10 aF (attofarad: 1E-18) to 50 aF in a 65 nm process and is very small. If the process is miniaturized in the future, the area between the body node FB and the gate will decrease and so will the cell capacitance. As a result, a slight cell leakage current will deteriorate the refresh characteristics. Note that the cell capacitance of a DRAM is approximately 25 fF (femtofarad: 1E-15) and is larger than the parasitic capacitance of an NMOS transistor by approximately three digits.

Since the charge of a carrier such as a hole and electron is 0.16 aC (attocoulomb), for instance, in a case where the cell capacitance is 16 aF, leakage of a single carrier will change the level of the body node FB by 10 mV. Assuming that a read failure occurs when the level of the body node FB changes from the level immediately after a write operation by 0.5 V or more, one can conclude that mere 50 leaked carriers will cause a read failure or refresh failure. The time it takes for approximately 50 carriers to leak varies greatly each time due to a probabilistic fluctuation. With 50 carriers, 1σ (sigma: standard deviation) corresponds to approximately 14 percent of fluctuation, and this value nearly matches the fluctuation in leakage time. This fluctuation probability can be calculated using the Poisson distribution. Therefore, refresh operation becomes increasingly non-reproducible, and it becomes difficult to perform a redundancy relief on or sort refresh failure bits. The only way to solve this problem is to increase the cell capacitance thereby increasing the number of leaked carriers required to cause a refresh failure. A calculation by the inventor estimates this number of carriers required to be approximately 1,000 or more. In other words, a cell capacitance of approximately 0.32 fF (=0.16 aC×1,000/0.5 V) or greater is required.

The device structure example shown in FIG. 1 employs a concave-type capacitor structure (the electrode 15 is crown-shaped with the capacitor inside), but the capacitor can be produced using the same process steps as those for DRAM's capacitor. There are several types of capacitor structures used in DRAM and any structure can be used. Generally speaking, the product of the cell leakage current value by required refresh characteristics, a capacitance of approximately 20 fF or greater, is required in DRAM, and it has become difficult to achieve miniaturization in recent years because this amount of cell capacitance must be obtained. On the other hand, as described above, since the cell leakage current value can be greatly improved in the semiconductor memory device of the present invention, with refresh characteristics equal to those of a DRAM, the cell capacitance may be reduced. If it is possible to reduce the cell leakage current to the point where it is less than that of the DRAM by two digits, one can reduce it to approximately 0.32 fF as described above.

Further, in principle, it is possible to make the capacitance value of the capacitor smaller than that of the DRAM. In other words, when cell data is read, the thyristor, which is a memory element, operates as an active element due to the selection of the word line and the bit line, and drives the bit line. Therefore, it is possible to reduce the capacitance in principle, compared to the DRAM where the capacitance of a memory cell is simply read via a switch. Further, since the memory element simply needs to comprise three PN junctions and is able to function as an active element without using a surface of a semiconductor substrate unlike a MOS transistor, it is easy to reduce the cell area by providing the memory elements vertically to the semiconductor substrate as shown in FIG. 1.

(Principle of Operation of the Thyristor Memory Cell)

With reference to the circuit diagram in FIG. 4, a summary of the principle of operation of a thyristor memory cell will be given. In a case where a voltage at the FB node is raised from a low voltage through the capacitance of the cell capacitor, when a voltage across the FB node (P-type region) and the cathode VSS (N-type region) reaches near a voltage of a built-in potential VBI of the PN junction thereof, a diode forward current starts to flow from the FB node to the cathode VSS. This current is equal to a base-emitter current of the NPN bipolar transistor Q1.

In a case where the bit line BL (anode) is at a sufficiently high voltage, when the voltage at the FB node is raised through the capacitance of the cell capacitor and the voltage reaches near the voltage VBI, the NPN bipolar transistor Q1 weakly turns on and the node FN drops to a low level thereby turning on a PNP bipolar transistor Q2 and raising the FB node to a even higher voltage. As a result, the NPN bipolar transistor Q1 turns on more strongly, and the anode BL and the cathode VSS of the thyristor memory cell become conductive.

Once the thyristor memory cell becomes conductive, as long as a sufficiently high voltage is applied to the bit line BL (anode), the conductive state is maintained even if a coupling voltage is applied to the FB node through the capacitance of the cell capacitor.

The thyristor memory cell is made non-conductive by decreasing the potential difference between the anode BL and the cathode VSS to a small potential difference not eater than the voltage VBI. When the bit line BL is decreased to a voltage not greater than the voltage VBI, the FB node drops to a voltage not greater than the voltage VBI due to the leakage current of the PN junction. Since the NPN bipolar transistor Q1 turns off as a result, the anode BL and the cathode VSS the thyristor memory cell become non-conductive.

When the bit line BL (anode) is at a sufficiently low voltage not greater than the voltage VBI, the NPN bipolar transistor Q1 and the PNP bipolar transistor Q2 will remain off even if the voltage at the FB node is raised, and therefore, the anode BL and the cathode VSS of the thyristor memory cell never become conductive.

Figure 6:
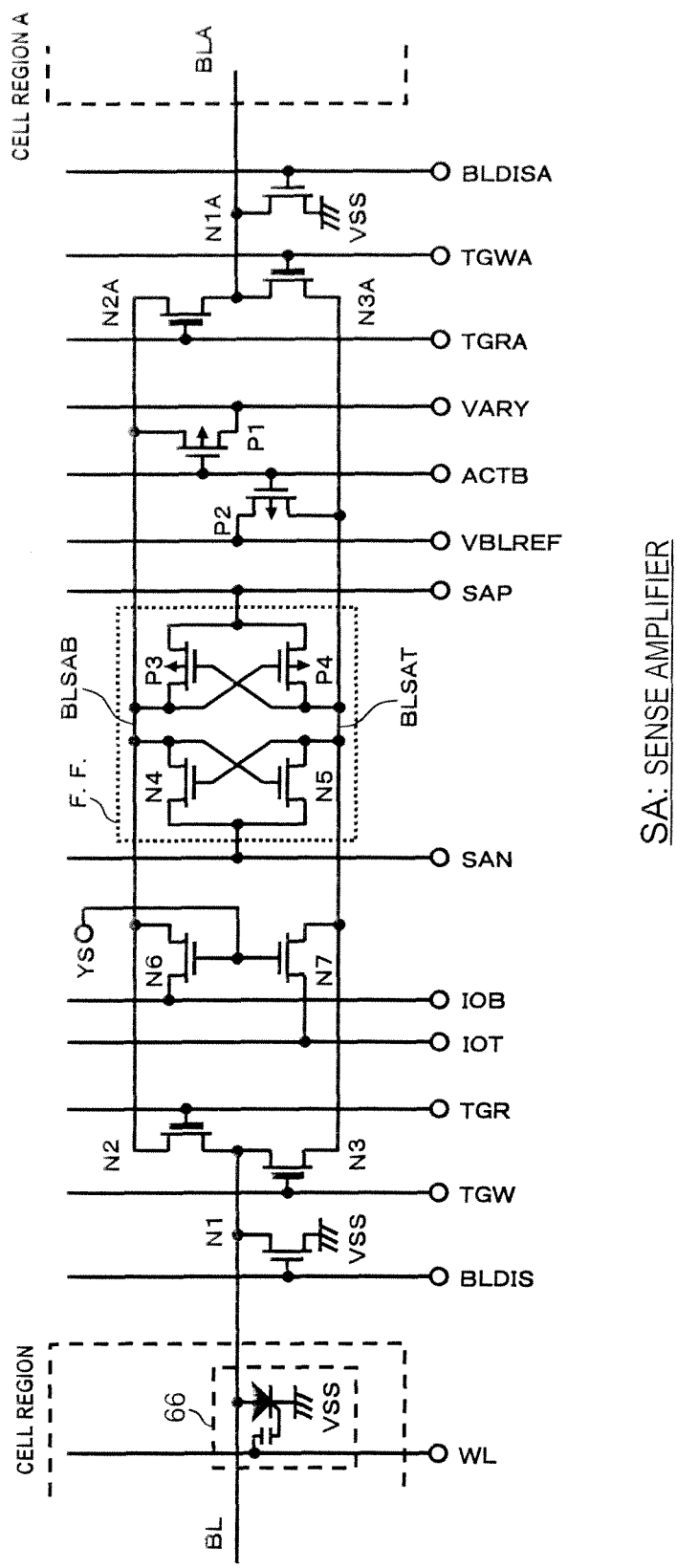
FIG. 6 is a circuit diagram of a sense amplifier in the first exemplary embodiment.

FIG. 6 is a circuit diagram of the sense amplifier SA in the first exemplary embodiment. A bit line BL is connected to the sense amplifier SA from a cell region, and another bit line BLA is connected from another adjacent cell region A. A drain of an N-type transistor N1 is connected to the bit line BL, and the N-type transistor N1 has a gate and source connected to a control signal BLDIS and the power supply VSS, respectively. Similarly to the N-type transistor N1, an N-type transistor N1A is provided for the bit line BLA. The N-type transistors N1 and N1A fix the potentials of the bit lines BL and BLA, respectively, to the level of the power supply VSS when the bit lines BL and BLA are unselected (standing by).

An N-type transistor N2 has one of a source or drain connected to the bit line BL, other of the source or drain connected to an inverted sense amplifier hit line BLSAB, and a gate connected to a control signal TGR. The control signal TGR is activated to a high level when data of the hit line BL is read, and the bit line BL is connected to the inverted sense amplifier bit line BLSAB via the N-type transistor N2 during the read operation. Similarly, an N-type transistor N2A is provided between the bit line BLA and the inverted sense amplifier bit line BLSAB, and a control signal TGRA is connected to a gate of the N-type transistor N2A.

Further, an N-type transistor N3 has one of a source or drain connected to the bit line BL, the other of the source or drain connected to a non-inverted sense amplifier bit line BLSAT, and a gate connected to a control signal TGW. The control signal TGW is activated to a high level when the bit line BL is driven based on data of the sense amplifier SA during a write operation, and the bit line BL is connected to the non-inverted sense amplifier bit Line BLSAT via the N-type transistor N3 during the write operation. Similarly, an N-type transistor N3A is provided between the bit line BLA and the non-inverted sense amplifier bit line BLSAT, and a control signal TGWA is connected to a gate of the N-type transistor N3A.

A flip-flop F. F. is provided between the inverted sense amplifier bit line BLSAB and the non-inverted sense amplifier bit line BLSAT to amplify the potential difference between the inverted sense amplifier bit line BLSAB and the non-inverted sense amplifier hit line BLSAT. The flip-flop F. F. includes P-type transistors P3 and P4 and N-type transistors N4 and N5. Further, a SAP and SAN are connected to the flip-flop F. F. as power supplies for the P-type transistors and the N-type transistors, respectively. The power supplies SAP and SAN are activated only when the operation of the flip-flop F. F. is needed. When activated, the power supply SAP has the same potential as the power supply VARY and the power supply SAN has the same potential as the power supply VSS. The maximum amplitude of the bit line BL is determined by the voltages of the power supplies SAP and SAN, and the voltage of the power supply VARY. When deactivated, the power supply SAP has the same potential as the power supply VSS and the power supply SAN has the same potential as the power supply VARY.

An N-type transistor N6 is a switch that connects the inverted sense amplifier bit line BLSAB to an inverted I/O line IOB, and an N-type transistor N7 is a switch that connects the non-inverted sense amplifier bit line BLSAT to a non-inverted I/O line IOT. The conductive state (conductive or non-conductive) of the N-type transistors N6 and N7 is controlled by a column select signal YS. When data is written from the outside of the memory cell array or data of the memory cell array is read to outside, input/output of read/write data is performed by connecting the inverted sense amplifier bit line BLSAB to the inverted I/O line IOB, and connecting the non-inverted sense amplifier hit line BLSAT to the non-inverted I/O line IOT of the sense amplifier SA via the N-type transistors N6 and N7.

A P-type transistor P1 connected between the inverted sense amplifier bit line BLSAB and the bit line activating power supply VARY, and a P-type transistor P2 is connected between the non-inverted sense amplifier hit line BLSAT and a bit line judgment reference power supply VBLREF. A control signal ACTB is connected to gates of the P-type transistors P1 and P2. The control signal ACTB is activated to a low level during a read operation.

(Operation of the First Exemplary Embodiment: Write Operation to the Memory Cell)

Figure 7:
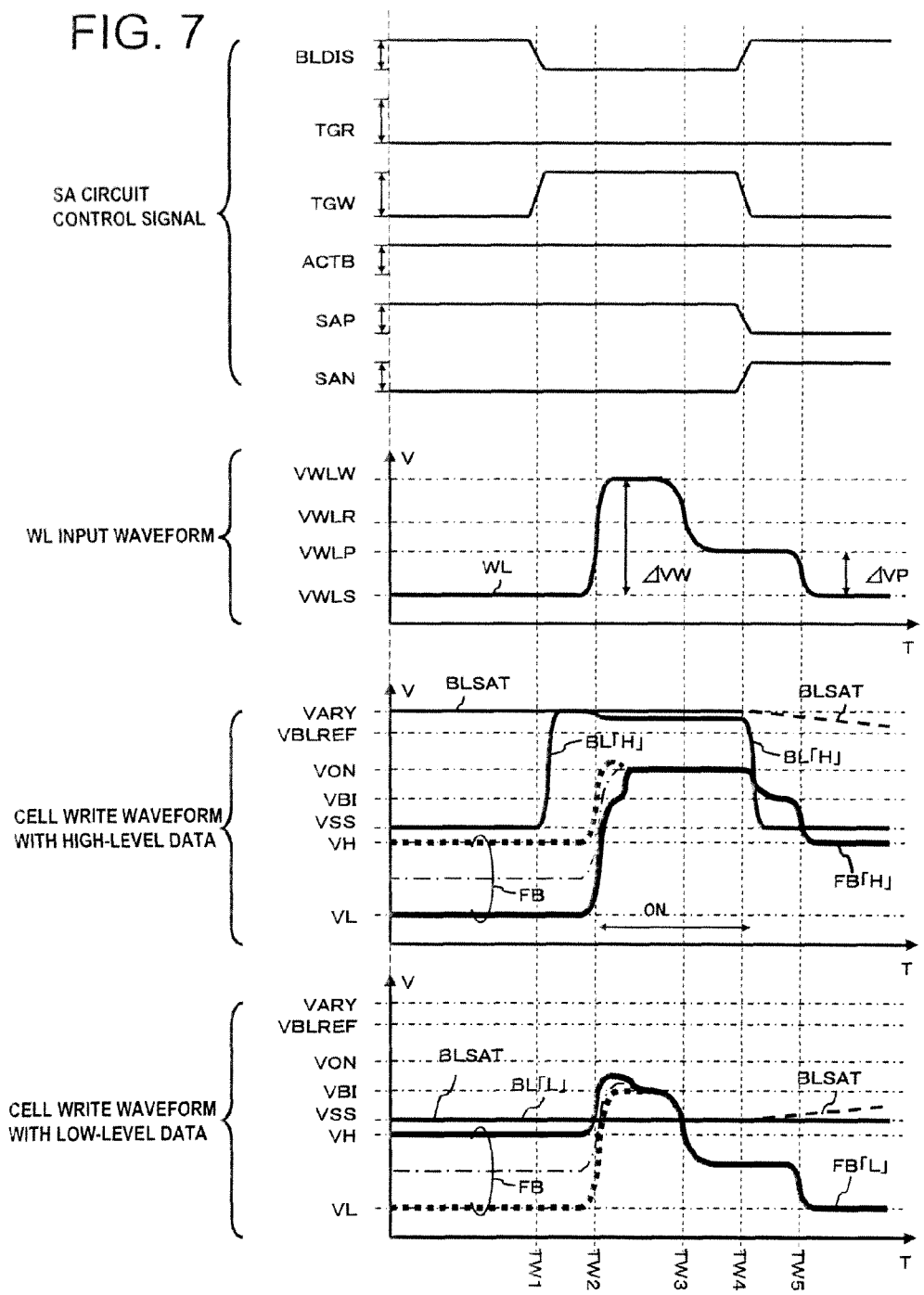
FIG. 7 shows memory cell write waveform diagrams of the first exemplary embodiment.

Next, the operation of the first exemplary embodiment will be described. FIG. 7 shows write waveforms of the memory cell of the first exemplary embodiment. With reference to FIGS. 6 and 7, the write operation to the memory cells will be described first.

In FIG. 7, a standby state continues until a timing TW1, i.e., both the bit line and the word line are unselected. In this state, the control signal BLDIS is at a high level, both the control signals TGR and TGW are at a low level, and the bit line BL is disconnected from the non-inverted sense amplifier bit line BLSAT and the inverted sense amplifier bit line BLSAB of the sense amplifier SA and fixed to a low level (VSS). Further, the VARY voltage and the VSS voltage are supplied to the power supply SAP of the P-type transistors and the power supply SAN of the N-type transistors, respectively, of the flip-flop F. F. of the sense amplifier SA, activating the flip-flop F. F., and the control signal ACTB is at a high level, an inactivation level. In this state, the flip-flop F. F. holds write data received from the I/O lines IOT and IOB in advance. Therefore, the voltage of the non-inverted sense amplifier bit line BLSAT is the same as the voltage VARY when the write data is at a high level and the same as the voltage VSS when the write data is at a low level.

Further, the word line is fixed to the word line standby voltage VWLS, a non-selection level. At this time, the FB node (refer to FIG. 4; corresponding to the P-body 3 in FIG. 1) of the memory element (thyristor) is at a VH or VL potential, depending on the logic level of data held by the memory cell. VH is a higher potential than VL, but lower than the voltage VBI.

At the timing TW1, the control signal BLDIS falls down while the control signal TGW rises up, and the bit line BL is released from the state in which it was fixed to the low level (VSS) and connected to the non-inverted sense amplifier bit line BLSAT. When the flip-flop F. F. of the sense amplifier SA maintains the high level as the write data received from the I/O lines IOT and JOB, the bit line BL is driven to the voltage VARY. Meanwhile, when the write data is at a low level, the voltage of the bit line BL maintains the low level (VSS). At this stage, even when the voltage of the bit line BL rises to the high level VARY, the voltage at FB node continues to be the voltage before the timing TW1 and the memory element does not start to operate since the voltage of the word line WL continues to be the standby voltage VWLS.

Next, at a timing; TW2, the sub-word driver SWD raises the voltage of the word line WL to the word line write voltage VWLW. When this happens, the voltage at the FB node increases to a voltage not less than the voltage VBI when the data held by the memory cell is at the high level VH, and to a voltage near the voltage VBI when the data is at the low level VL, through the capacitance of the cell capacitor.

When high-level data is written to the memory cell, the thyristor becomes conductive since the bit line BL is driven to the high level (VARY). When the thyristor becomes conductive, the voltage of the bit line BL drops by the amount of on-resistance of the transistors P4 and N3 and of wiring resistance of the bit line. Further, the FB node goes to the level of a voltage VON determined by the ratio between on-resistance of the PNP bipolar transistor Q2 and internal resistance of the PN junction diode between the FB node and VSS (cathode).

Conversely, when the write data is at the low level, the thyristor does not become conductive even when the potential of the word line WL rises to the word line write voltage VWLW since the voltage of the bit line BL continues to be at the low level (VSS). When the voltage at the FB node increases to a voltage not less than the voltage VBI (when the data hitherto held by the memory cell is at the high level VH), the voltage at the FB node rapidly drops to the level of the voltage VBI due to the PN junction between the FB node (P-type region) and the cathode VSS (N-type region).

At the timing TW3, the sub-word line driver SWD pulls down the voltage of the hit line to the word line precharge voltage VWLP, an intermediate voltage between the word line write voltage VWLW and the word line standby voltage VWLS. When the bit line is driven to the high level (VARY) and high-level data has been written to the memory cell, the voltage at the FB node continues to be the voltage VON even when the voltage of the word line drops to the word line precharge voltage VWLP since the thyristor, the memory element, is in the conductive state.

Conversely, when the data written to the memory cell is at the low level and the voltage of the bit line BL is at the low level (VSS), the voltage at the FB node drops along with a voltage drop of the word line to a low voltage through the capacitance of the cell capacitor since the thyristor is in a non-conductive state.

At a timing TW4, the control signal TGW falls down while the bit line BL is disconnected from the non-inverted sense amplifier bit line BLSAT, the control signal BLDIS rises up, and the voltage of the bit line BL is fixed to the low level (VSS). Further, the flip-flop F. F. is deactivated by setting the power supplies SAP and SAN of the flip-flop F. F. of the sense amplifier SA to a low level and high level, respectively. As a result, the non-inverted sense amplifier bit line BLSAT is in a floating state at the timing TW4 and thereafter.

When the data written to the memory cell is at the high level, the conductive state of the memory element, the thyristor, terminates due to the fact that the voltage of the bit line BL drops to VSS, and the voltage at the FB node drops to the built-in potential VBI as well. Conversely, when the data written to the memory cell is at the low level, the state of the memory cell does not change since the voltage of the bit line BL continues to be at the low level (VSS).

At a timing TW5, the voltage of the word line WL is pulled down to the word line standby voltage VWLS from the word line precharge voltage VWLP. Since the thyristor, the memory element, is in the non-conductive state, the voltage at the FB node drops through the capacitance of the cell capacitor. This voltage drops to the voltage VH when the data written to the memory cell is at the high level, and to the even lower voltage VL when the data written to the memory cell is at the low level. This potential difference between VH and VL is held as the data written to the memory cell.

(Read Operation from the Memory Cell)

Figure 8:
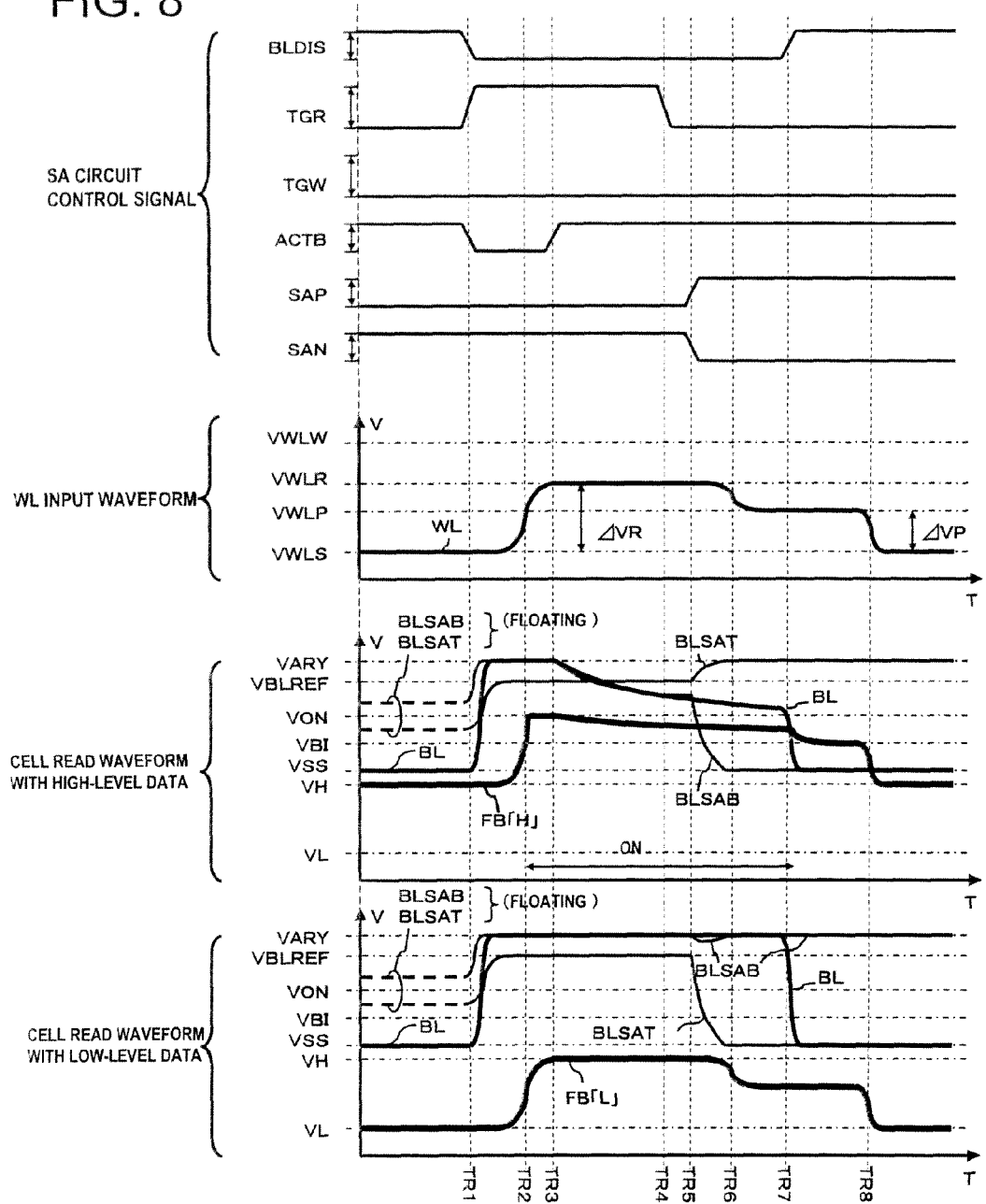
FIG. 8 shows memory cell read waveform diagrams of the first exemplary embodiment.

FIG. 8 shows read waveforms of the memory cell of the first exemplary embodiment. With reference to FIGS. 6 and 8, the read operation from the memory cell will be described. A standby state continues until a timing TR1, both the bit line and the word line are unselected. In this state, the control signal BLDIS is at a high level, both the control signals TGR and TGW are at a low level, and the bit line BL is disconnected from the non-inverted sense amplifier hit line BLSAT and the inverted sense amplifier bit line BLSAB of the sense amplifier SA and fixed to the low level (VSS). Further, the power supply SAP of the P-type transistors and the power supply SAN of the N-type transistors of the flip-flop F. F. of the sense amplifier SA are at a low level and high level, respectively, putting the flip-flop F. F. in an inactive state, and the non-inverted sense amplifier bit line BLSAT and the inverted sense amplifier bit line BLSAB are in a floating state.

Further, the control signal ACTB is also at a high level, the inactivation level. The FB node of the memory cell is at the VH or VL voltage, depending on the data held by the memory cell.

At the timing TR1, the control signal BLDIS goes to a low level, releasing the bit line from being fixed to the low level (VSS), the ACTB signal goes to a low level and is activated, and the inverted sense amplifier bit line BLSAB and the non-inverted sense amplifier bit line BLSAT are set to the voltage VARY and the voltage VBLREF, respectively. Further, the control signal TGR is activated, the bit line BL is driven by the voltage VARY of the inverted sense amplifier bit line BLSAB, and the voltage of the bit line BL increases to the voltage VARY.

At a timing TR2, the sub-word driver SWD raises the voltage of the word line WL to the word line read voltage VWLR. The word line read voltage VWLR is lower than the word line write voltage VWLW, but higher than the word line precharge voltage VWLP. Due to the fact that the word line voltage rises to the word line read voltage VWLR at the timing TR2, the FB node voltage is pulled up through the capacitance of the capacitor of the memory cell. When the memory cell maintains a high level and the FB node voltage is at the VH level, the rise of the word line increases the FB node voltage to the voltage VBI at which the memory element (thyristor) becomes conductive, and the memory element becomes conductive. Conversely, when the memory cell maintains a low level and the FB node voltage is at the VL level, the rise of the word line does increase the FB node voltage, but not to the voltage VBI at which the memory element (thyristor) becomes conductive. As a result, the memory element does not become conductive.

At a timing TR3, the control signal ACTB is raised to a high level in an inactive state, and the inverted sense amplifier bit line BLSAB and the non-inverted sense amplifier bit line BLSAT are released from the states in which they are fixed to the voltage VARY and the voltage VBLREF, respective y. Since the inverted sense amplifier bit line BLSAB is connected to the bit line BL via the N-type transistor N2, the voltages of the hit line BL and the inverted sense amplifier bit line BLSAB gradually decrease when the memory element (thyristor) of the memory cell is conductive. Conversely, when the memory element (thyristor) of the memory cell is not conductive, the voltages of the bit line BL and the inverted sense amplifier bit line BLSAB continue to be the voltage VARY since there is no route for a current to flow. Further, the non-inverted sense amplifier bit line BLSAT maintains the voltage VBLREF even when the control signal ACTB goes to the high level since it is not connected to the bit line BL.

At a timing TR4, the control signal TGR falls to a low level, disconnecting the bit line BL from the inverted sense amplifier bit line BLSAB.

At the following timing TR5, the power supply SAP of the P-type transistors and the power supply SAN of the N-type transistors of the flip-flop F. F. of the sense amplifier SA are set to the high level (VARY) and the low level (VSS), respectively, activating the flip-flop F. F., which starts to amplify the potential difference between the non-inverted sense amplifier bit line BLSAT and the inverted sense amplifier bit line BLSAB. Here, when the memory cell maintains a high level and the memory element has become conductive due to the rise of the word line, the non-inverted sense amplifier bit line BLSAT and the inverted sense amplifier bit line BLSAB are amplified to a high level and low level, respectively, since the voltage of the inverted sense amplifier bit line BLSAB has dropped to a voltage not greater than the reference voltage VBLREF. Conversely, when the memory cell maintains a low level and the memory element is not made conductive by the rise of the word line, the non-inverted sense amplifier hit line BLSAT and the inverted sense amplifier bit line BLSAB are amplified to a low level and high level, respectively, since the voltage of the inverted sense amplifier bit line BLSAB continues to be the voltage VARY.

At a timing TR6, the sub-word driver SWD pulls down the word line voltage to the word line precharge voltage VWLP from the word line read voltage VWLR. In the case where the memory cell has maintained a high level, the voltage of the bit line BL is gradually decreasing, but the memory element (thyristor) is still conductive and the PNP transistor Q2 is turned on. Therefore, the FB node voltage remains equal to or greater than the built-in potential voltage VBI. Conversely, in the case where the memory cell has maintained a low level, since the memory element (thyristor) is not operating, the FB node voltage drops along with the decrease in the word line voltage through the capacitance of the capacitor of the memory cell.

At a timing TR7, the control signal BLDIS rises, fixing the voltage of the bit line BL to the low level (VSS). In the case where the memory cell has maintained a high level, the memory element (thyristor) goes into a non-conductive state and the FB node voltage drops to the built-in potential VBI. Conversely, in the case where the memory cell has maintained a low level, the FB node voltage does not change since the memory element maintains the non-conductive state.

At a timing TR8, the sub-word driver SWD pulls down the word line voltage to the word line standby voltage VWLS from the word line precharge voltage VWLP. Since the memory element (thyristor) is in the non-conductive state, the FB node voltage decreases through the capacitance of the cell capacitor. The FB node voltage drops to the voltage VH when write data to the memory cell is at a high level, and to the even lower voltage VL when the write data is at a low level. In other words, data in the memory cell before a read operation is maintained even after the read operation is performed.

(Summary of the Write and Read Operations)

Here, a summary description of the driving voltage of the word line will be given. The word line standby voltage VWLS of the word line in an unselected (standby) state is an operation reference voltage. The word line write voltage VWLW is higher than the word line standby voltage VWLS by ΔVW as shown in FIG. 7. Even in a case where the FB node voltage of the memory cell before a write operation is at the lowest level, ΔVW requires to be a voltage high enough to make the rise of the word line pull up the FB node voltage close to the voltage VBI, putting the memory element in a conductive state, when high-level data is written.

Further, a potential difference ΔVR (refer to FIG. 8) between the word line read voltage VWLR and the word line standby voltage VWLS is set to a level at which the FB node voltage reaches the voltage VBI thereby putting the memory element in a conductive state when the FB node voltage is at a high level and does not reach the voltage VBI thereby not putting the memory element in a conductive state when the FB node voltage is at a low level in a case where the bit line is set to the high level (VARY) and the word line is pulled up during a read operation.

Further, a potential difference ΔVP (refer to FIGS. 7 and 8) between the word line precharge voltage VWLP and the word line standby voltage VWLS serves as a noise margin and is able to make VH, which is the voltage at the FB node of the memory cell when the FB node maintains a high level, a sufficiently low voltage. If the voltage VH is sufficiently lower than the voltage VBI, a defect such as the memory element accidentally operating when the bit line is selected and the word line is unselected can be avoided.

Further, in the description of the first exemplary embodiment, a form in which the cathode is directly connected to the power supply VSS as shown in FIG. 4 is described as a preferred exemplary embodiment, however, the cathode may be connected to the power supply VSS via a switch.

Second Exemplary Embodiment

Figure 9:
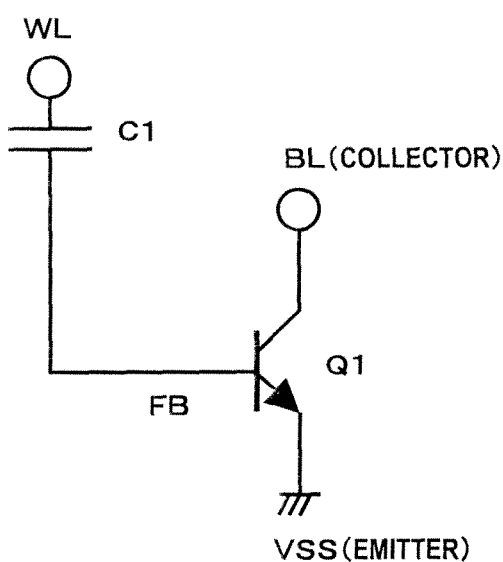
FIG. 9 is a circuit diagram of a memory cell (FBC memory) according to a second exemplary embodiment.

FIG. 9 is a circuit diagram of a memory cell (FBC memory) 66A according to a second exemplary embodiment. In the first exemplary embodiment, the memory element is a thyristor, but the memory element of the second exemplary embodiment is a bipolar transistor. However, it is not necessary to change the basic write/read operation waveforms and circuit configuration of the first exemplary embodiment except for the fact that the structure of the memory element and the operation principle are slightly different. Below, only what is different from the first exemplary embodiment will be explained. In comparison with FIG. 4 of the first exemplary embodiment, the bit line BL is connected to the collector of the NPN transistor Q1 in FIG. 9 of the second exemplary embodiment, whereas the bit line BL is connected to the anode of the thyristor in the first exemplary embodiment. Further, the emitter is connected to the power supply node VSS and the base is connected to a counter electrode of the word line of the capacitor C1.

FIG. 10 is an A-A cross section of a memory cell region according to the second exemplary embodiment. As for the position of the cross section, it is a cross section of A-A in FIG. 5 viewed from the direction of the arrow as the cross section in FIG. 1 of the first exemplary embodiment. With reference to FIG. 10, the P-type anode 9 of the first exemplary embodiment is not formed in the second exemplary embodiment, and the N-type diffusion layer 8 is directly connected to the bit line contact 11. In the second exemplary embodiment, the N-type diffusion layer 8 is a region serving as the collector of the NPN transistor. Other configurations are the same as in the first exemplary embodiment shown in FIG. 1.

(Principle of Operation of the FBC Memory Cell)

With reference to the circuit diagram in FIG. 9, a summary of the principle of operation of the memory cell (FBC memory) according to the second exemplary embodiment will be given. In a case where the FB node voltage is raised from a low voltage through the capacitance of the cell capacitor, when a voltage across the FB node (P-type region) and the emitter VSS (N-type region) reaches near the voltage of the built-in potential VBI of the PN junction thereof, a diode forward current starts to flow from the FB node to the cathode VSS. This current is equal to the base-emitter current of the NPN bipolar transistor Q1.

In a case where the bit line BL (collector) is at a sufficiently high voltage, when the FB node voltage is raised through the capacitance of the cell capacitor and the voltage reaches near the voltage VBI, the NPN bipolar transistor Q1 weakly turns on and a small current flows from the bit line BL (collector) to the emitter VSS. Since carriers in the collector current of the NPN bipolar transistor are electrons, a small amount of current flows from the emitter to the collector. Because the electrons injected in the collector have a high energy, pairs of holes and electrons are generated in the N-type region of the collector due to impact ionization. The holes generated by impact ionization are drawn to the FB node (P-type region) having a voltage lower than the collector, flow into the FB node, and pull up the FB node to a higher voltage. As a result, the NPN bipolar transistor Q1 strongly turns on, even more current flows from the bit line BL (collector) to the emitter VSS, and BL (the collector) and VSS (the emitter) of the FBC memory cell become conductive.

Once the FBC memory cell becomes conductive, as long as a sufficiently high voltage providing a high impact ionization rate is applied to the bit line BL (collector), the conductive state is maintained even if a coupling voltage is applied to the FB node through the capacitance of the cell capacitor.

The FBC memory cell is made non-conductive by decreasing the potential difference between BL (the collector) and VSS (the emitter) to an extent where the impact ionization rate becomes sufficiently small. When the bit line BL is decreased to a voltage providing a small impact ionization rate, the FB node drops to a voltage not greater than the voltage VBI due to the leakage current of the PN junction.

Since the NPN bipolar transistor Q1 turns off as a result, BL (the collector) and VSS (the emitter) of the FBC memory cell become non-conductive.

When the bit line BL (collector) is at a sufficiently low voltage not greater than the voltage providing a small impact ionization rate, the NPN bipolar transistor Q1 will remain off even if the voltage at the FB node is raised, and therefore, BL (the collector) and VSS (the emitter) of the FBC memory cell never become conductive.

Further, in the read/write waveform diagrams in FIGS. 7 and 8, the high level driving voltage VARY of the bit line is preferred to be approximately 1V in the first exemplary embodiment in which a thyristor is used as the memory element, but it is preferred to be 2V or more in the second exemplary embodiment in which a bipolar transistor is used as the memory element. Regarding the other parts of the description of the first exemplary embodiment, if one replaces the term "thyristor" with "bipolar transistor" in the parts where the memory element is described, the description of the first exemplary embodiment can be used as that of the second exemplary embodiment.

Third Exemplary Embodiment

Figure 11:
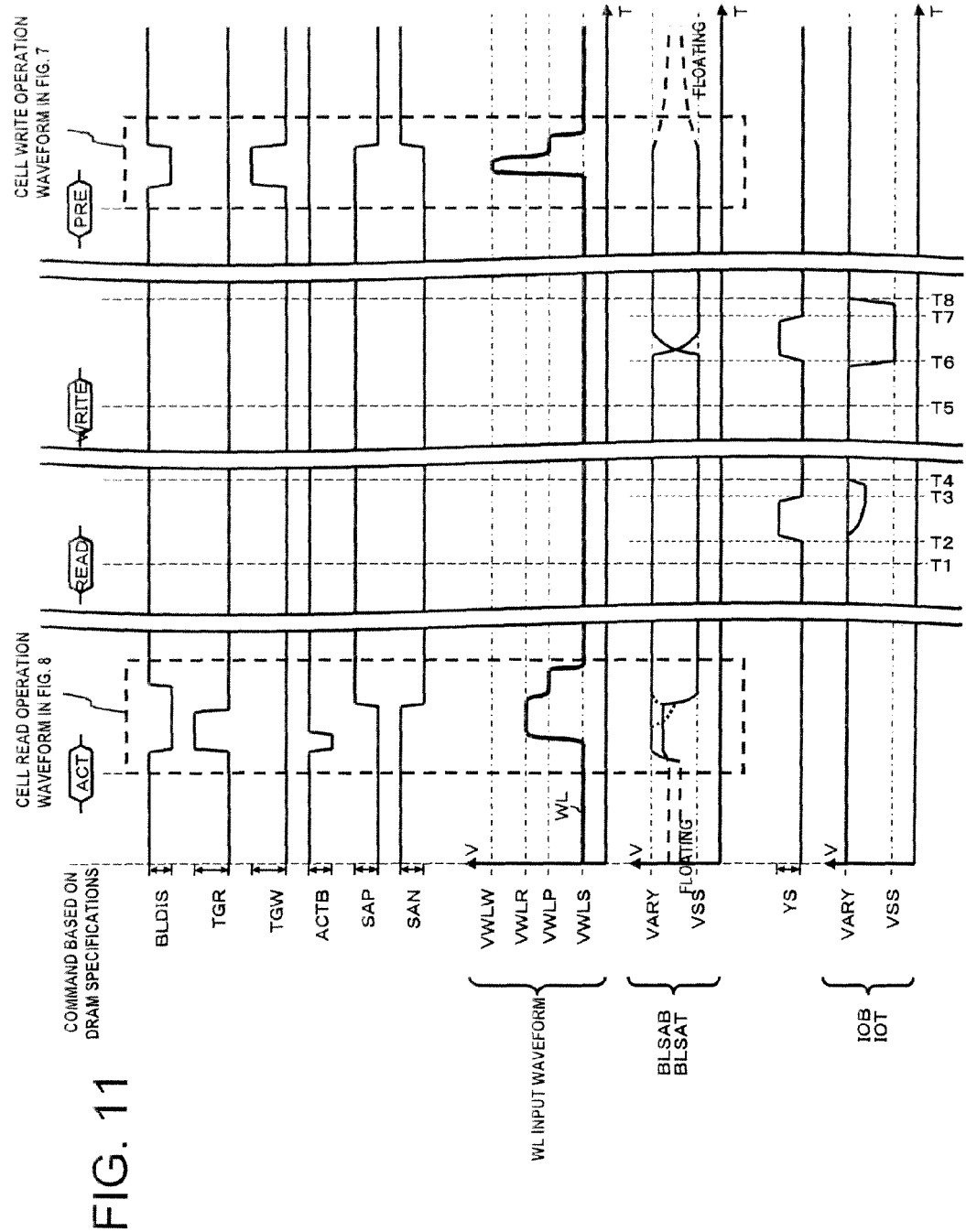
FIG. 11 is an operation waveform diagram in a case where the compatibility with the DRAM specifications is provided according to a third exemplary embodiment.

In a third exemplary embodiment, the specifications of the semiconductor devices of the first and the second exemplary embodiments when viewed from the outside are those of semiconductor memory devices compatible with a DRAM. FIG. 11 is an operation waveform diagram in the case where the compatibility with the DRAM specifications is provided according to the third exemplary embodiment. When an ACT command is supplied from the outside, the word line WL is selected in response to a specified row address and the ACT command, and the processing described using FIG. 8, in which data is read from the memory cell to the sense amplifier SA, is performed. Next, when a READ command is given, based on a specified column address, the data read to the sense amplifier SA is outputted externally via the I/O line.

Further, when a WRITE command is supplied from the outside, data is written to the flip-flop F. F. of the sense amplifier SA at this stage, but not to the memory cell. Next, when a precharge command PRE is given, the write data stored in the flip-flop F. F. of the sense amplifier SA is actually written to the memory cell. The write operation waveform is as described using FIG. 7.

Fourth Exemplary Embodiment

Figure 12:
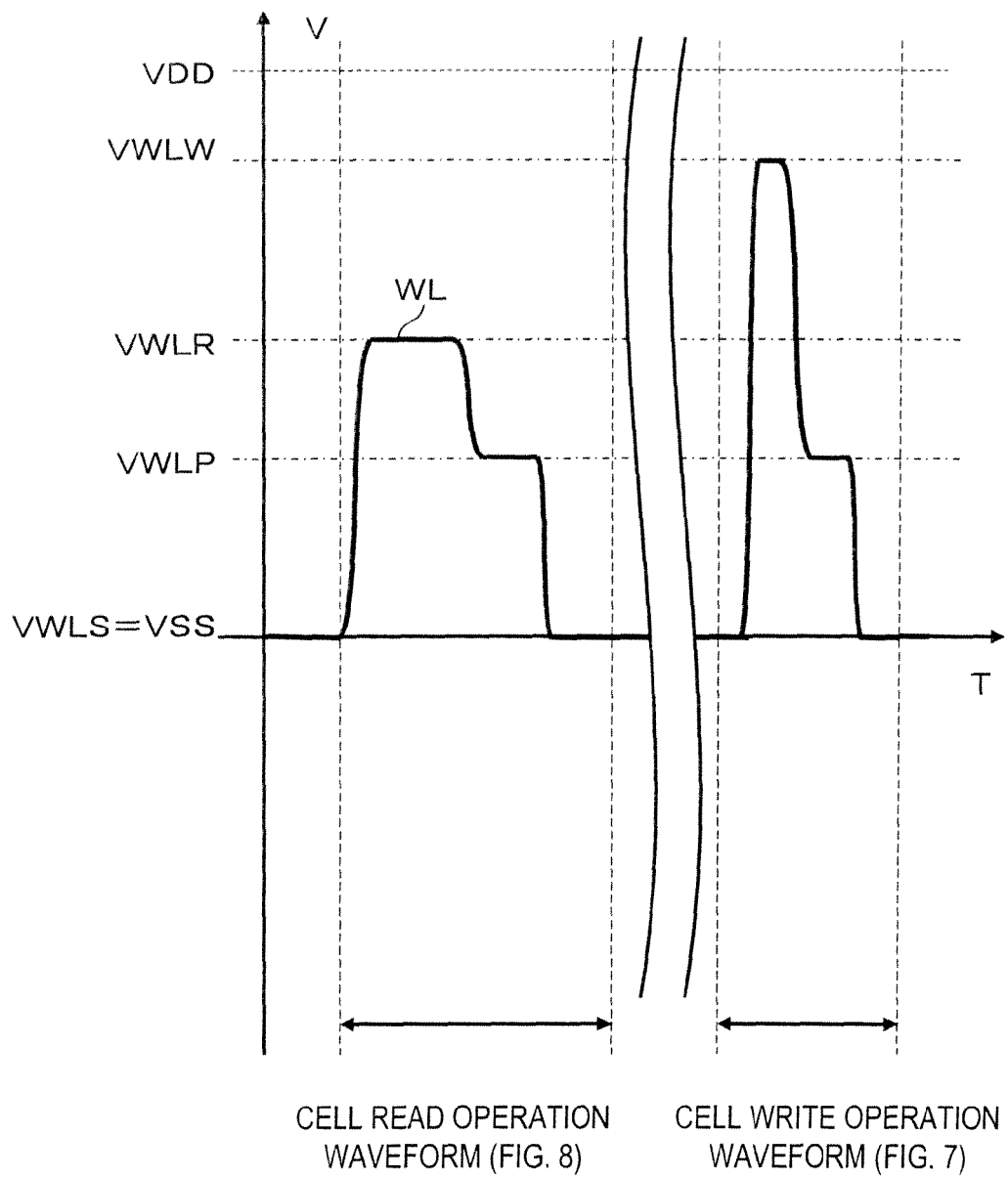
FIG. 12 is an operation waveform diagram of a word line according to a fourth exemplary embodiment (a word line standby voltage is equal to that of an external power supply).

In a fourth exemplary embodiment, the driving voltage of the word line is limited within a range between VDD and VSS, which are power supply voltages supplied from the outside. FIG. 12 is an operation waveform diagram of the word line according to the fourth exemplary embodiment. As shown in FIG. 12, in the fourth exemplary embodiment, the word line standby voltage VWLS during an unselected (standby) state is equal to the power supply voltage VSS, and the word line write voltage VWLW, the highest word line driving voltage, is equal to or less than VDD. In the conventional floating body memories described in Patent Documents 1 and 2, a negative voltage not greater than the voltage VSS must be applied to the word line so that the MOS transistor used as a trigger element in the memory cell reliably maintains an off state when the word line is unselected or read. In order for a semiconductor device to generate a voltage outside the range of the power supply supplied externally, i.e., the voltage range between VSS and VDD, a booster circuit and step-down circuit such as a charge pump circuit must be used.

Further, the P-type semiconductor substrate 1 shown in FIGS. 1 and 10 normally supplies the VSS voltage. When the word line standby voltage VWLS is set to a voltage not greater than VSS, a back bias (P-type) of an N-type transistor in a word line driving circuit that drives the word line WL or in the sub-word driver SWD (refer to FIG. 3) must be a voltage equal to the word line standby voltage VWLS lower than VSS or lower. Therefore, the back bias of the NMOS in the word line driving circuit must be electrically isolated from the P-type semiconductor substrate 1 of the memory cell section, as a P-well surrounded by a Deep N-well. As a result, the following problems arise. The layout area of the word line driving circuit will increase and so will process steps for forming the Deep N-well, due to the so-called well separation between the P-type semiconductor substrate 1 and the P-well in the Deep N-well. Therefore, the power supply voltage used for the array such as the word line WL is preferred to be a voltage within the voltage range between VDD and VSS.

Meanwhile, since the word line WL and the FB node are simply capacitively coupled in the present exemplary embodiment, the absolute value of the word line voltage can be freely selected. In other words, if a predetermined potential change amount can be applied to the FB node at each operation, the absolute value of the voltage on the word line side and the absolute value of the voltage on the FB node side can be shifted. This is why the range of the voltage that the word line can accept is limited within the range between the power supply voltages VDD and VSS supplied externally so that the word line driving voltage can be generated without using a charge pump circuit in the fourth exemplary embodiment.

Fifth Exemplary Embodiment

Figure 13:
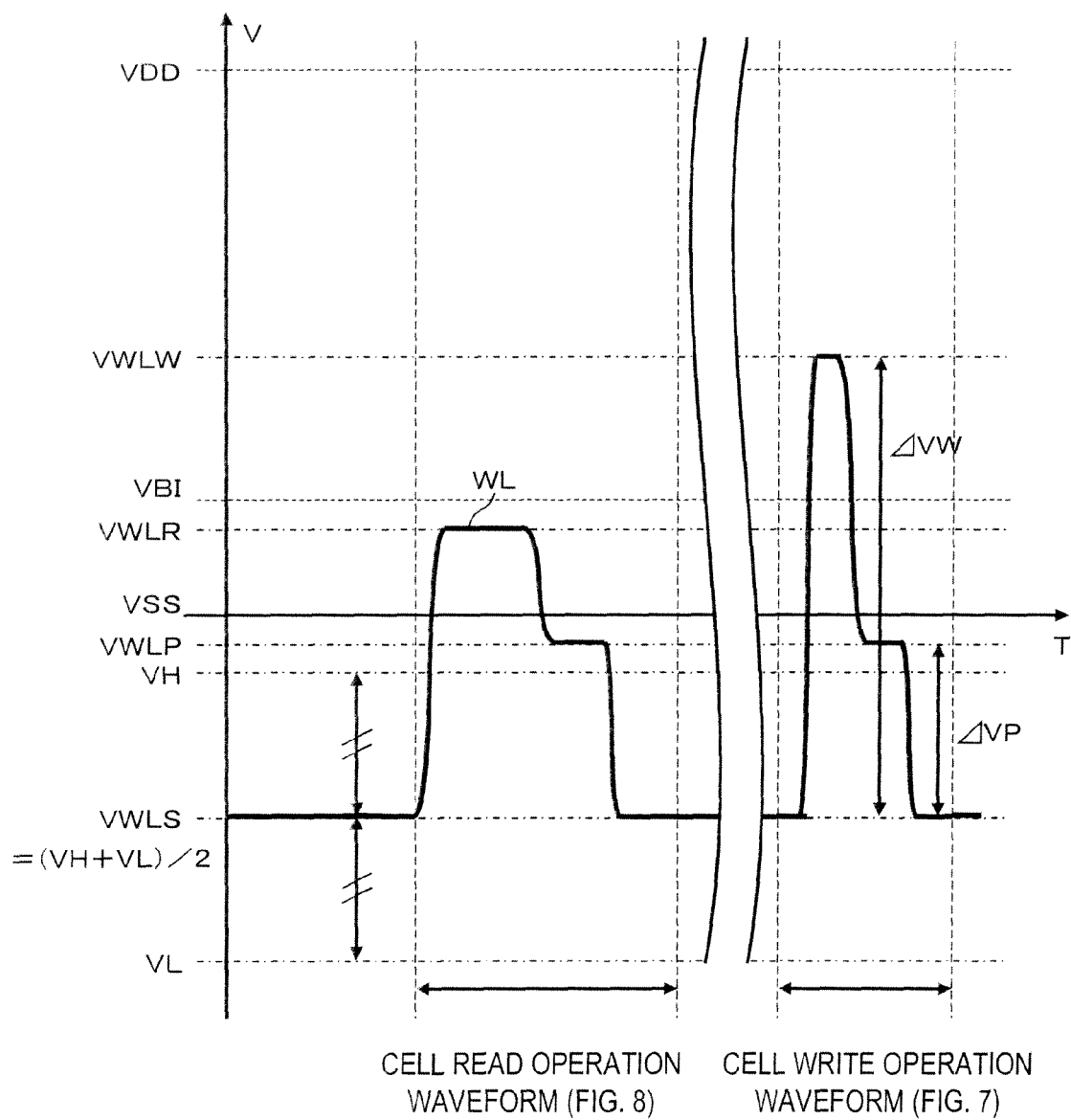
FIG. 13 is an operation waveform diagram of a word line according to a fifth exemplary embodiment (the word line standby voltage is a just intermediate voltage between voltages after high-level and low-level data are written to a counter electrode of a cell capacitor).

FIG. 13 is an operation waveform diagram of the word line according to a fifth exemplary embodiment. In the fifth exemplary embodiment, the word line standby voltage VWLS is set to an intermediate voltage between the FB node voltage VH immediately after high-level data is written and the FB voltage VL immediately after low-level data is written. In other words, the word line standby voltage VWLS is set to a voltage according to the following formula. VWLS=(VH+VL)/2.

A capacitor film for increasing the capacitance value by reducing the layout area of a capacitor must be formed thin using a high dielectric material. At this time, in order to prevent a capacitor film leakage current by securing TDDB (Time Dependent Dielectric Breakdown) resistance, it is preferable that the potential difference between the word line WL and the FB node should be as small as possible, decreasing the voltage applied to the capacitor. From this point of view, in the fifth exemplary embodiment, the word line standby voltage VWLS is set so that the voltage applied across the electrodes of the cell capacitor is the smallest.

Here, the relations among the voltage VBI, the FB node voltages VH and VL immediately after a write operation, and the word line voltage are summarized using formulas. When high-level data is written to the memory cell, Formula 1 holds since the FB node voltage change before and after the timing TW5 in FIG. 7 is approximately equal to the voltage change of the word line.

$$VH \cong VBI - \Delta VP \quad \text{(Formula 1)}$$

Further, when low-level data is written to the memory cell, Formula 2 holds since the FB node voltage change before the timing TW3 and after the timing TW5 in FIG. 7 is approximately equal to the voltage change of the word line.

$$VL \cong VBI - \Delta VW \quad \text{(Formula 2)}$$

From Formulas 1 and 2, a preferred word line standby voltage VWLS can be set using Formula 3.

$$VWLS = (VH + VL)/2 \quad \text{Formula 3}$$
$$= VBI - \{+0.5 \times (\Delta VP + \Delta VW)\}$$

In Formula 3, the built-in potential VBI is the PN junction voltage, and both ΔVP and ΔVW are design values. Therefore, the word line standby voltage VWLS can be generated using a relatively simple circuit. Further, the built-in potential VBI is known to exhibit a negative temperature characteristic. Therefore, from Formulas 1 and 2, both VH and VL have a temperature characteristic. By generating the word line standby voltage VWLS in such a manner that Formula 3 is satisfied, the temperature characteristics of VH and VL can be compensated.

Similarly, the word line write voltage VWLW can be expressed by Formulas 4-1 and 4-2.

$$VWLW = VWLS + \Delta VW \quad \text{(Formula 4-1)}$$
$$= VBI + (-0.5 \times \Delta VP + 0.5 \times \Delta VW) \quad \text{(Formula 4-2)}$$

The word line read voltage VWLR can be expressed by Formulas 5-1 and 5-2.

$$VWLR = VWLS + \Delta VR \quad \text{(Formula 5-1)}$$
$$= VBI + (-0.5 \times \Delta VP - 0.5 \times \Delta VW + \Delta VR) \quad \text{(Formula 5-2)}$$

The word line precharge voltage VWLP can be expressed by Formulas 6-1 and 6-2.

$$VWLP = VWLS + \Delta VP \quad \text{(Formula 6-1)}$$
$$= VBI + (+0.5 \times \Delta VP - 0.5 \times \Delta VW) \quad \text{(Formula 6-2)}$$

In other words, the word line standby voltage VWLS, the word line write voltage VWLW, the word line read voltage VWLR, and the word line precharge voltage VWLP can be set to optimum voltages based on the formulas above. As a circuit that realizes the above formulas, a known voltage summing circuit can be used.

Sixth Exemplary Embodiment

Figure 14:
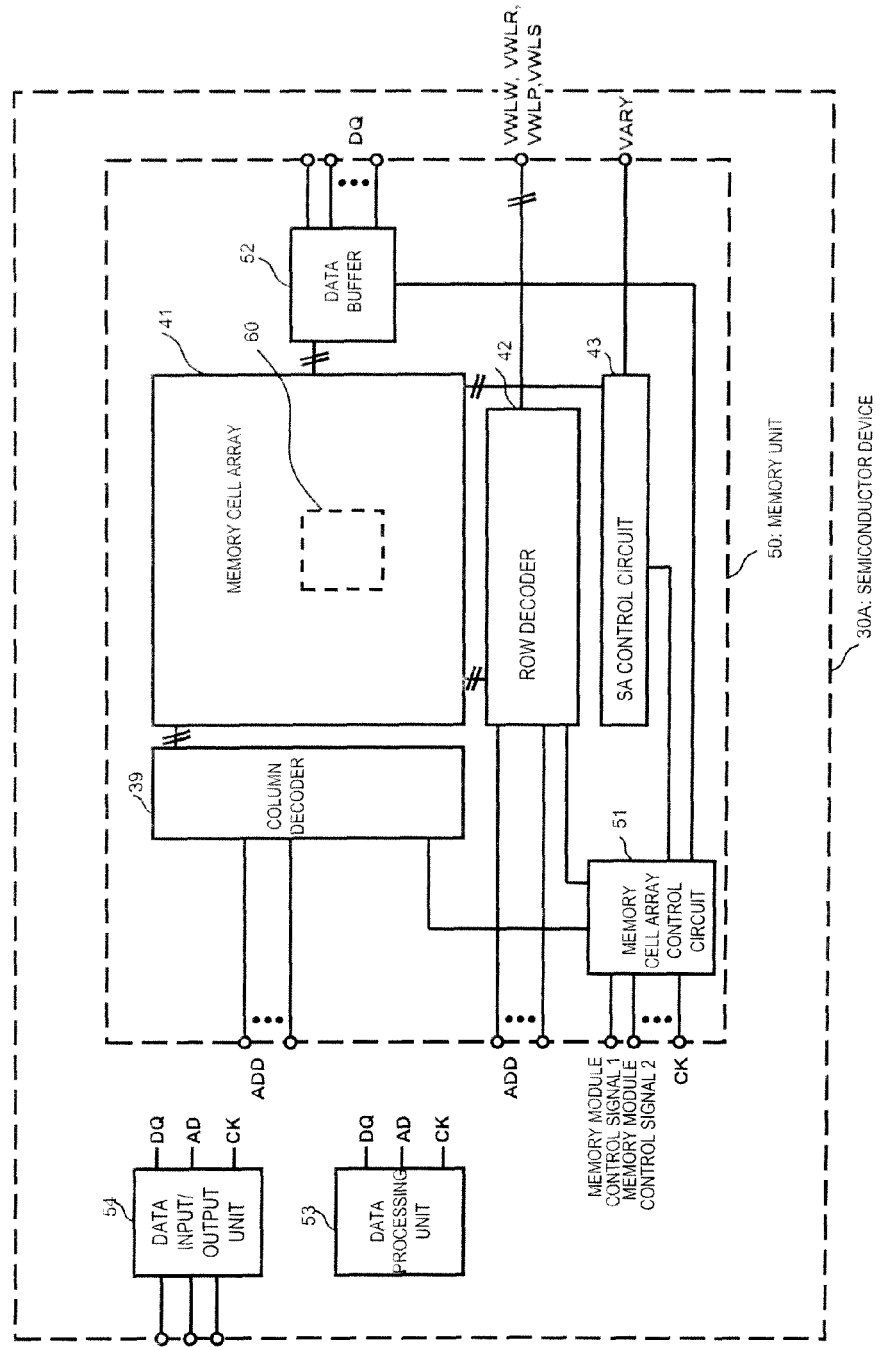
FIG. 14 is a block diagram of an entire semiconductor device according to a sixth exemplary embodiment.

FIG. 14 is a block diagram of an entire semiconductor device according to a sixth exemplary embodiment. In the sixth exemplary embodiment, the memory cell array 41 according to the first to the fifth exemplary embodiments is built into a memory unit 50, a part of a system LSI. In FIG. 14, the same symbols are given to parts same as those in the block diagram of the entire semiconductor device according to the first exemplary embodiment shown in FIG. 2, and duplicate descriptions will be omitted.

In addition to the memory unit 50, the semiconductor device 30A shown in FIG. 14 includes a data processing unit 53 that processes data based on information stored in the memory unit 50 and that comprises the memory unit 50 store the result of the data processing, and a data input/output unit 54 that performs input/output of data between the semiconductor device 30A and an external device. The memory unit 50, the data processing unit 53, and the data input/output unit 54 are connected by a data input/output bus DQ and an address bus AD. Further, since these are operated synchronously, the clock signal CK is connected in common.

The memory unit 50 performs input/output of write/read data from/to the data input/output bus DQ based on a column address and row address supplied by the address bus AD, the clock signal CK, and memory module control signals 1 and 2. Further, a voltage necessary to drive the word line and a voltage necessary to drive the sense amplifier are supplied to the row decoder 42 and the SA control circuit 43 from the outside of the memory unit 50. Moreover, a memory array control circuit 51 is provided as a circuit that controls the operation of the entire memory unit 50. Further, a data buffer 52 is provided in order to perform input/output of data while synchronizing the memory cell array 41 and the data input/output bus DQ.

Seventh Exemplary Embodiment

A seventh exemplary embodiment is an exemplary embodiment of a preferred manufacturing method for manufacturing the semiconductor device of the first exemplary embodiment. This exemplary embodiment will be sequentially described with reference to FIGS. 15 to 24.

Figure 15A:
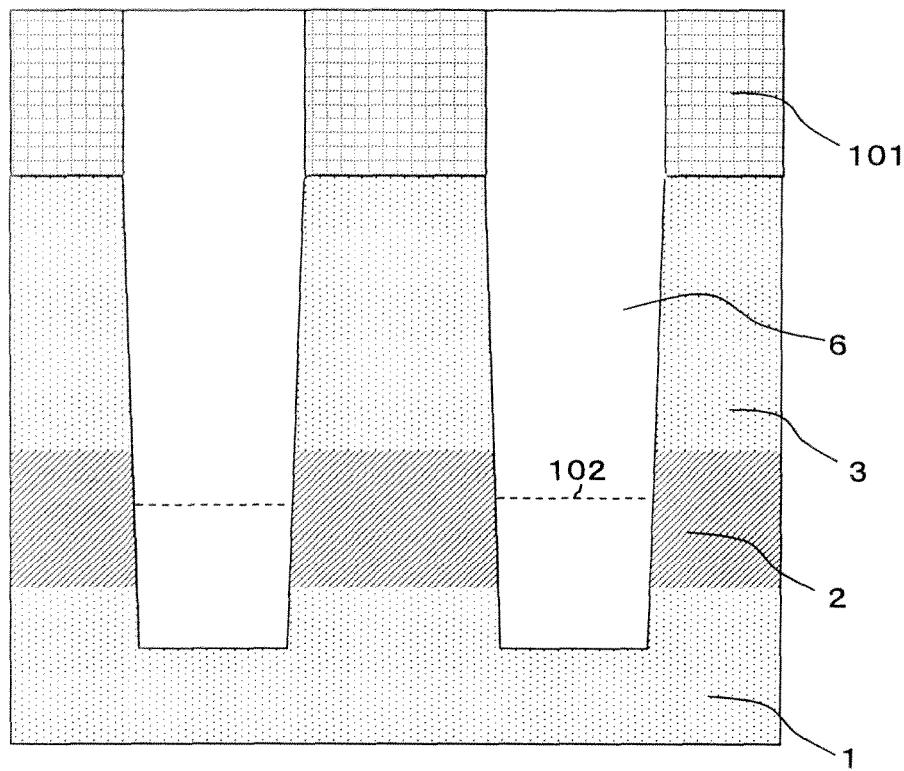
FIG. 15A is a B-B cross section and FIG. 15B is a plan in a manufacturing process in a semiconductor device manufacturing method according to a seventh exemplary embodiment.
Figure 15B:
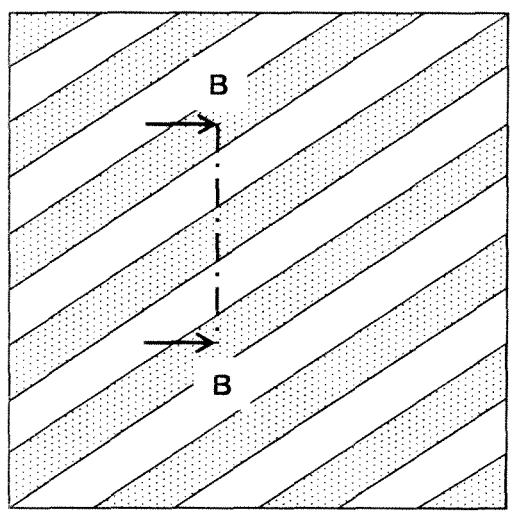

FIG. 15A is a cross-sectional view of a memory region in the middle of the manufacturing process, and FIG. 15B is a plan thereof. Further, the cross section shown in FIG. 15A is the B-B cross section shown in FIG. 15B when viewed from the direction of the arrows. The manufacturing process before FIGS. 15A and 15B will be described. The P-type diffusion layers 1 and 3 are formed by implanting impurities into the entire surfaces of at least regions that will become the memory cell regions 61 (refer to FIG. 3) on the semiconductor substrate. It is preferred that the semiconductor substrate be a silicon substrate. A nitride film 101 is formed on the semiconductor substrate in the L/S pattern shown in FIG. 15B. Next, the semiconductor substrate is etched to a height of 102 in FIG. 15A using the nitride film 101 as a mask. Then, after the N-type diffusion layer 2 is formed by ion implantation, the semiconductor substrate is further etched until the P-type diffusion layer 1 is reached. Then, the cross-section shown in FIG. 15A is achieved by embedding an oxide film 6 using a normal STI forming method.

Figure 16A:
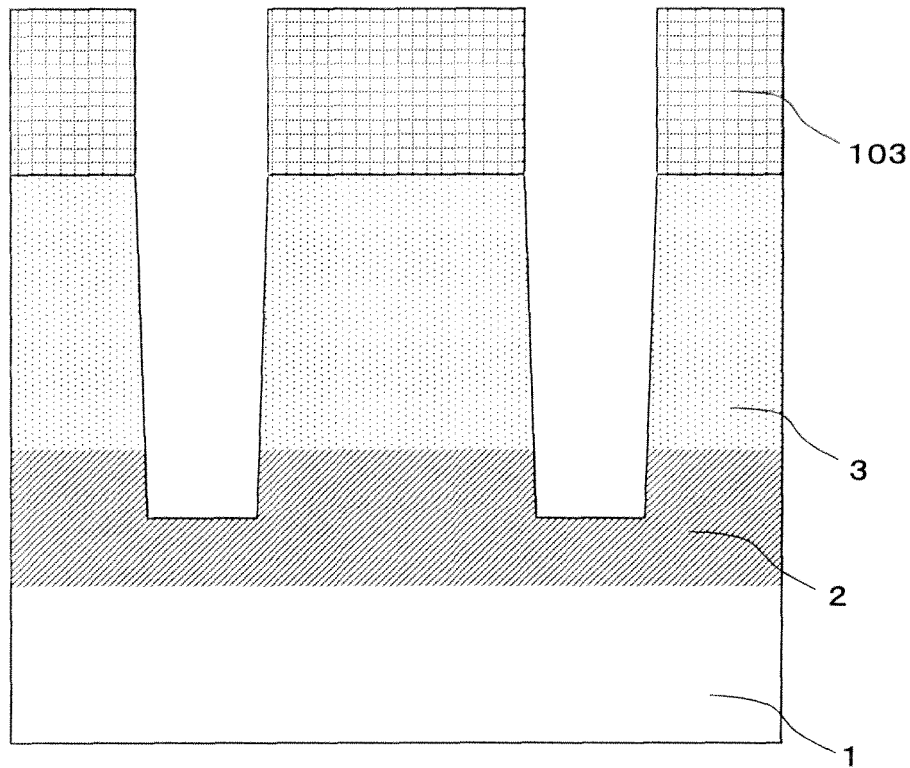
FIG. 16A is an A-A cross section and FIG. 16B is a plan in a manufacturing process after FIGS. 15A and 15B.
Figure 16B:
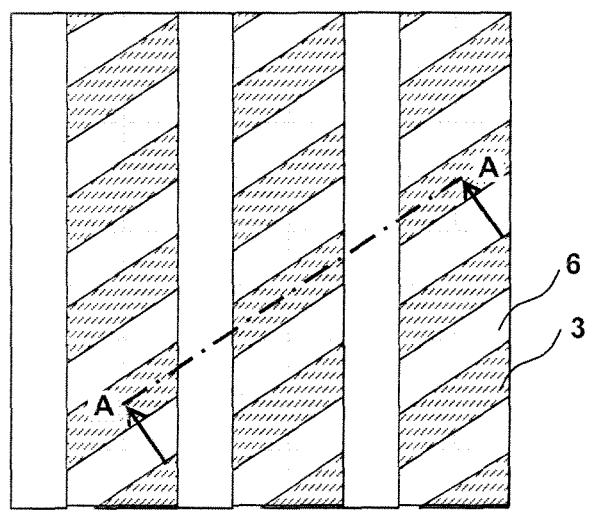

Next, after the nitride film 101 is removed, a nitride film 103 is formed again, and the semiconductor substrate is etched in the L/S pattern parallel to regions, shown in FIG. 16B, where the word lines WL will be formed later until the N-type diffusion layer 2 is reached. FIG. 16A shows a cross-sectional view in this state and FIG. 16B shows a plan thereof. FIG. 16A shows an A-A cross section viewed from the direction of the arrows in FIG. 16B.

Figure 17A:
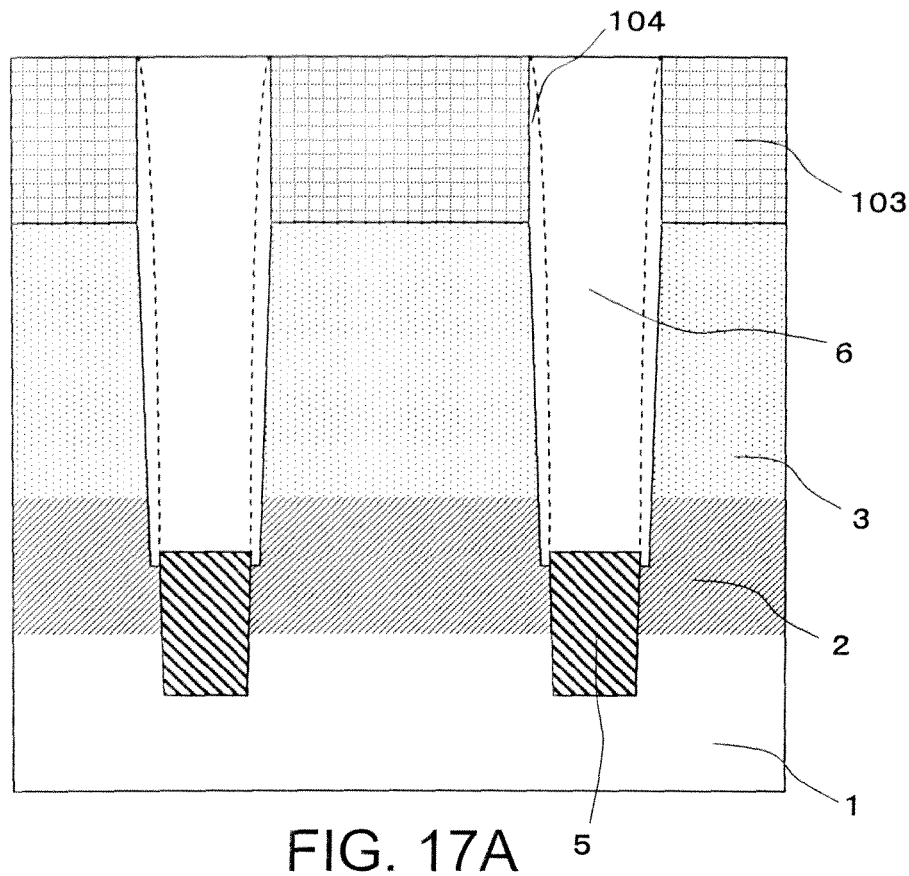
FIG. 17A is an A-A cross section and FIG. 17B is a plan in a manufacturing process after FIGS. 16A and 16B.
Figure 17B:
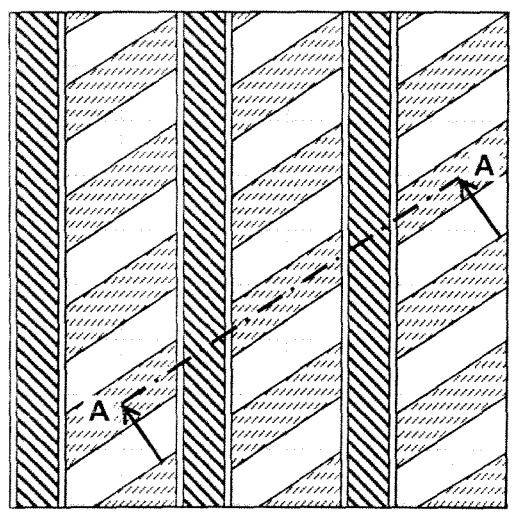

Next, an oxide film sidewall 104 is formed in an inner wall of the groove formed on the semiconductor substrate. Using the nitride film 103 and the oxide film sidewall 104 as masks, the semiconductor substrate is etched until the groove bottom reaches the P-type diffusion layer 1. After a film of a conformal metal such as W/TiN/Ti is formed, the embedded metal 5 is formed by etching back. Further, the STI 6 is formed by embedding an oxide film in the groove thereby planarizing the substrate. FIG. 17A shows a cross-sectional view in this state and FIG. 17B shows a plan thereof. FIG. 17A shows an A-A cross section viewed from the direction of the arrows in FIG. 17B.

Next, the nitride film 103 is selectively removed, and an oxide film sidewall 105 is formed on a sidewall of the STI 6.

Figure 18A:
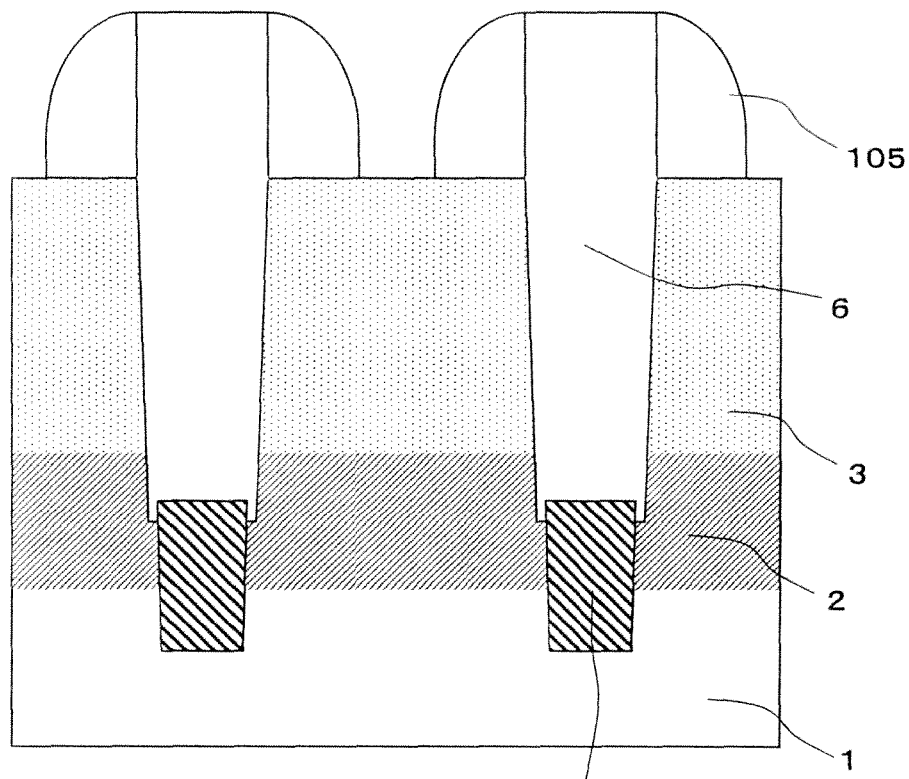
FIG. 18A is an A-A cross section and FIG. 18B is a plan in a manufacturing process after FIGS. 17A and 17B.
Figure 18B:
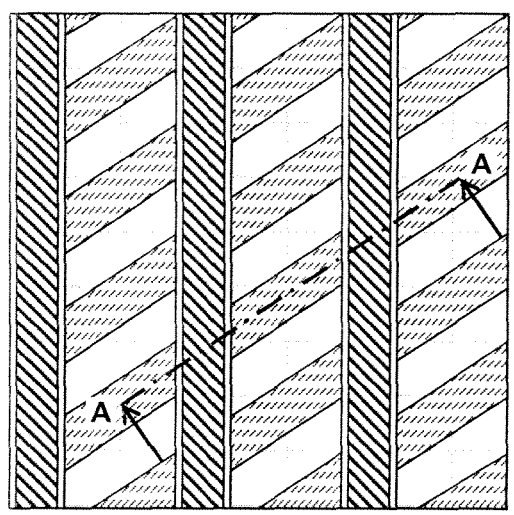

FIG. 18A shows a cross-sectional view in this state and FIG. 18B shows a plan thereof. FIG. 18A shows an A-A cross section viewed from the direction of the arrows in FIG. 18B.

Figure 19A:
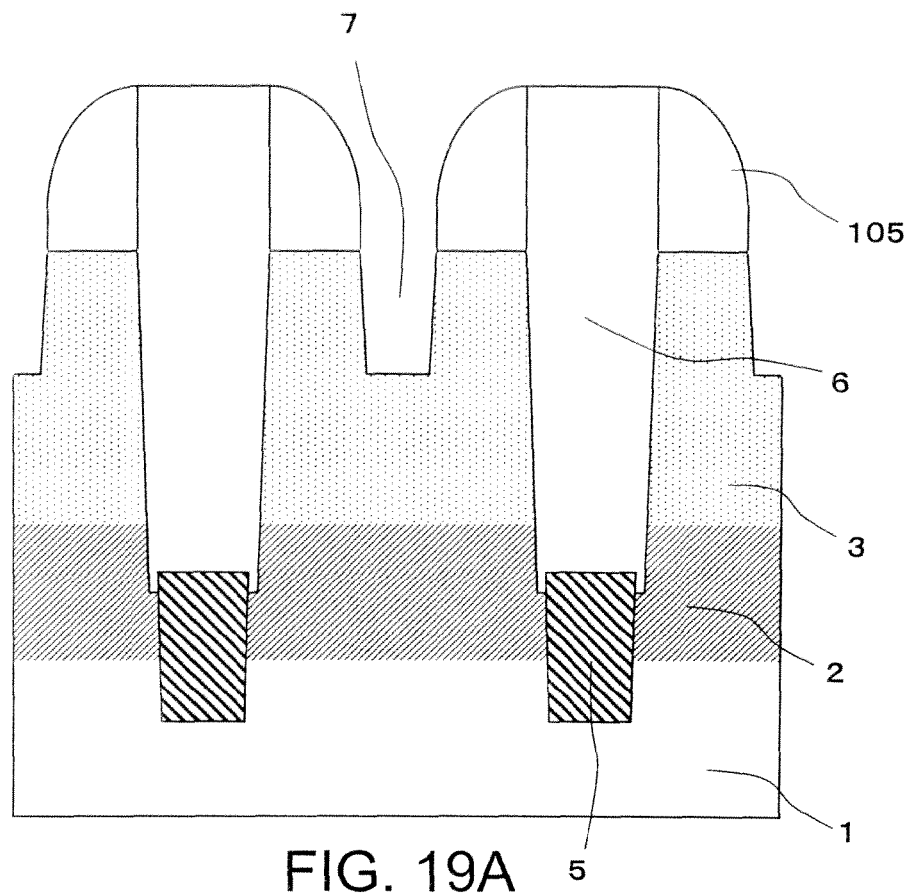
FIG. 19A is an A-A cross section and FIG. 19B is a plan in a manufacturing process after FIGS. 18A and 18B.
Figure 19B:
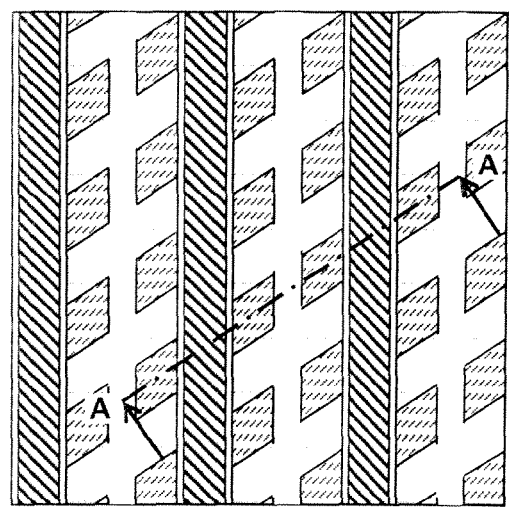

The recess 7 is formed by etching the semiconductor substrate using the oxide film sidewall 105 as a mask. FIG. 19A shows a cross-sectional view in this state and FIG. 19B shows a plan thereof. FIG. 19A shows an A-A cross section viewed from the direction of the arrows in FIG. 19B.

Figure 20A:
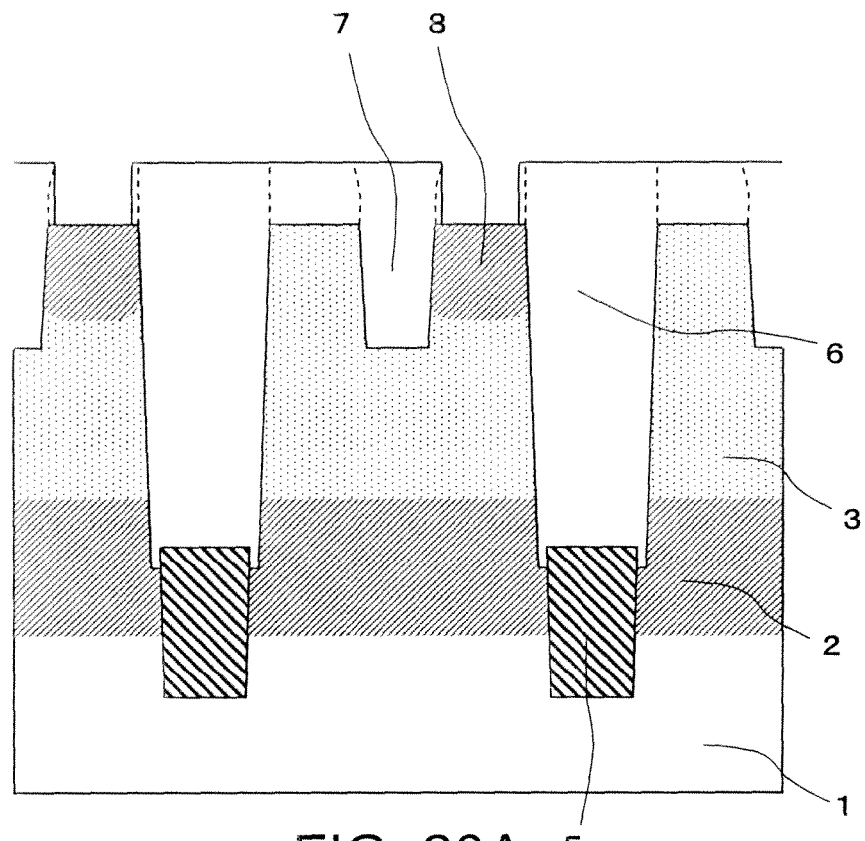
FIG. 20A is an A-A cross section and FIG. 20B is a plan in a manufacturing process after FIGS. 19A and 19B.
Figure 20B:
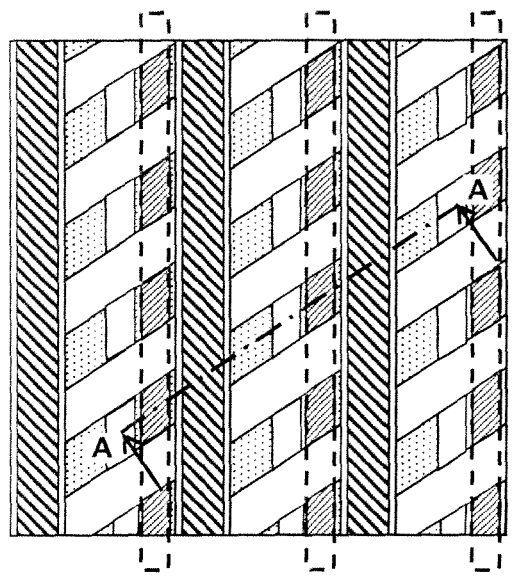

After an oxide film is embedded in the recess 7, the substrate is planarized using CMP. By forming mask patterns in the positions indicated by broken lines in FIG. 20B and etching the oxide film, an opening of the bit line contact is made. The N-type diffusion layer 8 is formed from the hit line contact opening by ion implantation. FIG. 20A shows a cross-sectional view in this state and FIG. 20B shows a plan thereof. FIG. 20A shows an A-A cross section viewed from the direction of the arrows in FIG. 20B.

Figure 21A:
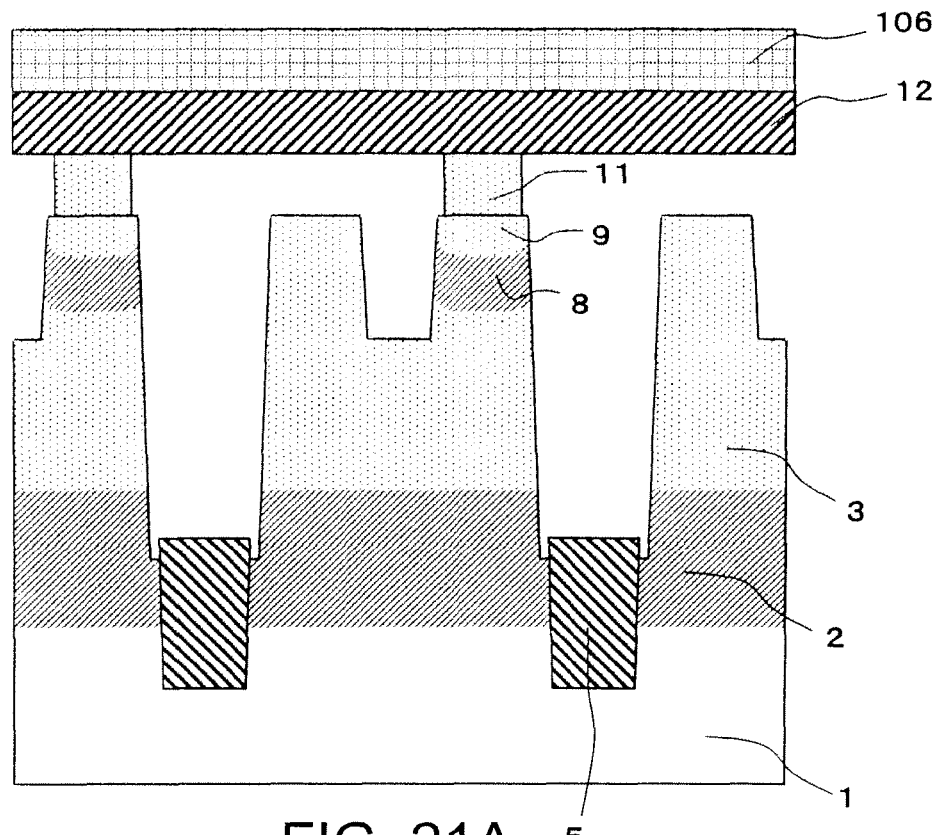
FIG. 21A is an A-A cross section and FIG. 21B is a plan in a manufacturing process after FIGS. 20A and 20B.
Figure 21B:
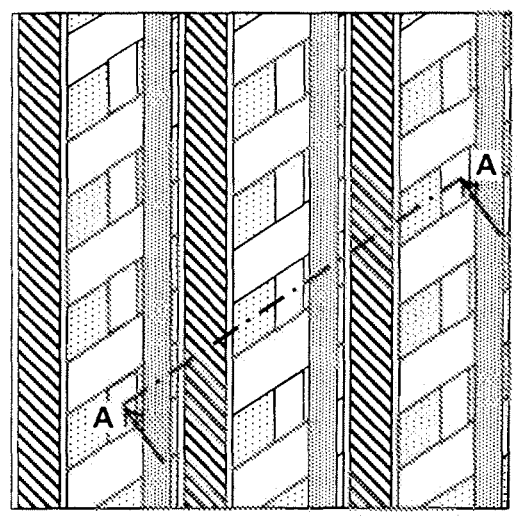

P-type polysilicon 11 is embedded into the bit line contact opening shown in FIG. 20A. A P-type diffusion layer 9 is formed on the surface of the N-type diffusion layer 8 by thermal diffusion of impurities from the P-type polysilicon 11. Next, a metal layer 12, which will become the bit line, is formed over the P-type polysilicon 11 and the entire surface of the oxide film. For the metal film 12, W/TiN/Ti may be used. A nitride film 106 is further formed over the metal film 12. FIG. 21A shows a cross-sectional view in this state and FIG. 21B shows a plan thereof. FIG. 21A shows an A-A cross section viewed from the direction of the arrows in FIG. 21B.

Figure 22A:
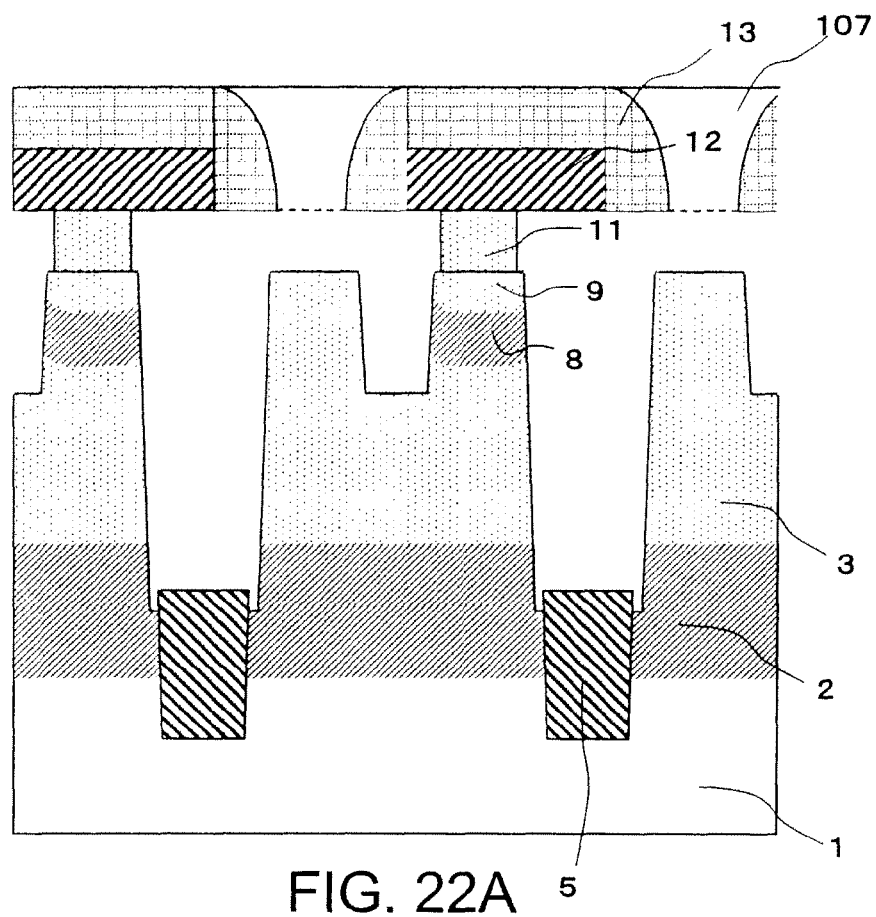
FIG. 22A is an A-A cross section and FIG. 22B is a plan in a manufacturing process after FIGS. 21A and 21B.
Figure 22B:
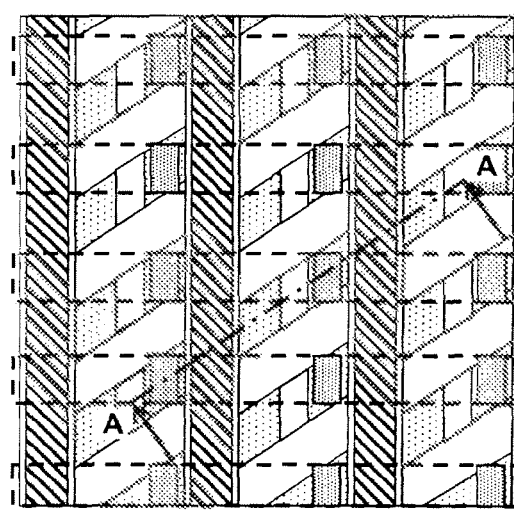

By forming mask patterns indicated by broken lines in FIG. 22B and etching the nitride film 106, the metal film layer 12, and the P-type polysilicon 11, the bit line 12 is formed. Next, a nitride film sidewall 13 is formed on the top and sides of the bit line 12. Further, an oxide 107 is embedded in a space between the bit lines. FIG. 22A shows a cross-sectional view in this state and FIG. 22B shows a plan thereof. FIG. 22A shows an A-A cross section viewed from the direction of the arrows in FIG. 22B.

Figure 23A:
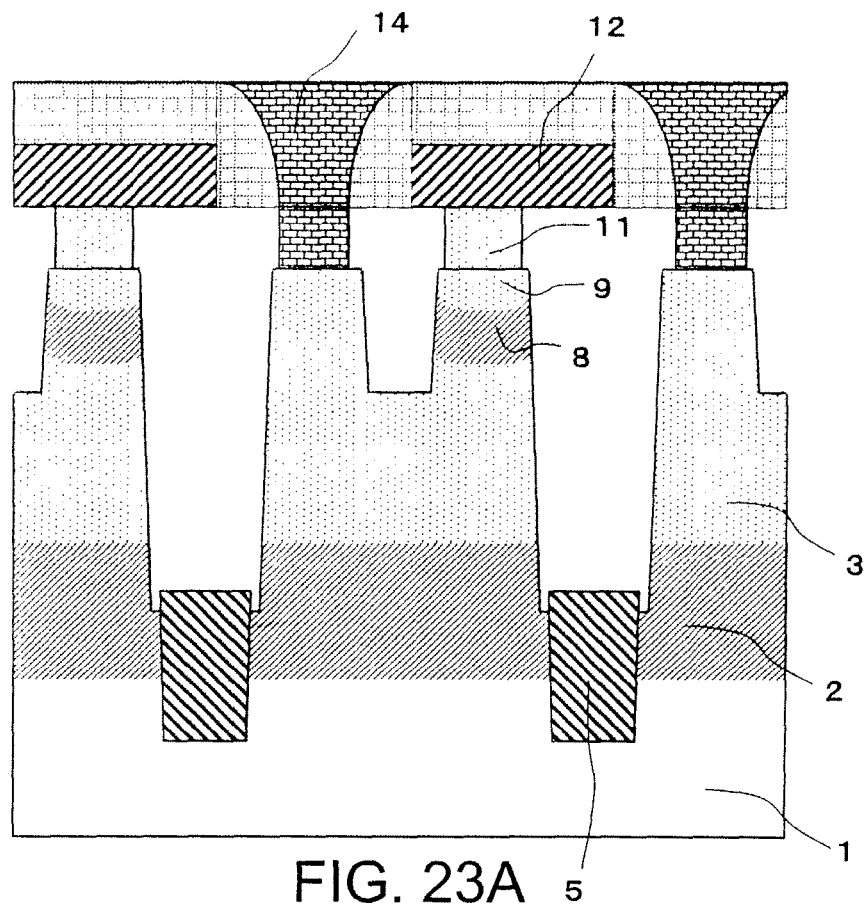
FIG. 23A is an A-A cross section and FIG. 23B is a plan in a manufacturing process after FIGS. 22A and 22B.
Figure 23B:
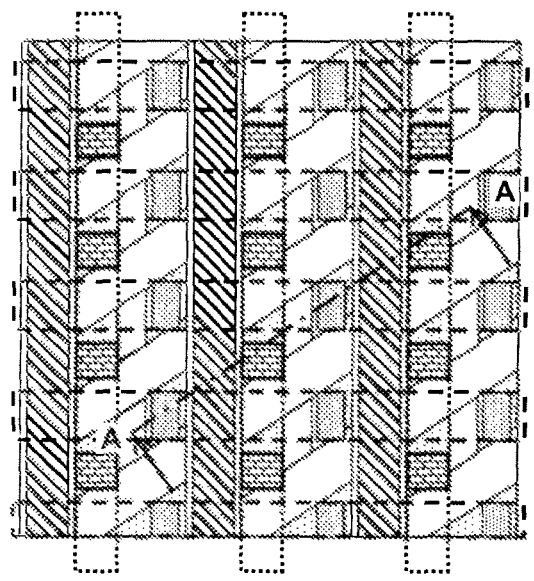

By forming mask patterns indicated by dotted lines (in the direction of the word line) in FIG. 23B and selectively etching the oxide film, a part where the capacitor contact will be formed is opened. The capacitor contact 14 is formed by embedding P-type polysilicon or a metal. FIG. 23A shows a cross-sectional view in this state and FIG. 23B shows a plan thereof. FIG. 23A shows an A-A cross section viewed from the direction of the arrows in FIG. 23B.

Figure 24A:
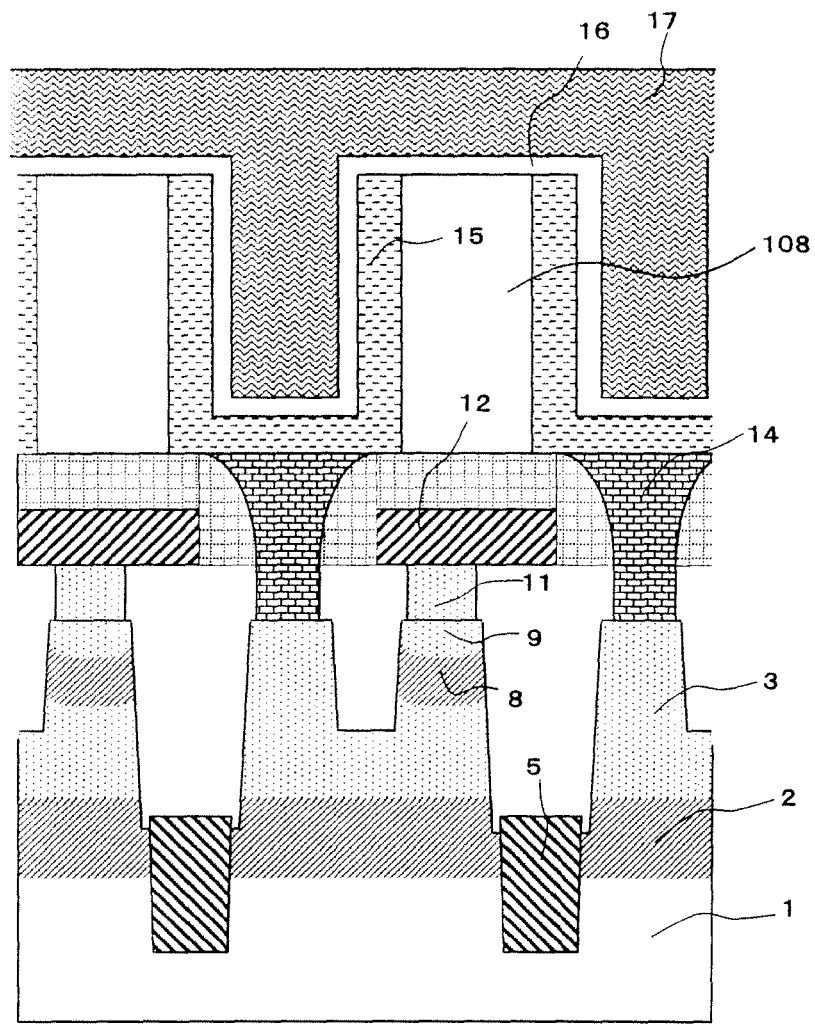
FIG. 24A is an A-A cross section and FIG. 24B is a plan in a manufacturing process after FIGS. 23A and 23B.
Figure 24B:
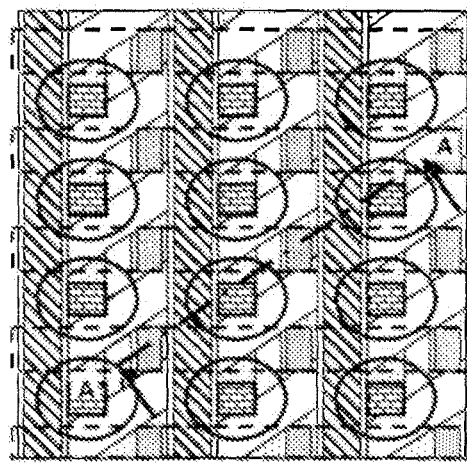

After an interlayer oxide film 108 is formed, mask patterns indicated by solid lines in FIG. 24B are formed, and a cylinder, which will become the capacitor, is opened. After the lower electrode 15 is formed with TiN on an inner wall of the cylinder, the capacitor film 16 is formed over the entire surface. A metal film 17, which will be an upper electrode of the capacitor and the word line WL, is formed over the capacitor film 16. FIG. 24A shows a cross-sectional view in this state and FIG. 24B shows a plan thereof. FIG. 24A shows an A-A cross section viewed from the direction of the arrows in FIG. 24B.

Then, forming the word line WL 17 completes the memory cell region of the semiconductor device of the first exemplary embodiment shown in the cross-sectional view in FIG. 1 and the plan in FIG. 5.

Variation of the Seventh Exemplary Embodiment

Further, the semiconductor device (having a bipolar transistor as the memory element) of the second exemplary embodiment whose cross section is shown in FIG. 10 can be manufactured by embedding a plug such as tungsten or N-type polysilicon into the bit line contact opening during the manufacturing process shown in FIG. 21 of the manufacturing method of the seventh exemplary embodiment so that the bit line is directly connected to the N-type diffusion layer 8 via the bit line contact 11, instead of embedding the P-type polysilicon into the bit line contact opening. The other manufacturing steps of the manufacturing process of the seventh exemplary embodiment can be applied as they are.

Eighth Exemplary Embodiment

Figure 25:
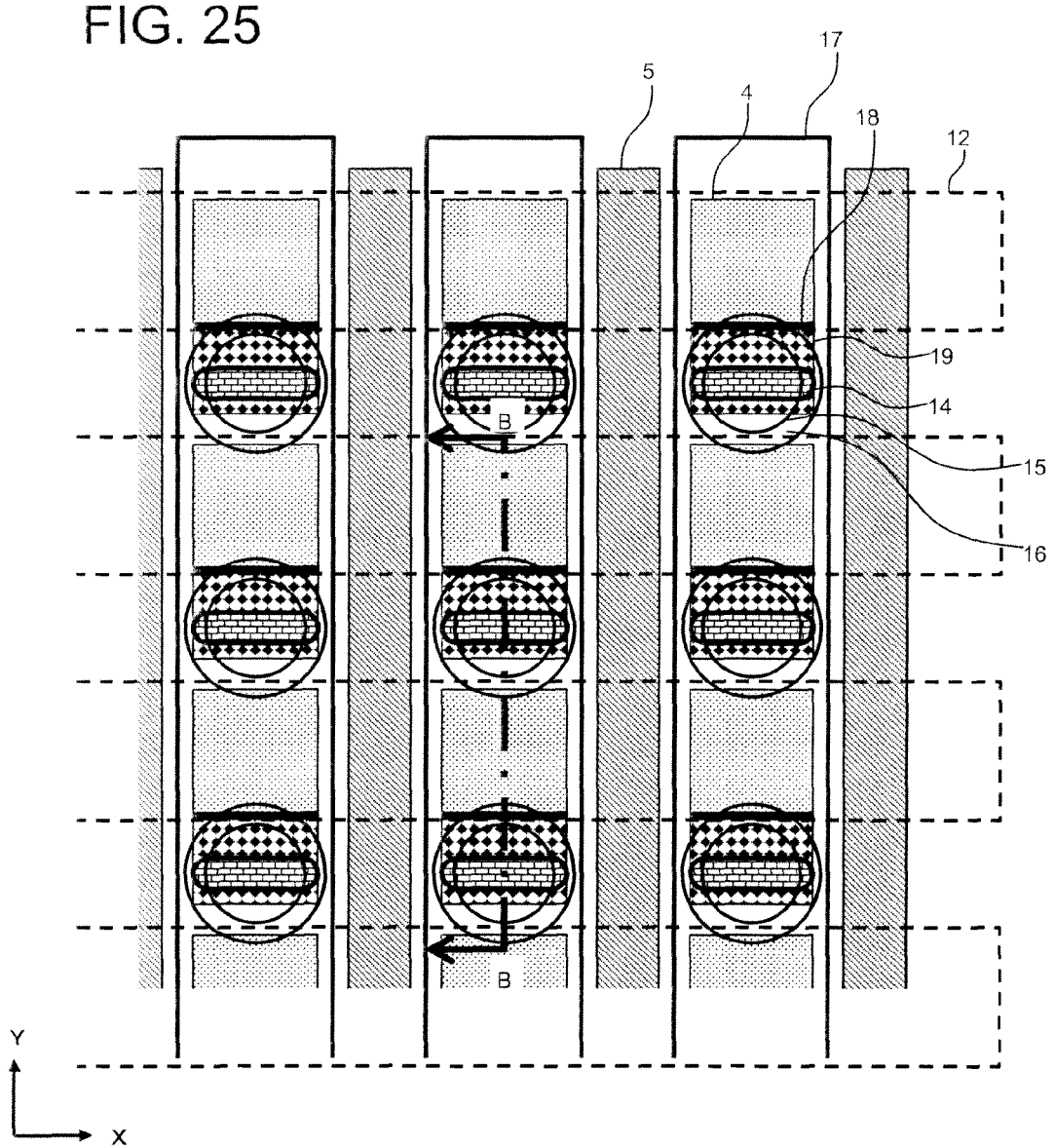
FIG. 25 is a plan of a memory cell region according to an eighth exemplary embodiment.

FIG. 25 is a plan of a memory cell region according to an eighth exemplary embodiment, and FIG. 26 is a B-B cross section thereof viewed from the direction of the arrows. The eighth exemplary embodiment is realized by modifying the device structure of the memory cell region of the semiconductor device of the first exemplary embodiment. Therefore, although the cross section and the plan of the memory cell region of the eighth exemplary embodiment are different from those (refer to FIGS. 1 and 5) of the first exemplary embodiment, the other circuit functions are the same as the semiconductor device of the first exemplary embodiment. In FIGS. 25 and 26, the same symbols are given to parts having the same functions as those in FIGS. 1 and 5, and duplicate descriptions will be partially omitted.

In the cross-sectional structure of the memory cell region in the first exemplary embodiment shown in FIG. 1, the capacitor contact 14 is separated from the N-type diffusion layer 8 and the P-type anode 9 using the recess 7 formed by self-aligning, however, the capacitor contact 14 is connected to the P-body 3 while being separated from the N-type diffusion layer 8 and the P-type anode 9 by embedding a conductor 19 into the STI 6 and providing a side contact 18 in the eighth exemplary embodiment.

In the cross-sectional view in FIG. 26, the N-type cathode 2, P-body 3, the N-type diffusion layer 8, and the P-type anode 9, which is a P-type diffusion layer, are laminated on a main surface of the P-type semiconductor substrate 1 in this order as the diffusion layer 4. On the main surface of the semiconductor substrate 1, the STIs 6 reaching the N-type cathodes 2 are provided at regular intervals. Each memory cell is partitioned by this STI 6. The conductor 19 made of, for instance, polysilicon is embedded in each STI 6, and each conductor 19 is connected to the P-body 3 of each memory cell by the side contact 18.

The bit line contact 11 is provided over the P-type anode 9, which is connected to the bit line 12 provided further up in the stack via the hit line contact 11. Sides and the top of the hit line 12 are covered by the nitride film sidewall 13. Further, the capacitor contact 14 is provided on the top of the conductor 19, which is connected to the lower electrode 15 of the capacitor provided further up in the stack than the bit line 12 via the capacitor contact 14. Further, the word line 17 is provided over the lower electrode 15 with the capacitor film 16 interposed therebetween as the uppermost wiring layer of the memory cell structure.

Further, although this is not shown in FIG. 26, the embedded metal 5 is embedded parallel to the word line WL 17, in contact with the N-type cathode 2 and the P-type semiconductor substrate 1 as shown in FIG. 25 (refer to FIG. 34 showing the middle of the manufacturing process for a cross-sectional structure). Further, the N-type cathode 2 is electrically connected through the embedded metals 5 and serves as a common power supply node for all the memory cells in the cell region.

Ninth Exemplary Embodiment

A ninth exemplary embodiment is an exemplary embodiment showing an example of a preferred manufacturing method for manufacturing the semiconductor device according to the eighth exemplary embodiment. FIGS. 27 to 39 are diagrams showing each manufacturing step in the middle of the manufacturing method of the ninth exemplary embodiment.

Figure 27A:
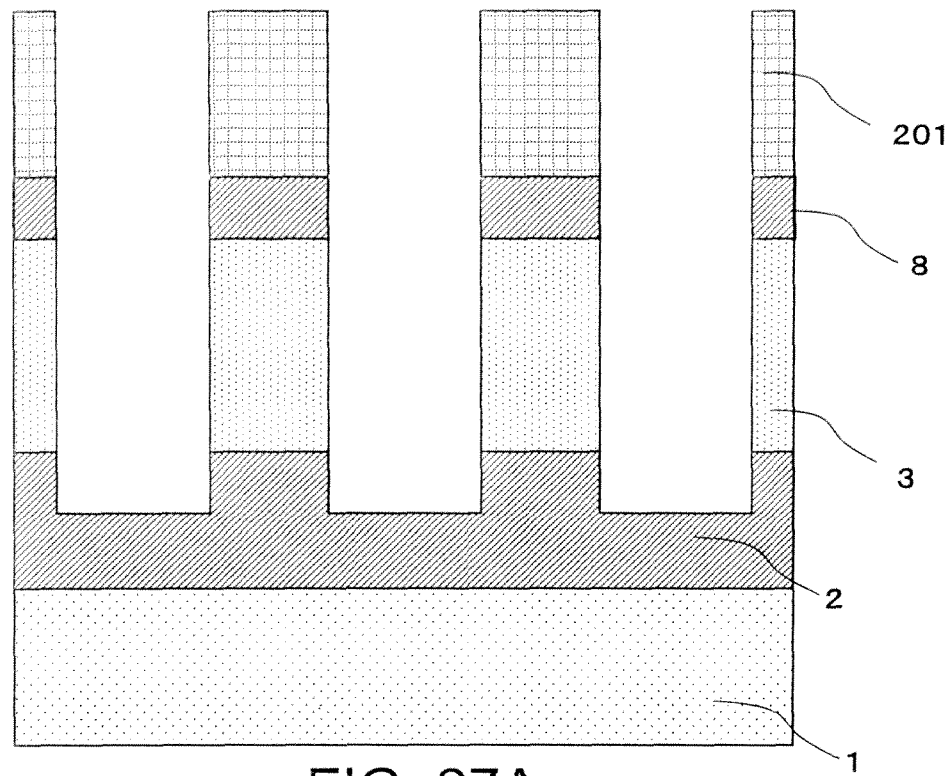
FIG. 27A is a B-B cross section and FIG. 27B is a plan in a manufacturing process in a semiconductor device manufacturing method according to a ninth exemplary embodiment.
Figure 27B:
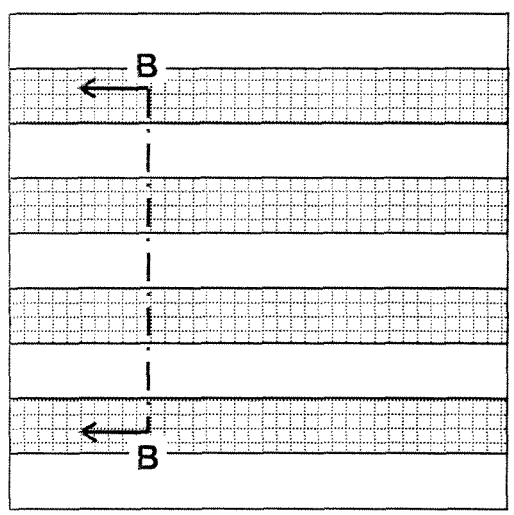

The P-type diffusion layers 1 and 3 and the N-type diffusion layer 8 are formed by implanting impurities into a semiconductor substrate (preferably a silicon substrate). After a nitride film 201 is formed on the semiconductor substrate, the nitride film 201 and the semiconductor substrate are etched in the L/S pattern shown in FIG. 27B, forming grooves on the semiconductor substrate. Further, by ion implantation, the N-type diffusion layer 2 is formed on the bottom of the groove. FIG. 27A shows a cross-sectional view in this state. FIG. 27A shows a B-B cross section viewed from the direction of the arrows shown in a plan in FIG. 27B.

Figure 28A:
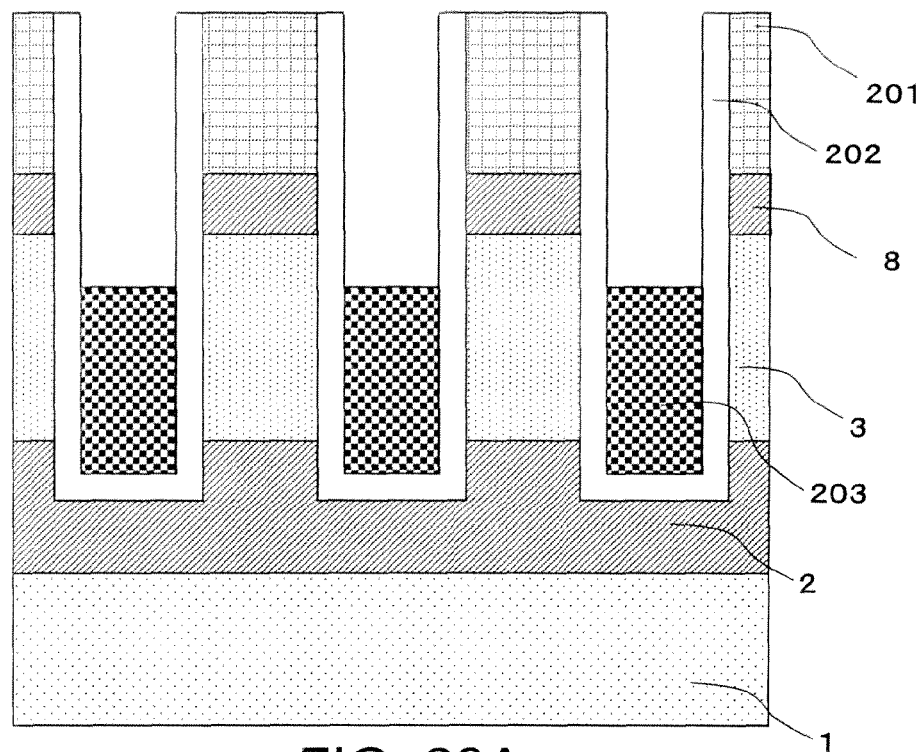
FIG. 28A is a B-B cross section and FIG. 28B is a plan in a manufacturing process after FIGS. 27A and 27B.
Figure 28B:
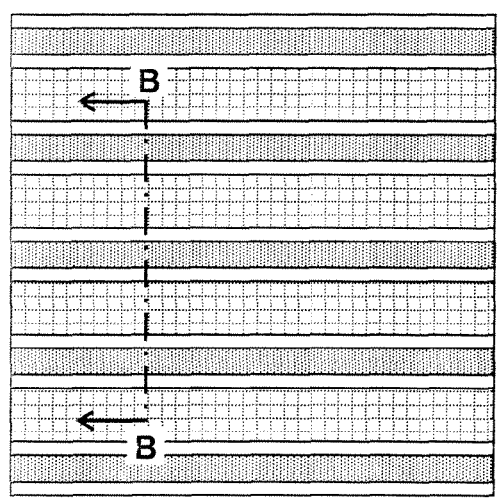

On an inner wall of the groove, an oxide film 202 and polysilicon 203 are formed in this order. The polysilicon 203 is etched to a height shown in FIG. 28A. FIG. 28A shows a cross-sectional view in this state, and is a B-B cross section viewed from the direction of the arrows shown in a plan in FIG. 28B.

Figure 29A:
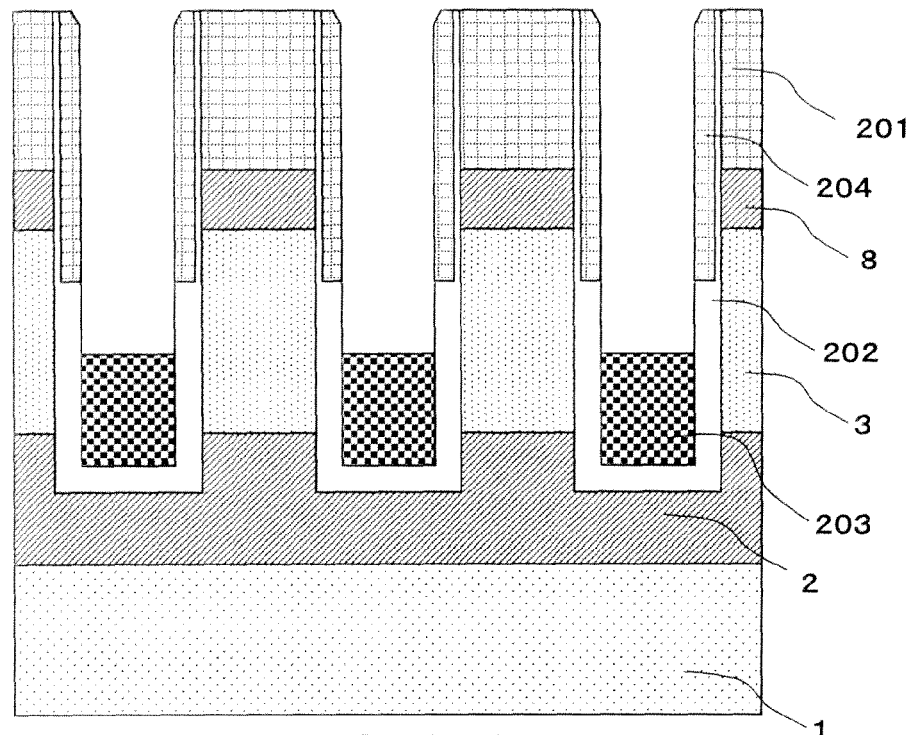
FIG. 29A is a B-B cross section and FIG. 29B is a plan in a manufacturing process after FIGS. 28A and 28B.
Figure 29B:
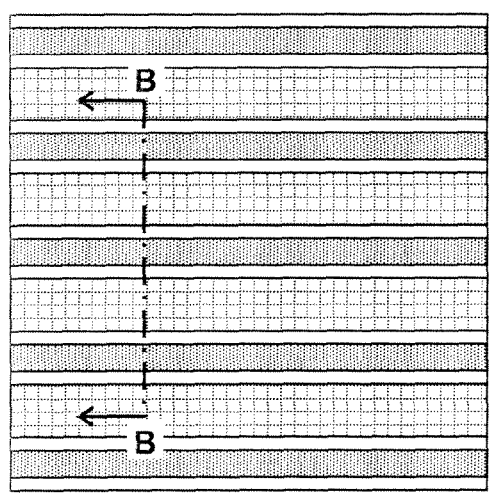

After the oxide film 202 is recessed by isotropic etching, a nitride film 204 is formed. Further, the polysilicon 203 is etched after the nitride film 204 is etched back. FIG. 29A shows a cross-sectional view in this state. FIG. 29A shows a B-B cross section viewed from the direction of the arrows shown in a plan in FIG. 29B.

Figure 30A:
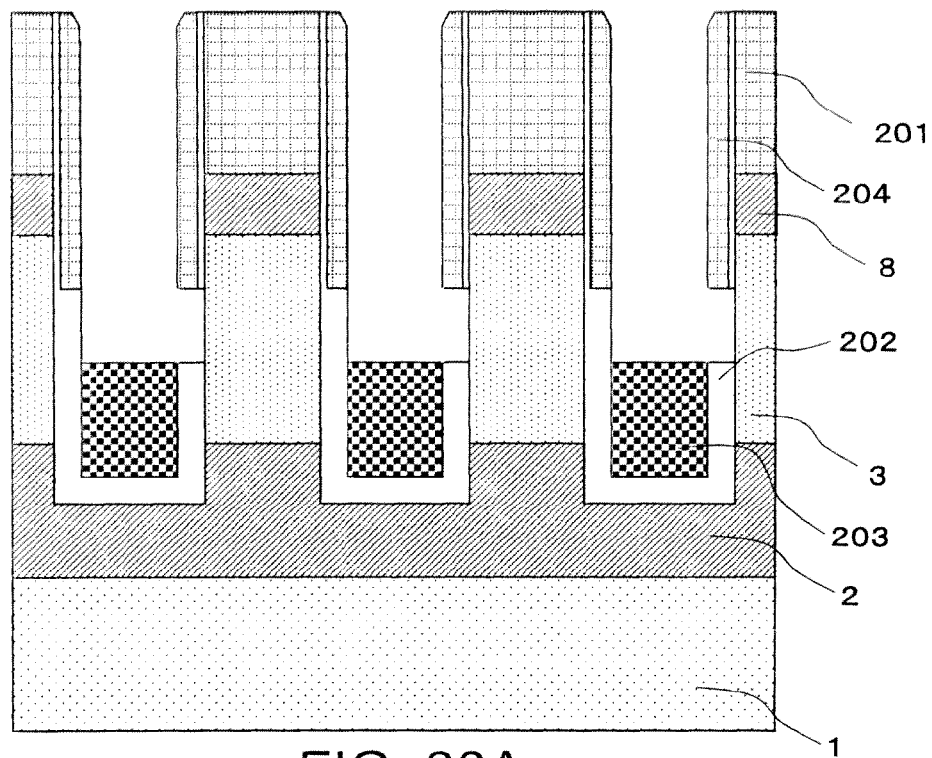
FIG. 30A is a B-B cross section and FIG. 30B is a plan in a manufacturing process after FIGS. 29A and 29B.
Figure 30B:
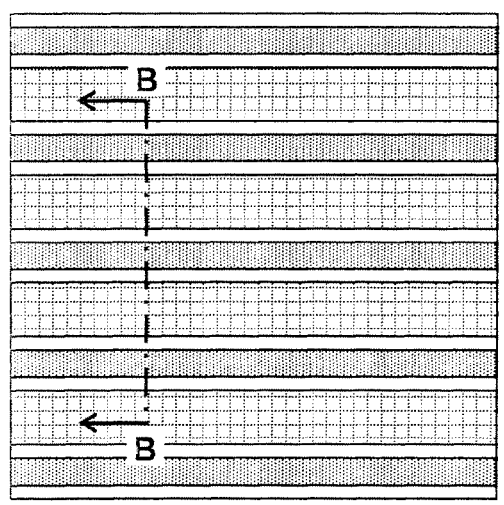

A side of the oxide film is etched, making an opening of the side contact part to the diffusion layer 3. FIG. 30A shows a cross-sectional view in this state. FIG. 30A shows a B-B cross section viewed from the direction of the arrows shown in a plan in FIG. 30B.

Figure 31A:
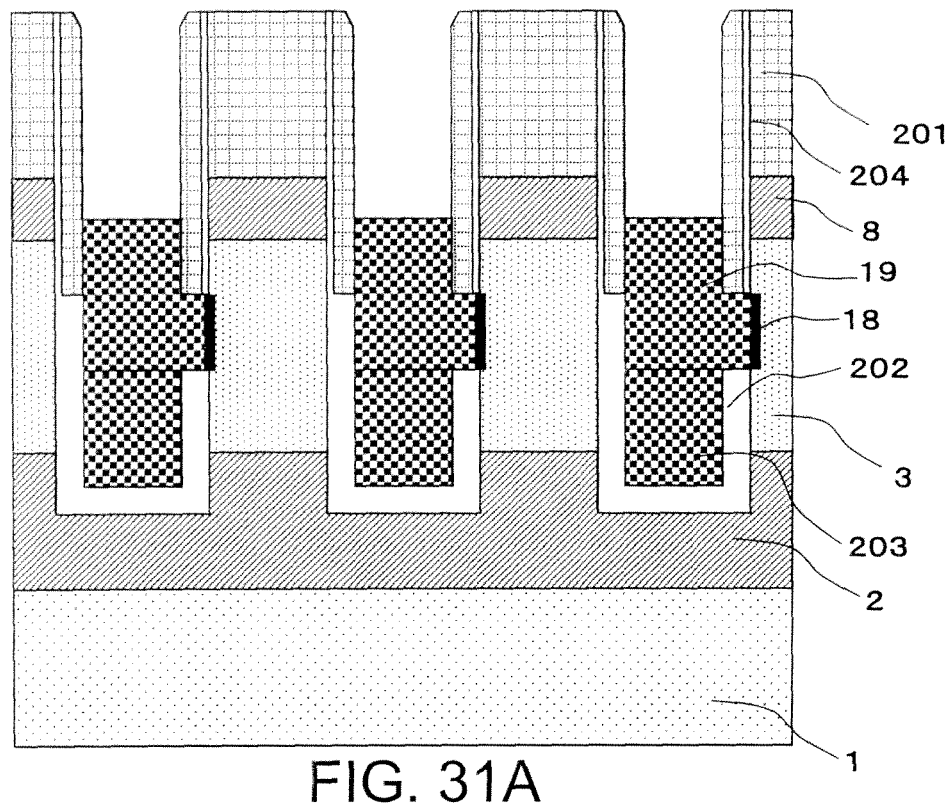
FIG. 31A is a B-B cross section and FIG. 31B is a plan in a manufacturing process after FIGS. 30A and 30B.
Figure 31B:
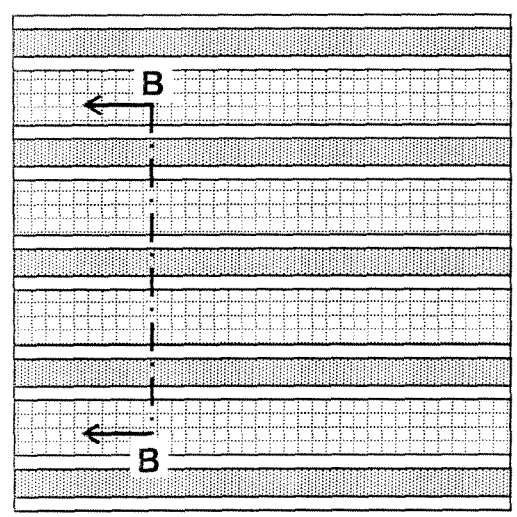

The conductor 19 is formed by embedding polysilicon 19 and etching it hack. The conductor 19 is connected to the P-type diffusion layer 3 by the side contact 18. FIG. 31A shows a cross-sectional view in this state. FIG. 31A shows a B-B cross section viewed from the direction of the arrows shown in a plan in FIG. 31B.

Figure 32A:
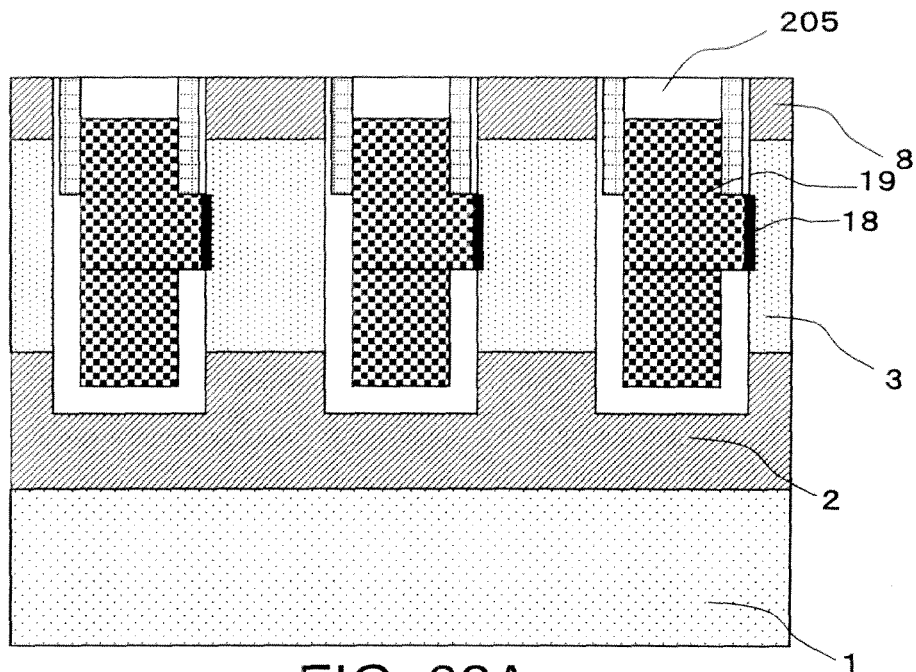
FIG. 32A is a B-B cross section and FIG. 32B is a plan in a manufacturing process after FIGS. 31A and 31B.
Figure 32B:
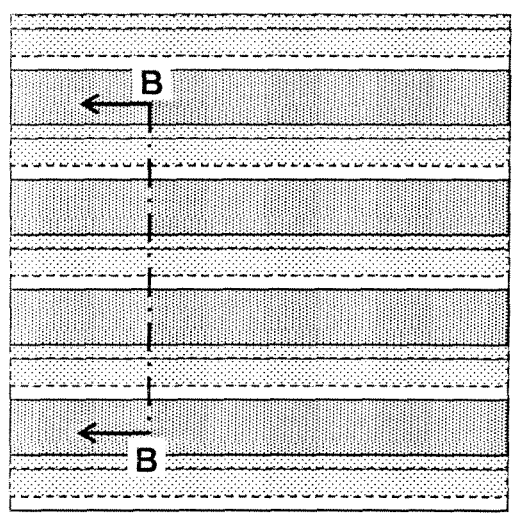

As in a normal STI forming flow, an oxide film 205 is embedded in the groove and the oxide film 205, and the nitride films 201, 204 are etched. FIG. 32A shows a cross-sectional view in this state. FIG. 32A shows a B-B cross section viewed from the direction of the arrows shown in a plan in FIG. 32B.

Figure 33A:
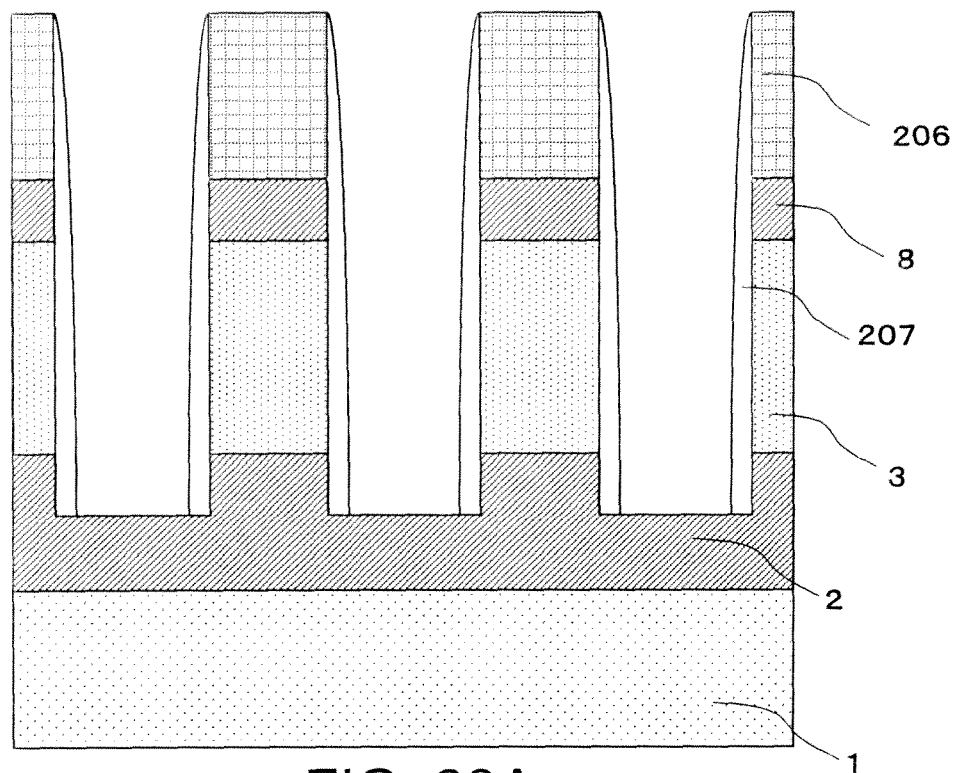
FIG. 33A is an A-A cross section and FIG. 33B is a plan in a manufacturing process after FIGS. 32A and 32B.
Figure 33B:
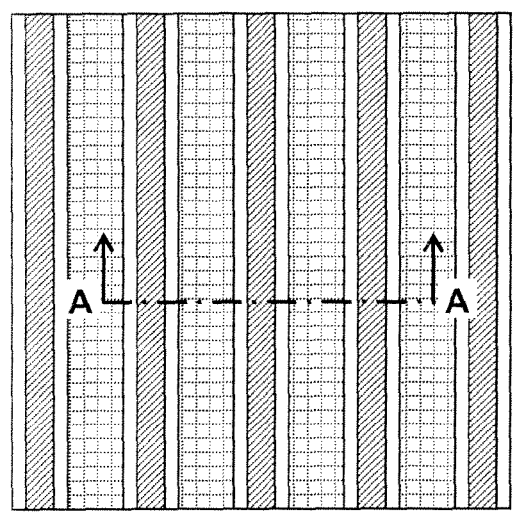

A nitride film 206 is formed in the direction, shown in FIG. 33B, in which the word line WL is formed, the semiconductor substrate is etched to the N-type diffusion layer 2, and a groove is formed in the direction in which the word line WL is formed. An oxide film sidewall 207 is formed on an inner wall of the groove. FIG. 33A shows a cross-sectional view in this state. FIG. 33A shows an A-A cross section viewed from the direction of the arrows shown in a plan in FIG. 33B.

Figure 34A:
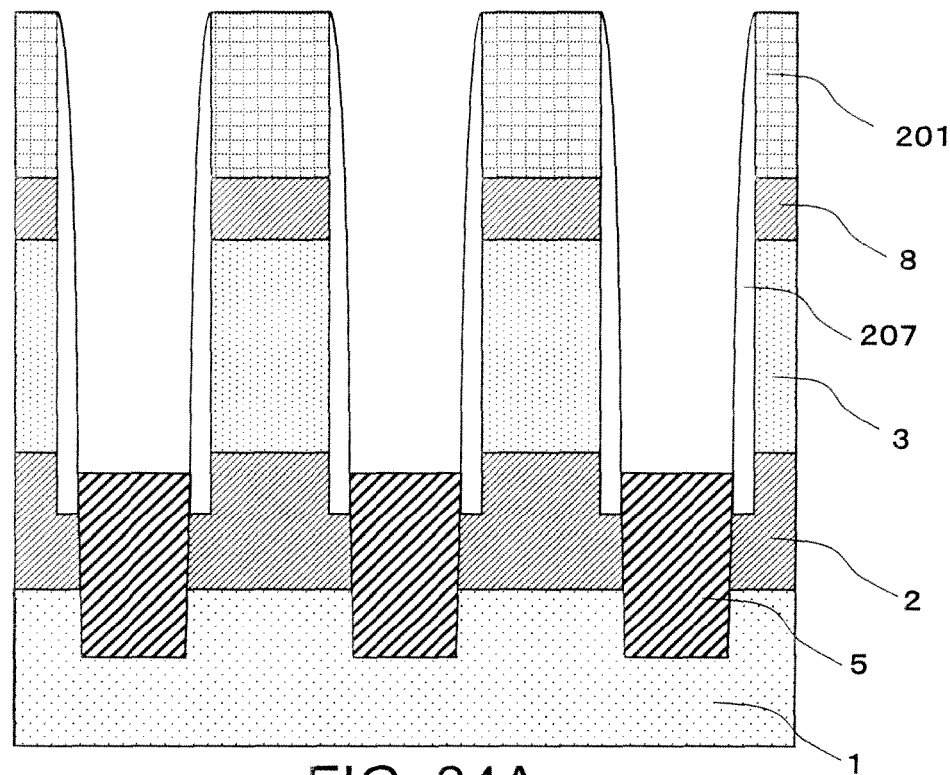
FIG. 34A is an A-A cross section and FIG. 34B is a plan in a manufacturing process after FIGS. 33A and 33B.
Figure 34B:
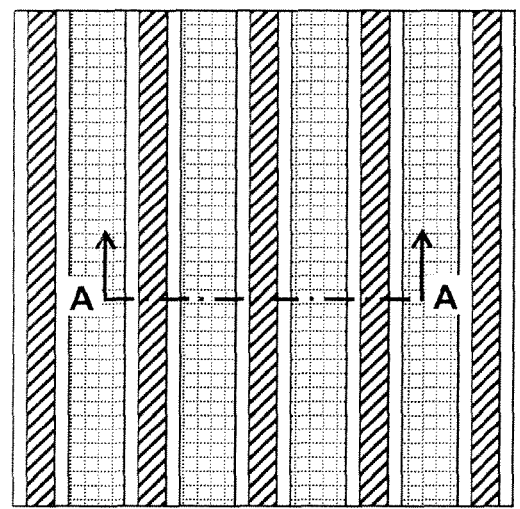

Next, using the nitride film 201 and the oxide film sidewall 207 as masks, the semiconductor substrate is etched until the bottom of the groove reaches the P-type semiconductor substrate 1, and then the embedded metal layer 5 is formed by forming a metal layer made of, for instance, W/TiN/Ti and etching it hack. FIG. 34A shows a cross-sectional view in this state. FIG. 34A shows an A-A cross section viewed from the direction of the arrows shown in a plan in FIG. 34B.

Figure 35A:
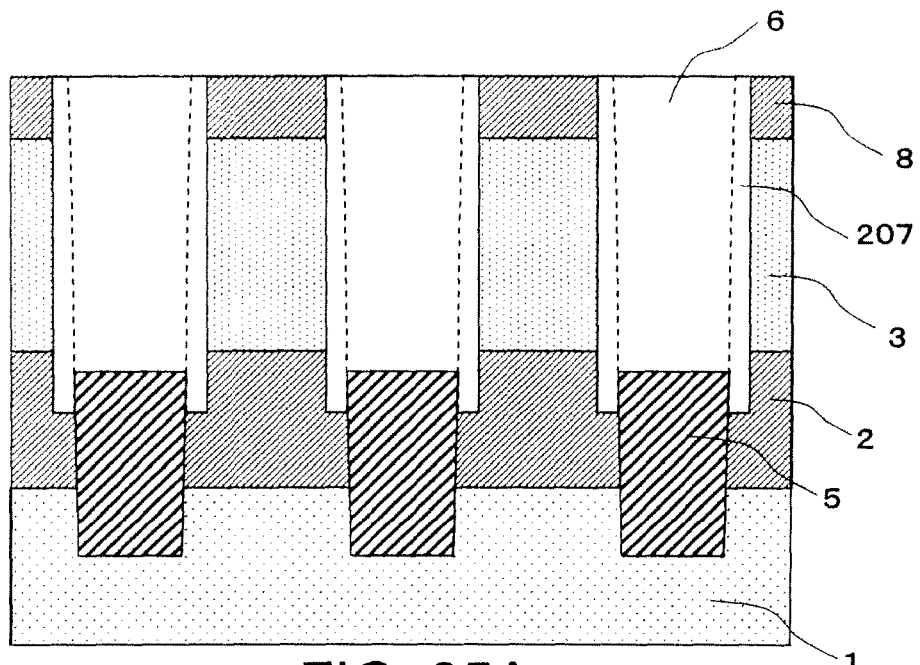
FIG. 35A is an A-A cross section and FIG. 35B is a plan in a manufacturing process after FIGS. 34A and 34B.
Figure 35B:
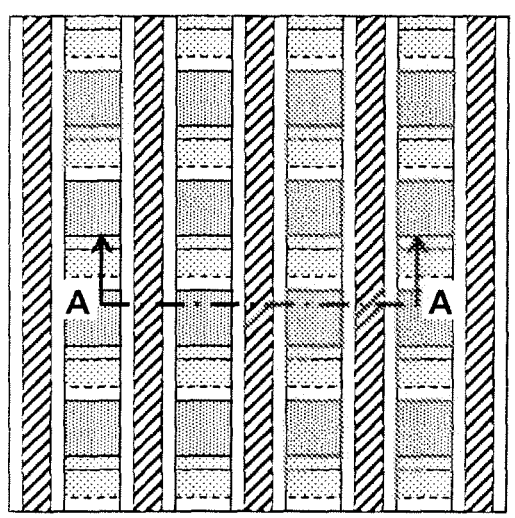

Using the same method as a normal STI forming method, the oxide film 6 is formed. FIG. 35A shows a cross-sectional view in this state, and is an A-A cross section viewed from the direction of the arrows shown in a plan in FIG. 35B.

Figure 36A:
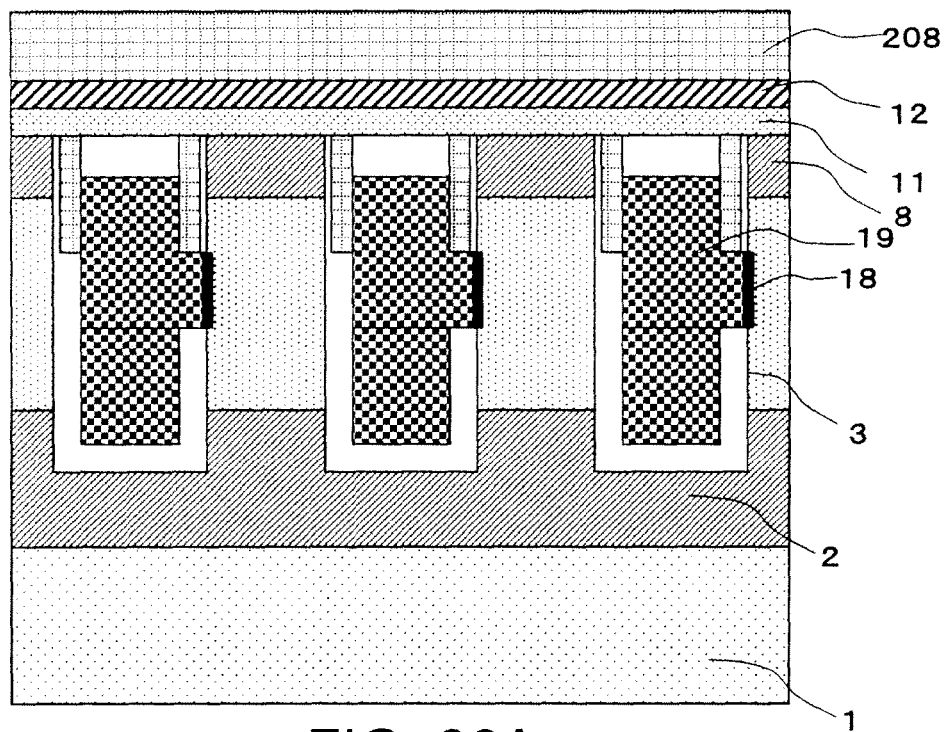
FIG. 36A is a B-B cross section and FIG. 36B is a plan in a manufacturing process after FIGS. 35A and 35B.
Figure 36B:
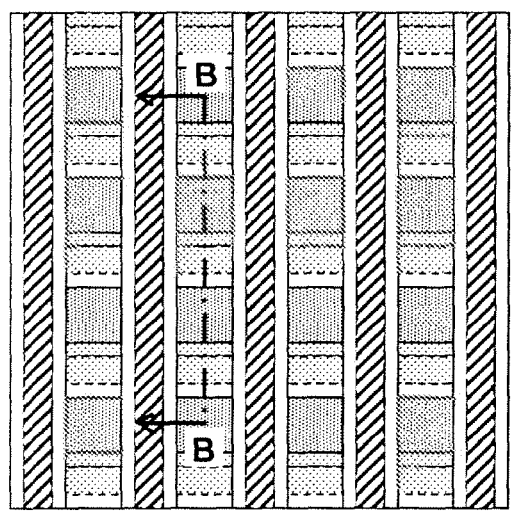

Next, after the P-type polysilicon 11 is formed on the top, the metal layer 12 (for instance, W/TiN/Ti), which will become the bit line, is formed. A nitride film 208 is formed thereover. FIG. 36A shows a cross-sectional view in this state. Further, FIG. 36A shows a B-B cross section viewed from the direction of the arrows shown in a plan in FIG. 36B.

Figure 37A:
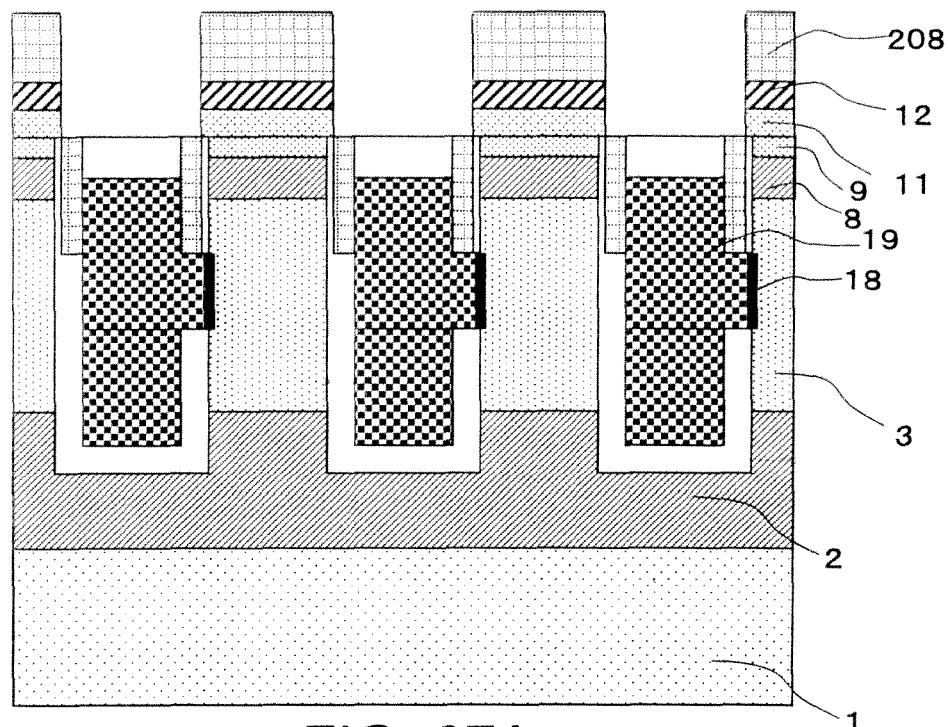
FIG. 37A is a B-B cross section and FIG. 37B is a plan in a manufacturing process after FIGS. 36A and 36B.
Figure 37B:
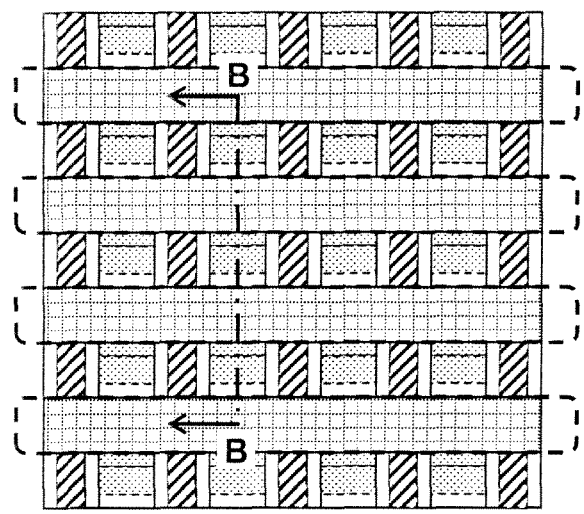

After mask patterns indicated by broken lines in FIG. 37B are formed, the bit line 12 is formed by etching the nitride film 208, the metal layer 12, and the P-type polysilicon 11. Then, the P-type diffusion layer 9 is formed by diffusing P-type impurities from the P-type polysilicon by heat treatment. FIG. 37A shows a cross-sectional view in this state. Further, FIG. 37A shows a B-B cross section viewed from the direction of the arrows shown in a plan in FIG. 37B.

Figure 38A:
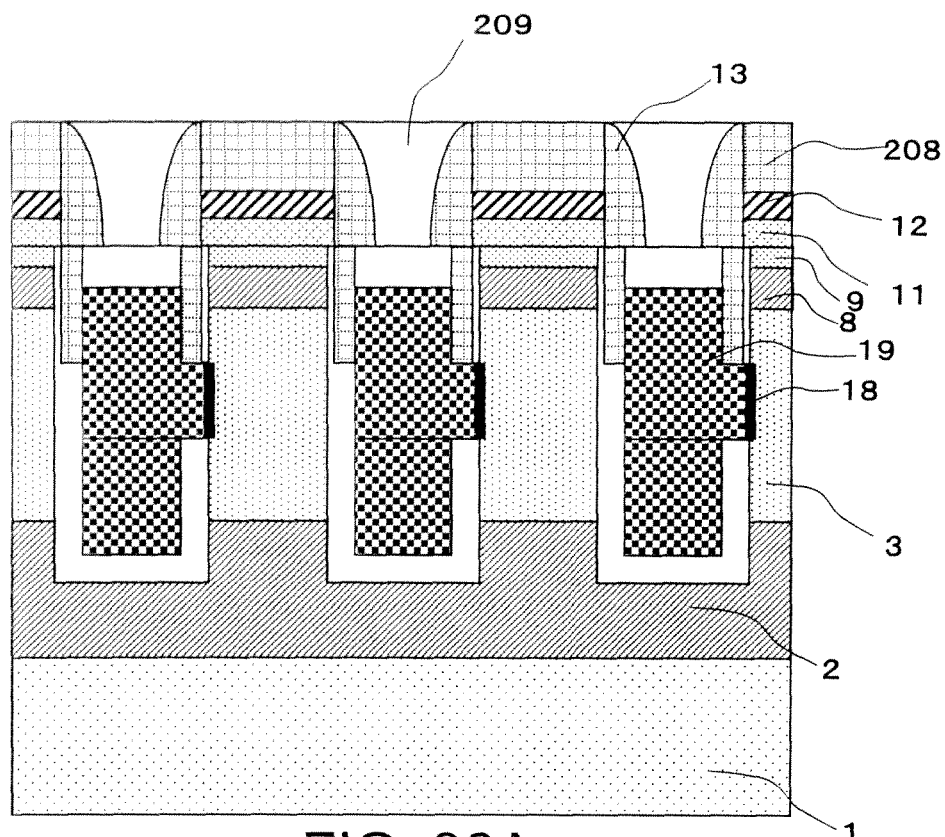
FIG. 38A is a B-B cross section and FIG. 38B is a plan in a manufacturing process after FIGS. 37A and 37B.
Figure 38B:
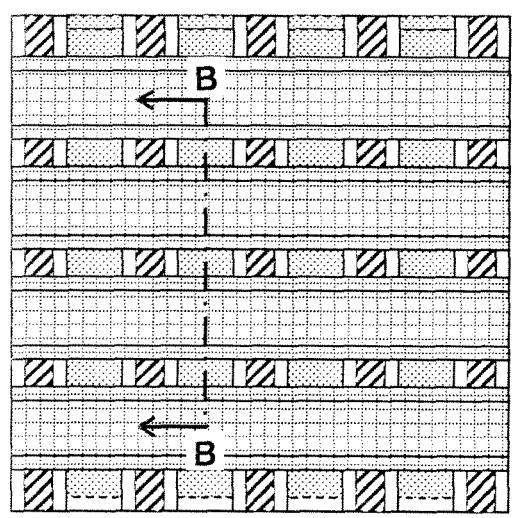

By forming a nitride film on the surface and etching it back, the sidewall 13 is formed on a side of the bit line. Then, an interlayer oxide film 209 is embedded to planarize the surface. FIG. 38A shows a cross-sectional view in this state. Further, FIG. 38A shows a B-B cross section viewed from the direction of the arrows shown in a plan in FIG. 38B.

Figure 39A:
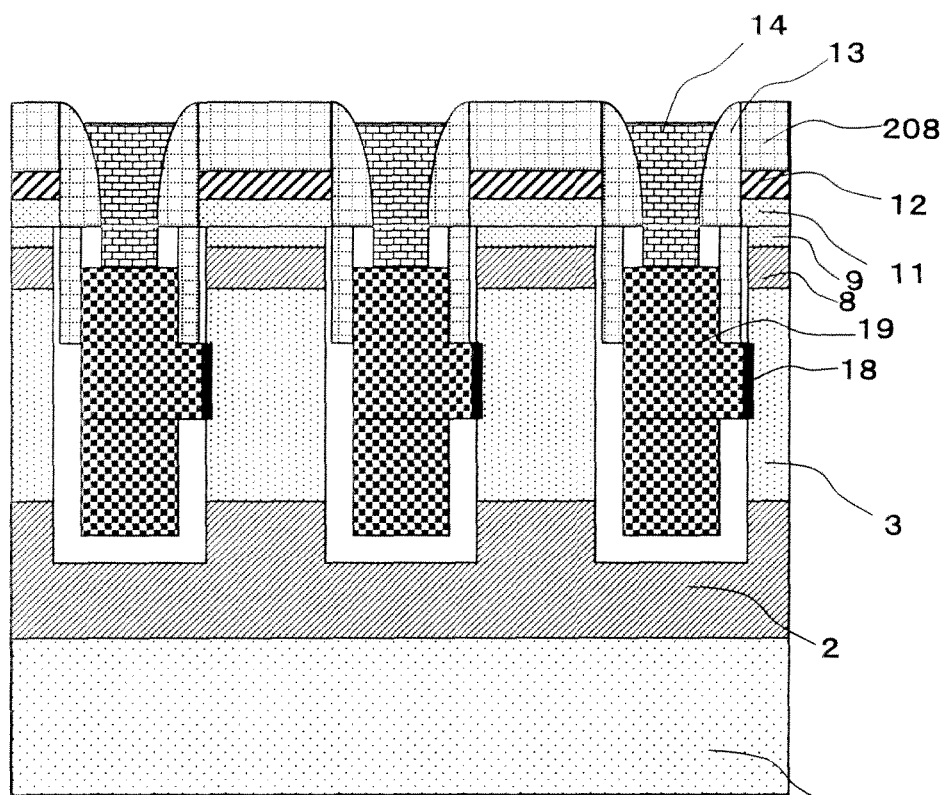
FIG. 39A is a B-B cross section and FIG. 39B is a plan in a manufacturing process after FIGS. 38A and 38B.
Figure 39B:
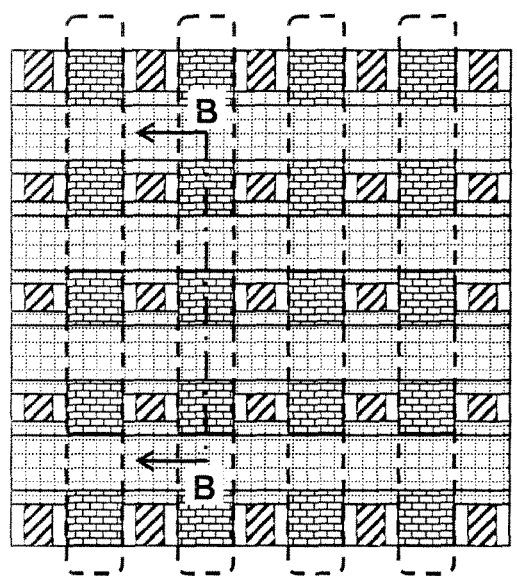

Using mask patterns with openings indicated by broken lines in FIG. 39B, only the oxide film is etched and the capacitor contact is opened. The capacitor contact 14 is formed by embedding a conductor such as W/TiN/Ti, planarizing the surface, and etching it back. FIG. 39A shows a cross-sectional view in this state, and is a B-B cross section viewed from the direction of the arrows shown in a plan in FIG. 39B.

By forming a pedestal-shaped capacitor over the capacitor contact 14 as in the DRAM process and further forming the word lines in lines, the semiconductor device of the eighth exemplary embodiment comprising the memory cell region structured as shown in FIGS. 25 and 26 is completed.

Tenth Exemplary Embodiment

In a tenth exemplary embodiment, the semiconductor device having the device structure of the memory cell region according to the eighth exemplary embodiment is applied to the FBC memory cell according to the second exemplary embodiment. FIG. 40 is a cross section of a memory cell region according to the tenth exemplary embodiment. FIG. 40 is a B-B cross section viewed from the direction of the arrows shown in FIG. 25. In comparison with the cross section according to the eighth exemplary embodiment shown in FIG. 26, the cross section of FIG. 40 is the same as the device structure of the memory cell unit in the semiconductor device according to the eighth exemplary embodiment except that the P-type anode 9 is not provided and the bit line contact 11 is directly connected to the N-type diffusion layer 8 in FIG. 40.

Further, the semiconductor device according to the tenth exemplary embodiment can be manufactured by forming N-type polysilicon 11 instead of the P-type silicon 11 in the manufacturing step shown in FIG. 36 of the semiconductor device manufacturing method according to the ninth exemplary embodiment. Or a plug such as tungsten may be used and connected to the N-type diffusion layer 8. The other manufacturing steps of the ninth exemplary embodiment can be applied as they are.

Further, the following preferable modes are possible in the present disclosure.

[Mode 1]

A semiconductor device comprising:
a semiconductor layer in which a memory element having at least a first semiconductor region to which a power supply potential is supplied, a second semiconductor region that forms a PN junction with this first semiconductor region, an insulating isolation region that comes in contact with the first semiconductor region and that surrounds the second semiconductor region, and a third semiconductor region that is formed in the second semiconductor region being separated from the first semiconductor region and that forms a PN junction with the second semiconductor region is provided;

a word line provided on the semiconductor layer;

a capacitor provided between the word line and the second semiconductor region; and a bit line that is provided on the semiconductor layer and that communicates information with the memory element via the third semiconductor region.

[Mode 2]

The semiconductor device according to Mode 1, wherein the capacitor is provided independently from the second semiconductor region and has an electrode electrically connected to the second semiconductor region.

[Mode 3]

The semiconductor device according to Mode 1, wherein the memory element forms a PN junction with the third semiconductor region and further has a fourth semiconductor region separated from the second semiconductor region, and the bit line is electrically connected to the fourth semiconductor region.

[Mode 4]

The semiconductor device according to Mode 1, wherein the bit line is electrically connected to the third semiconductor region.

[Mode 5]

The semiconductor device according to Mode 3 setting a voltage of the word line to an intermediate voltage between a selection level and a non-selection level from the selection-level voltage and fixing a voltage of the bit line to a non-selection-level voltage, and setting the word line voltage to a non-selection-level voltage from the intermediate voltage after fixing the bit line voltage to the non-selection-level voltage at the end of read and/or write operation(s) when activating the bit line and the word line and performing the read and/or write operation(s).

[Mode 8]

The semiconductor device according to any one of Modes 1 to 5, wherein first and second power supply voltages are supplied from the outside to the semiconductor device, and the first power supply voltage is supplied to the first semiconductor region.

[Mode 7]

The semiconductor device according to Mode 6, wherein the word line is controlled by a voltage within a range between the first and the second power supply voltages.

[Mode 8]

The semiconductor device according to any one of Modes 1 to 7, wherein the word line is maintained at the same voltage as that of the first semiconductor region when unselected.

[Mode 9]

The semiconductor device according to any one of Modes 1 to 6, wherein the word line is controlled to be at a just intermediate voltage between a voltage after high-level data has been written and a voltage after low-level data has been written to the second region of the memory element when unselected.

[Mode 10]

The semiconductor device according to Mode 9, wherein the non-selection-level voltage of the word line has such a temperature characteristic that a temperature characteristic of a forward voltage of the PN junction between the first and the second regions of the memory element is compensated.

[Mode 11]

The semiconductor device according to any one of Modes 1 to 10 comprising:

a plurality of the word lines wired in a first direction;

a plurality of the bit lines wired in a second direction that intersects the first direction;

a plurality of memory cells provided corresponding to each of intersections between the plurality of word lines and the plurality of bit lines and each of which comprises the memory element connected to each corresponding one of the bit lines and the capacitor having a second electrode connected to the word line corresponding to a first electrode connected to the second region of the memory element;

a plurality of word line drivers each of which drives each of the plurality of word lines; and a plurality of sense amplifiers each of which is connected to each of the plurality of bit lines, amplifies a signal of a corresponding bit line during a read operation, and drives the corresponding bit line during a write operation.

[Mode 12]

The semiconductor device according to Mode 11, wherein only active elements included in each of the memory cells are a plurality of PN junctions.

[Mode 13]

The semiconductor device according to Mode 11 or 12, wherein the only active element included in each of the memory cells is a single bipolar transistor or a single thyristor.

[Mode 14]

The semiconductor device according to any one of Modes 11 to 13 performing:

a first control of releasing a selected bit line from a state of being fixed to the first power supply voltage and driving the selected hit line to a voltage based on write data;

a second control of setting a selected word line from a word line standby voltage to a word line write voltage after the first control;

a third control of setting the selected word line to a word line precharge voltage, which is an intermediate voltage between the word line write voltage and the word line standby voltage, after the second control;

a fourth control of stopping driving the selected bit line to the voltage based on the write data and restoring the selected bit line to the first power supply voltage after the third control; and a fifth control of restoring the voltage of the selected word line to the word line standby voltage after the fourth control when an active element included in each of the memory cells is a thyristor and the data is written to the memory cell selected from the plurality of memory cells by selecting the bit line and the word line.

[Mode 15]

The semiconductor device according to Mode 14 further performing:

a sixth control of precharging a bit line to a second voltage and activating the sense amplifier while maintaining the voltage of the word line at the word line standby voltage;

a seventh control of setting the selected word line to a word line read voltage, which is an intermediate voltage between the word line write voltage and the word line precharge voltage, then canceling the precharge of the bit line, and reading data of the memory cell to the sense amplifier via the bit line;

an eighth control of setting the selected word line from the word line read voltage to the word line precharge voltage after the seventh control;

a ninth control of fixing the bit line to the first power supply voltage after the eighth control; and a tenth control of restoring the voltage of the selected word line to the word line standby voltage after the ninth control when data is read from the memory cell selected from the plurality of memory cells by selecting the bit line and the word line.

[Mode 16]

The semiconductor device according to any one of Modes 11 to 15, wherein each of the plurality of sense amplifiers comprises a flip-flop that temporarily stores read/write data, a first data line connected to a non-inverting node of the flip-flop, a second data line connected to an inverting node of the flip-flop and having an inverted logic from the first data line, a write switch that connects the first data line to a corresponding bit line during a write operation, and a read switch that connects the second data line to a corresponding bit line during a read operation.

[Mode 17]

The semiconductor device according to any one of Modes 11 to 16 temporarily storing write data supplied with a write command supplied from the outside in synchronization with a system clock supplied from the outside in a corresponding sense amplifier out of the plurality of sense amplifiers when the write command is executed, and writing the temporarily stored data in the corresponding sense amplifier to a corresponding one of the memory cells in a predetermined command execution cycle following the write command execution.

[Mode 18]

The semiconductor device according to any one of Modes 1 to 17, wherein the semiconductor layer comprises the first semiconductor region provided on a main surface of a semiconductor substrate, the second semiconductor region provided in contact with the first semiconductor region on the top of the first semiconductor region, and the third semiconductor region provided in contact with the second semiconductor region on the top of a part of the second semiconductor region, the first electrode of the capacitor is connected to a surface of the second semiconductor region that does not have the third semiconductor region provided thereon, and the second electrode provided facing the first electrode with a capacitor film interposed therebetween is connected to the word line provided in an upper layer than the capacitor.

[Mode 19]

The semiconductor device according to any one of Modes 1 to 17, wherein the semiconductor layer has the first semiconductor region, the second semiconductor region, and the third semiconductor region laminated on the main surface of the semiconductor substrate in this order, the first electrode of the capacitor is connected to the second semiconductor region via a conductor provided in the insulating isolation region and having a part of a side thereof connected to the second semiconductor region, and the second electrode provided facing the first electrode with a capacitor film interposed therebetween is connected to the word line provided in an upper layer than the capacitor.

[Mode 20]

A semiconductor device manufacturing method comprising:

forming a semiconductor layer that comprises a first region of a first conductivity type, a first region of a second conductivity type formed in contact with the first region of the first conductivity type on the top of the first region of the first conductivity type, and a second region of the first conductivity type formed in contact with the first region of the second conductivity type on the top of the first region of the second conductivity type on a main surface of a semiconductor substrate;

forming a plurality of linear STIs whose depth reaches the first region of the second conductivity type and whose surface protrudes from a surface of the second region of the first conductivity type in a first direction at regular intervals;

forming sidewalls on sidewalls of each STI with the protruding surface, forming a groove on an exposed surface of the second region of the first conductivity type between the sidewalls, and planarizing the surface by filling the groove with an insulating film;

making an opening in one of the regions in which the sidewalls are formed on both sides, forming a second region of the second conductivity type on the surface of the second region of the first conductivity type, forming a hit line contact that reaches the second region of the second conductivity type in the opening, and further forming a bit line on the bit line contact; and making an opening in the remaining region, in which an opening is not made, out of the regions in which the sidewalls are formed on both sides, and forming a capacitor that comprises a first electrode connected to the second region of the first conductivity type and a second electrode with a capacitor film interposed therebetween serve as a word line.

[Mode 21]

The semiconductor device manufacturing method according to Mode 20 further including forming a third region of the first conductivity type on a surface of the second region of the second conductivity type by thermal diffusion of impurities from the bit line contact, wherein the bit line contact is of the first conductivity type.

[Mode 22]

The semiconductor device manufacturing method according to Mode 20 or 21 further including forming an embedded metal that comes in contact with the first region of the first conductivity type and the first region of the second conductivity type on a bottom of the STI when the plurality of linear STIs are formed at regular intervals.

[Mode 23]

The semiconductor device manufacturing method according to any one of Modes 20 to 22, wherein forming the semiconductor layer includes forming regions that will become the first region of the first conductivity type and the second region of the first conductivity type on the main surface of the semiconductor substrate, forming a groove that reaches the depth of a region in which the first region of the second conductivity type will be formed in a second direction intersecting the first direction, forming the first region of the second conductivity type by ion implantation, and filling the groove with an insulator and forming an STI that extends in the second direction after further etching the groove until the groove reaches the first region of the first conductivity type.

[Mode 24]

A semiconductor device manufacturing method comprising:

forming a semiconductor layer that comprises a first region of a first conductivity type, a first region of a second conductivity type formed in contact with the first region of the first conductivity type on the top of the first region of the first conductivity type, and a second region of the first conductivity type formed in contact with the first region of the second conductivity type on the top of the first region of the second conductivity type on a main surface of a semiconductor substrate;

forming a plurality of grooves whose depth reaches the first region of the second conductivity type from a surface of the semiconductor layer in a first direction at regular intervals and covering an inner wall of each groove with an insulating film;

opening a part of a sidewall of the insulating film that covers the inner wall of the groove so as to expose a part of a sidewall of the second region of the first conductivity type;

forming a capacity contact that comes in contact with the second region of the first conductivity type on the inner wall;

forming a second region of the second conductivity type on a surface of the second region of the first conductivity type, further forming a bit line contact on a surface of the second region of the second conductivity type, and forming a bit line over the bit line contact; and forming a capacitor that comprises a first electrode connected to the capacitor contact and a second electrode with a capacitor film interposed therebetween serve as a word line.

[Mode 25]

The semiconductor device manufacturing method according to Mode 24 further including forming a third region of the first conductivity type on the surface of the second region of the second conductivity type by thermal diffusion of impurities from the bit line contact, wherein the bit line contact is of the first conductivity type.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A semiconductor device comprising:
a semiconductor substrate including first and second main surfaces opposed to each other;
first and second wirings formed separately over the semiconductor substrate on a side of the first main surface of the semiconductor substrate;
a capacitor formed over the semiconductor substrate on the side of the first main surface of the semiconductor substrate, the capacitor including first and second electrodes sandwiching a capacitive insulating film therebetween, the first electrode being electrically coupled to the first wiring; and
first and second diffusion regions of a first conductivity type and third and fourth diffusion regions of a second conductivity type formed in line in the semiconductor substrate such that the first and second diffusion regions sandwich the third diffusion region and the third and fourth diffusion regions sandwich the second diffusion region, the first diffusion region being supplied with a first voltage, the third diffusion region being electrically coupled to the second electrode of the capacitor, and the fourth diffusion region being electrically coupled to the second wiring,
wherein the first diffusion region includes a first surface on a side of the first main surface of the semiconductor substrate,
the third diffusion region including a second surface on a side of the second main surface of the semiconductor substrate and third and fourth surfaces on the side of the first main surface of the semiconductor substrate,
the second diffusion region including a fifth surface on the side of the second main surface of the semiconductor substrate and a sixth surface on the side of the first main surface of the semiconductor substrate, and the fourth diffusion region including a seventh surface on the side of the second main surface of the semiconductor substrate and an eighth surface on the side of the first main surface of the semiconductor substrate,
the first surface of the first diffusion region being coupled to the second surface of the third diffusion region, the third surface being coupled to the second electrode of the capacitor via a contact plug, the fourth surface being coupled to the fifth surface of the second diffusion region, the sixth surface of the second diffusion region being coupled to the seventh surface of the fourth diffusion region, and the eighth surface of the fourth diffusion region being coupled to the second wiring via an additional contact plug.

2. The semiconductor device according to claim 1, wherein a size of the second diffusion region is greater than a size of the fourth diffusion region.

3. The semiconductor device according to claim 1, wherein a size of the third diffusion region is greater than a size of the second diffusion region.

4. The semiconductor device according to claim 1, further comprising a trench isolation formed in the semiconductor substrate.

5. A semiconductor device comprising:
a semiconductor substrate including first and second main surfaces opposed to each other;
first and second wirings formed separately over the semiconductor substrate on a side of the first main surface of the semiconductor substrate;
a capacitor formed over the semiconductor substrate on the side of the first main surface of the semiconductor substrate, the capacitor including first and second electrodes sandwiching a capacitive insulating film therebetween, the first electrode being electrically coupled to the first wiring; and
first and second diffusion regions of a first conductivity type and third and fourth diffusion regions of a second conductivity type formed in line in the semiconductor substrate such that the first and second diffusion regions sandwich the third diffusion region and the third and fourth diffusion regions sandwich the second diffusion region, the first diffusion region being supplied with a first voltage, the third diffusion region being electrically coupled to the second electrode of the capacitor, and the fourth diffusion region being electrically coupled to the second wiring,
wherein the third diffusion region is greater in size than the second diffusion region.

6. The semiconductor device according to claim 5, wherein the second diffusion region is greater in size than the fourth diffusion region.

7. The semiconductor device according to claim 5, further comprising a plurality of trench isolations formed in the semiconductor substrate,
wherein each of the first and third diffusion regions are located between said plurality of trench isolations.

8. The semiconductor device according to claim 5, further comprising a plurality of trench isolations formed in the semiconductor substrate, wherein each of the second and fourth diffusion regions is located between said plurality of trench isolations.

9. The semiconductor device according to claim 5, further comprising:
a capacitor contact connected to said second electrode; and
a recess which separates said capacitor from said fourth diffusion region.

10. The semiconductor device according to claim 5, wherein said capacitor is provided independently of one or more of said first diffusion region, said second diffusion region, said third diffusion region and said fourth diffusion region.

11. The semiconductor device according to claim 5, wherein a cell capacitance value of said semiconductor device is approximately 0.32 femtofarads (fF).

12. The semiconductor device according to claim 5, further comprising a capacitor contact connected to said second electrode,
wherein said capacitor contact is connected to said third diffusion region via a buried conductor in a trench isolation, and
wherein said trench isolation is formed in the semiconductor substrate.

13. A semiconductor device comprising:
a semiconductor substrate including first and second main surfaces opposed to each other;
first and second wirings formed separately over the semiconductor substrate on a side of the first main surface of the semiconductor substrate;
a capacitor formed over the semiconductor substrate on the side of the first main surface of the semiconductor substrate, the capacitor including first and second electrodes sandwiching a capacitive insulating film therebetween, the first electrode being electrically coupled to the first wiring;
first and second diffusion regions of a first conductivity type and third and fourth diffusion regions of a second conductivity type formed in line in the semiconductor substrate such that the first and second diffusion regions sandwich the third diffusion region and the third and fourth diffusion regions sandwich the second diffusion region, the first diffusion region being supplied with a first voltage, the third diffusion region being electrically coupled to the second electrode of the capacitor, and the fourth diffusion region being electrically coupled to the second wiring; and
first and second trench isolations formed in the semiconductor substrate and a third trench isolation formed in a portion of the semiconductor substrate sandwiched between the first and second trench isolations, each of the first and third diffusion regions being sandwiched between the first and second trench isolations, and each of the second and fourth diffusion regions being sandwiched between the first and third trench isolations.

14. The semiconductor according to claim 13, wherein the first and second trench isolations are greater in size than the third trench isolation.

15. The semiconductor device according to claim 13, further comprising:
a capacitor contact connected to said second electrode; and
a conductor buried in one of said first trench isolation and said second trench isolation.

16. The semiconductor according to claim 15, wherein said third diffusion region is connected to said capacitor contact via said conductor.

* * * * *